United States Patent
Hayoz et al.

(10) Patent No.: US 11,384,197 B2
(45) Date of Patent: Jul. 12, 2022

(54) SEMICONDUCTORS

(71) Applicant: CLAP CO., LTD., Seoul (KR)

(72) Inventors: Pascal Hayoz, Hofstetten (CH); Daniel Kaelblein, Speyer (DE)

(73) Assignee: CLAP CO., LTD., Seoul (KR)

( * ) Notice: Subject to any disclaimer, the term of this patent is extended or adjusted under 35 U.S.C. 154(b) by 809 days.

(21) Appl. No.: 16/304,239

(22) PCT Filed: May 15, 2017

(86) PCT No.: PCT/EP2017/061614
§ 371 (c)(1),
(2) Date: Nov. 23, 2018

(87) PCT Pub. No.: WO2017/202635
PCT Pub. Date: Nov. 30, 2017

(65) Prior Publication Data
US 2020/0317857 A1 Oct. 8, 2020

(30) Foreign Application Priority Data
May 25, 2016 (EP) .................................. 16171347

(51) Int. Cl.
H01L 51/05 (2006.01)
C08G 61/12 (2006.01)
H01L 51/00 (2006.01)

(52) U.S. Cl.
CPC ......... *C08G 61/126* (2013.01); *C08G 61/124* (2013.01); *H01L 51/0036* (2013.01);
(Continued)

(58) Field of Classification Search
None
See application file for complete search history.

(56) References Cited

U.S. PATENT DOCUMENTS

| 5,750,723 A | 5/1998 | Eldin et al. |
| 6,451,459 B1 | 9/2002 | Tieke et al. |

(Continued)

FOREIGN PATENT DOCUMENTS

| CN | 102010499 A | 4/2011 |
| CN | 104334610 A | 2/2015 |

(Continued)

OTHER PUBLICATIONS

Japanese Office Action dated May 10, 2021 in Japanese Patent Application No. 2018-561518, 6 pages.
(Continued)

*Primary Examiner* — Michael Lebentritt
(74) *Attorney, Agent, or Firm* — Oblon, McClelland, Maier & Neustadt, L.L.P.

(57) ABSTRACT

The present invention relates to polymers comprising a repeating unit of the formula—$[Ar^3]_c$—$[Ar^2]_b$—$[Ar^1]_a$—Y$(R^1)_{n1}$ $(R^2)_{n2}$—$[Ar^{1'}]_{a'}$—$[Ar^{2'}]_{b'}$—$[Ar^{3'}]_{c'}$— (I), wherein γ is a bivalent heterocyclic group, or ring system, which may optionally be substituted, $Ar^1$, $Ar^{1'}$ $Ar^2$, $Ar^{2'}$, $Ar^3$ and $Ar^{3'}$ are independently of each other a $C_6$-$C_{24}$ arylen group, which can optionally be substituted, or a $C_2$-$C_{30}$ heteroarylen group, which can optionally be, Formula (1), substituted; at least one of R1 and R2 is a group of formula (II); and their use as organic semiconductor in organic devices, especially in organic photovoltaics and photodiodes, or in a device containing a diode and/or an organic field effect transistor. The polymers according to the invention can have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics and photodiodes.

(Continued)

(I)

17 Claims, 1 Drawing Sheet

(52) U.S. Cl.
CPC ............. *C08G 2261/1414* (2013.01); *C08G 2261/3241* (2013.01); *C08G 2261/3243* (2013.01); *C08G 2261/3244* (2013.01); *C08G 2261/411* (2013.01); *C08G 2261/91* (2013.01); *C08G 2261/92* (2013.01); *C08G 2261/95* (2013.01); *H01L 51/0558* (2013.01)

(56) References Cited

U.S. PATENT DOCUMENTS

| | | | |
|---|---|---|---|
| 6,690,029 | B1 | 2/2004 | Anthony et al. |
| 9,978,944 | B2 * | 5/2018 | Rhodes ............... H01L 51/0541 |
| 2005/0255391 | A1 | 11/2005 | Adam et al. |
| 2006/0013549 | A1 | 1/2006 | Shtein et al. |
| 2007/0079867 | A1 | 4/2007 | Chittibabu et al. |
| 2009/0140220 | A1 | 6/2009 | Lee et al. |
| 2009/0203866 | A1 * | 8/2009 | Schafer ................ C07C 43/225 570/183 |
| 2010/0249349 | A1 * | 9/2010 | Chebotareva ........ C08G 61/126 526/259 |
| 2014/0011973 | A1 | 1/2014 | Pei et al. |
| 2014/0166942 | A1 | 6/2014 | Izawa et al. |
| 2014/0264184 | A1 | 9/2014 | Arai et al. |
| 2014/0332730 | A1 | 11/2014 | Hayoz et al. |
| 2015/0132886 | A1 | 5/2015 | Hayoz |
| 2021/0277157 | A1 * | 9/2021 | Kaelblein ......... C08F 216/1408 |

FOREIGN PATENT DOCUMENTS

| | | | |
|---|---|---|---|
| EP | 1 087 006 A1 | | 3/2001 |
| EP | 2 075 274 A1 | | 7/2009 |
| EP | 2 692 760 A1 | | 2/2014 |
| JP | 9-323992 A | | 12/1997 |
| JP | 2005-533839 A | | 11/2005 |
| JP | 2008078129 A | * | 4/2008 |
| JP | 2014-529593 A | | 11/2014 |
| JP | 2015-91960 A | | 5/2015 |
| JP | 2015-514836 A | | 5/2015 |
| TW | 201329132 A1 | | 7/2013 |
| TW | 201529632 A1 | | 8/2015 |
| WO | WO 03/052841 A1 | | 6/2003 |
| WO | WO 2004/112161 A2 | | 12/2004 |
| WO | WO 2005/049695 A1 | | 6/2005 |
| WO | WO 2007/082584 A1 | | 7/2007 |
| WO | WO 2007/091009 A2 | | 8/2007 |
| WO | WO 2008/000664 A1 | | 1/2008 |
| WO | WO 2008/001123 A1 | | 1/2008 |
| WO | WO 2008/107089 A1 | | 9/2008 |
| WO | WO 2009/047104 A2 | | 4/2009 |
| WO | WO 2009/053291 A1 | | 4/2009 |
| WO | WO 2009/098250 A1 | | 8/2009 |
| WO | WO 2009/098252 A1 | | 8/2009 |
| WO | WO 2009/098253 A1 | | 8/2009 |
| WO | WO 2009/098254 A1 | | 8/2009 |
| WO | WO 2010/049321 A1 | | 5/2010 |
| WO | WO 2010/049323 A1 | | 5/2010 |
| WO | WO 2010/108873 A1 | | 9/2010 |
| WO | WO 2010/115767 A1 | | 10/2010 |
| WO | WO 2010/136352 A1 | | 12/2010 |
| WO | WO 2011/144566 A2 | | 11/2011 |
| WO | WO 2013/083506 A1 | | 6/2013 |
| WO | WO 2015/135622 A1 | | 9/2015 |
| WO | WO 2016/005891 A1 | | 1/2016 |
| WO | WO 2016/113403 A1 | | 7/2016 |

OTHER PUBLICATIONS

Combined Chinese Office Action and Search Report dated Aug. 18, 2021 in corresponding Chinese Patent Application No. 201780030802.9 (with English Translation of Category of Cited Documents), 7 pages.
Extended European Search Report dated Dec. 14, 2016 in Patent Application No. 16171347.4.
Boyi Fu, et al., "Enhancing Field-Effect Mobility of Conjugated Polymers Through Rational Design of Branched Side Chains" Advanced Functional Materials, vol. 24, 2014, pp. 3734-3744.
U.S. Appl. No. 15/324,548, filed Jan. 6, 2017, US 2017/0207392 A1, Iain McCulloch, et al.
U.S. Appl. No. 15/503,242, filed Feb. 10, 2017, US 2017/0229657 A1, Zhenan Bao, et al.
U.S. Pat. No. 10,020,456, Jul. 10, 2018, Emmanuel Martin, et al.
U.S. Pat. No. 10,186,664, Jan. 22, 2019, Thomas Gessner, et al.
U.S. Appl. No. 15/543,637, filed Jul. 14, 2017, US 2018/0009936 A1, Pascal Hayoz, et al.
U.S. Appl. No. 15/765,525, filed Apr. 3, 2018, US 2019/0077907 A1, Marek Grzybowski, et al.
U.S. Appl. No. 16/060,728, filed Jun. 8, 2018, US 2018/0362704 A1, Pascal Hayoz, et al.
U.S. Appl. No. 16/080,166, filed Aug. 27, 2018, US 2019/0048015 A1, Jean-Charles Flores, et al.
Combined Chinese Office Action and Search Report dated Jan. 27, 2021 in Chinese Patent Application No. 201780030802.9 (with English translation of Office Action), 16 pages.
Combined Taiwanese Office Action and Search Report dated Mar. 15, 2021 in Taiwanese Patent Application No. 106117167 (with English translation of Search Report), 6 pages.
International Search Report dated Jun. 12, 2017 in PCT/EP2017/061614 filed May 15, 2017.

* cited by examiner

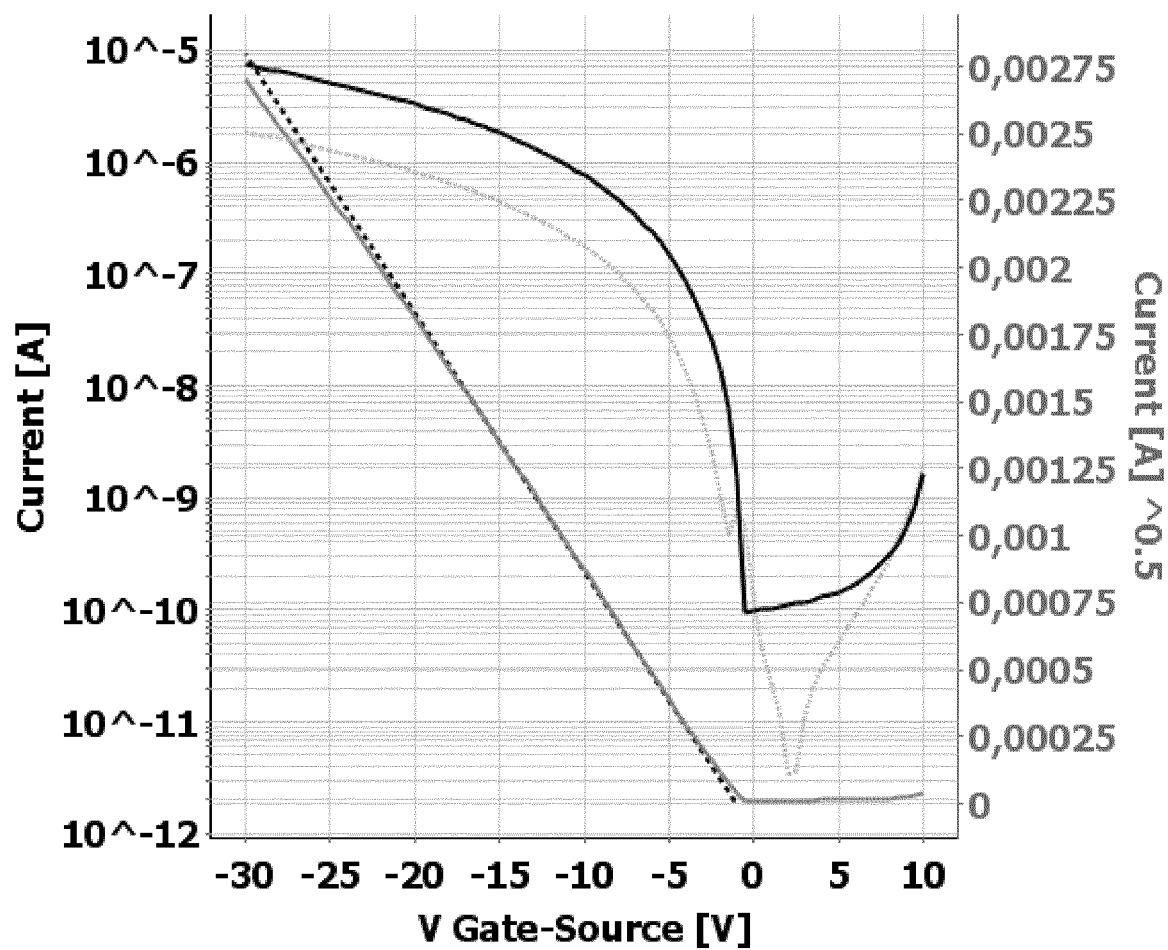

SEMICONDUCTORS

The present invention relates to polymers comprising a repeating unit of the formula (I) and their use as organic semiconductor in organic devices, especially in organic photovoltaics and photodiodes, or in a device containing a diode and/or an organic field effect transistor. The polymers according to the invention can have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics and photodiodes.

Diketopyrrolopyrrole (DPP) based polymers and copolymers are described, for example, in U.S. Pat. No. 6,451,459, WO05/049695, WO08/000664, EP2075274A1, WO2010/049321, WO2010/049323, WO2010/108873, WO2010/115767, WO2010/136352, WO2011/144566 and WO2011/144566.

Isoindigo based polymers and copolymers are described, for example, in WO2009/053291, PCT/IB2015/055118, US2014/0011973 and PCT/EP2016/050801. Naphthaleneimide based polymers and copolymers are described, for example, in WO2009098253.

Peryleneimide based polymers and copolymers are described, for example, in WO2009098250, WO2009098252, WO2009098253 and WO2009098254.

B. Fu et al., Adv. Funct. Mater. 2014, 24, 3734-3744 reports that the incorporation of side chains in which the branch position is remote from the polymer backbone combines the benefit of branched side chains in improving solubility with linear chains in promoting efficient π-π inter-molecular interactions. This provides a polymer with enhanced solution processability, a higher degree of polymerization, close π-π intermolecular stacking, and, in turn, superior macroscale charge carrier transport.

U.S. Pat. No. 5,750,723 relates to polymerisable diketopyrrolopyrroles

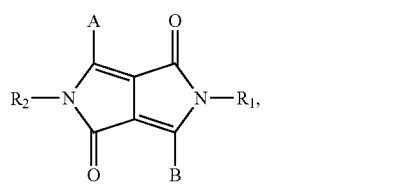

wherein A and B are independently of each other a group of formula

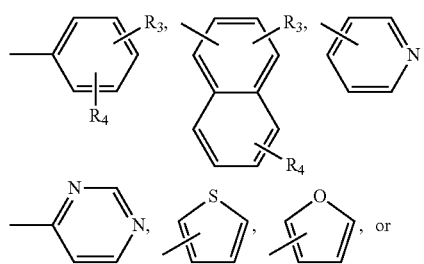

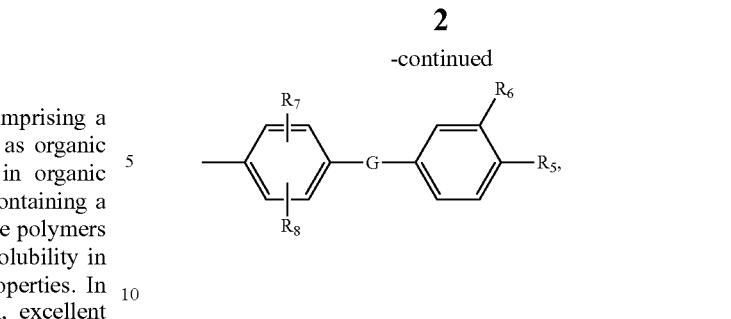

$R^1$ is a reactive group capable of polymerization ($-(CH_2)_m-CH=CH-(CH_2)_n-CH_3$ (II), or $-(Y)_p-X-(Z)_r-Q$ (III)), and $R^2$ is $C_1$-$C_6$alkyl, or $R^1$, m and n independently of one another are an integer between zero and 12, with the proviso that the sum m+n is at least 4, such as, for example,

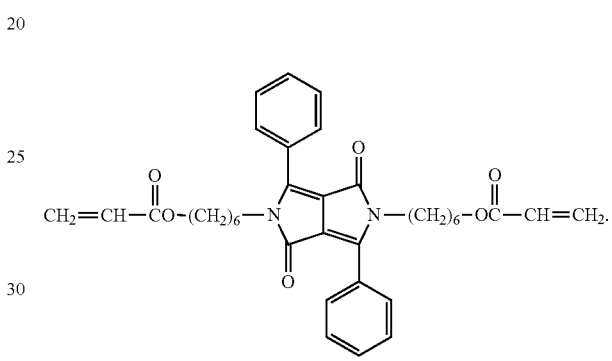

US2005/0255391 relates to the use of polymerisable diketopyrrolopyrroles in colour filters.

Among others diketopyrrolopyrroles of the general formula

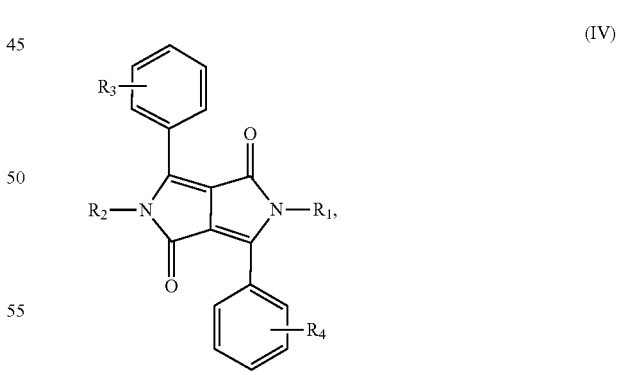

are disclosed, wherein $R_1$ and $R_2$ are independently of each other a group of the formula—$X_2$-$X_3$(II), wherein $X_2$ is $C_1$-$C_{18}$alkylene and X3 is $-NH_2$, $-OH$, $-CH=CH_2$, $-C(CH_3)=CH_2$, $-CO-CH=CH_2$, $-CO-C(CH_3)=CH_2$, $-CO-CH=CH_2$ or $-CO-C(CH_3)=CH_2$, such as, for example,

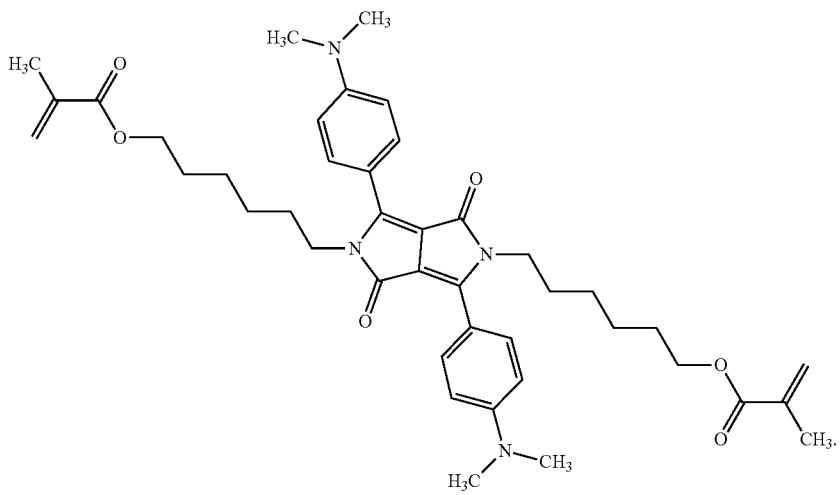 [SMILES: C=C(C)C(=O)OCCCCCCN1C(=O)C2=C(c3ccc(N(C)C)cc3)N(CCCCCCOC(=O)C(=C)C)C(=O)C2=C1c1ccc(N(C)C)cc1]

Reference is also made to US2009140220.

It was an aim of the present invention to reduce or overcome the disadvantages in organic semiconductor (OSC) layers of prior art, to provide improved electronic devices, to provide improved OSC materials and components to be used in such devices, and to provide methods for their manufacture. The device should exhibit improved stability, high film uniformity and high integrity of the OSC layer, the materials should have a high charge mobility and good processibility from solution, and the method should enable easy and time- and cost-effective device production especially at large scale. Other aims of the present invention are immediately evident to the expert from the following detailed description.

Accordingly, it is the object of the present invention to provide polymers, which show high efficiency of energy conversion, excellent field-effect mobility, good on/off current ratios and/or excellent stability, when used in organic field effect transistors, organic photovoltaics (solar cells) and photodiodes. Another object of the invention is to provide semiconducting polymers, which can be crosslinked.

Said object has been solved by polymers, comprising a repeating unit of formula

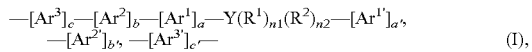
(I), wherein a is 0, 1, 2, or 3; a' is 0, 1, 2, or 3; b is 0, 1, 2, or 3; b' is 0, 1, 2, or 3; c is 0, 1, 2, or 3; c' is 0, 1, 2, or 3;

n1 is 1, or 2, n2 is 1, or 2,

Y is a bivalent heterocyclic group, or ring system, which may optionally be substituted, $Ar^1$, $Ar^{1'}$, $Ar^2$, $Ar^{2'}$, $Ar^3$ and $Ar^{3'}$ are independently of each other a $C_6$-$C_{24}$arylen group, which can optionally be substituted, or a $C_2$-$C_{20}$heteroarylen group, which can optionally be substituted;

$R^1$ and $R^2$ in each occurrence are independently of each other hydrogen, $C_5$-$C_{12}$cycloalkyl, $COR^{38}$, $C_1$-$C_{50}$alkyl, $C_3$-$C_{50}$alkenyl, or $C_3$-$C_{50}$alkynyl, which can optionally be substituted one or more times with $C_1$-$C_{12}$alkoxy, halogen, $C_5$-$C_8$cycloalkyl, cyano, $C_6$-$C_{24}$aryl, $C_2$-$C_{20}$heteroaryl, or a silyl group; and/or can optionally be further interrupted by one or more —O—, —S—, —NR$^{39}$—, —CONR$^{39}$—, —NR$^{39}$CO—, —COO—, —CO—, or —OCO—, or a group of formula

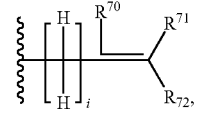
(II)

i is an integer from 1 to 18, $R^{70}$, $R^{71}$ and $R^{72}$ are independently of each other hydrogen, $C_1$-$C_{50}$alkyl, $C_5$-$C_{12}$cycloalkyl, $C_6$-$C_{24}$aryl, $C_2$-$C_{20}$heteroaryl, $C_2$-$C_{50}$alkenyl or $C_2$-$C_{50}$alkynyl which can optionally be substituted one or more times with $C_1$-$C_{12}$alkoxy, halogen (especially F), $C_5$-$C_8$cycloalkyl, cyano, $C_6$-$C_{24}$aryl, $C_2$-$C_{20}$heteroaryl, or a silyl group; and/or can optionally be further interrupted by one or more —O—, —S—, —NR$^{39}$—, —CONR$^{39}$—, —NR$^{39}$CO—, —COO—, —CO—, or —OCO—; with the proviso that at least one of the substituents $R^{70}$, $R^{71}$ and $R^{72}$ is different from hydrogen;

$R^{38}$ is $C_1$-$C_{50}$alkyl, $C_2$-$C_{50}$alkenyl, $C_2$-$C_{50}$alkynyl or $C_1$-$C_{50}$alkoxy, which can optionally be substituted one or more times with $C_1$-$C_{12}$alkoxy, halogen, $C_5$-$C_8$cycloalkyl, cyano, $C_6$-$C_{24}$aryl, $C_2$-$C_{20}$heteroaryl, or a silyl group; and/or can optionally be further interrupted by one or more —O—, —S—, —NR$^{39}$—, —CONR$^{39}$—, —NR$^{39}$CO—, —COO—, —CO—, or —OCO—, and $R^{39}$ is hydrogen, $C_1$-$C_{25}$alkyl, $C_1$-$C_{18}$haloalkyl, $C_7$-$C_{25}$arylalkyl, or $C_1$-$C_{18}$alkanoyl, with the proviso that at least one of $R^1$ and $R^2$ is a group of formula (II).

FIG. 1 shows representative transfer characteristics of an FET fabricated from compound P1 with VGS=10 V to −30 V at 0.5V step size with VDS=−30V. Drain current (black solid curve), Gate current (dotted grey curve), Square root of drain current (grey solid curve), and fitted slope of square root (dashed black curve).

The polymers of the invention can be used as the semiconductor layer in semiconductor devices. Accordingly, the present invention also relates to semiconductor devices, or an organic semiconductor material, layer or component, comprising a polymer of the present invention. The semiconductor device is especially an organic photovoltaic (PV) device (solar cell), a photodiode, or an organic field effect transistor. The semiconducting polymers of the present invention show a good mobility and in addition a good solubility, which makes them suitable for devices where the semiconductor is applied e.g. by printing processes.

Examples of the bivalent heterocyclic group, or ring system, Y, are shown below.

Besides the substituents $R^1$ and $R^2$ Y can be substituted with one to four substituents independently selected from the group consisting of $C_1$-$C_{25}$alkyl, $C_2$-$C_{25}$alkenyl, $C_2$-$C_{25}$alkynyl, $C_5$-$C_8$cycloalkyl, $C_6$-$C_{14}$aryl, $C_2$-$C_{20}$heteroaryl, —$OR^{110}$, —OC(O)—$R^{110}$, —C(O)—$OR^{110}$, —C(O)—$R^{110}$, —$NR^{110}R^{111}$, —$NR^{110}$—C(O)$R^{111}$, —C(O)—$NR^{110}R^{111}$, —N[C(O)$R^{110}$][C(O)$R^{111}$], —$SR^{110}$, halogen, CN, —$SiR^{112}R^{113}R^{114}$ and —$NO_2$, wherein $R^{110}$ and $R^{111}$ are independently selected from the group consisting of H, $C_1$-$C_{25}$alkenyl, $C_3$-$C_{25}$alkynyl, $C_3$-$C_{25}C_5$-$C_8$cycloalkyl, $C_{6-14}$aryl and $C_2$-$C_{20}$heteroaryl, $R^{112}$, $R^{113}$ and $R^{114}$ are independently from each other selected from the group consisting of H, $C_1$-$C_{25}$alkenyl, $C_2$-$C_{25}$alkynyl, $C_5$-$C_8$cycloalkyl, phenyl and O—Si(CH$_3$)$_3$. More preferred additional substituents of Y are F, $C_1$-$C_{25}$alkyl and —$OR^{110}$, wherein $R^{110}$ is $C_1$-$C_{25}$alkyl. Most preferred Y bears no additional substituents with the exception of $R^1$ and $R^2$.

The group of formula $Y(R^1)_{n1}(R^2)_{n2}$ is preferably a group of formula

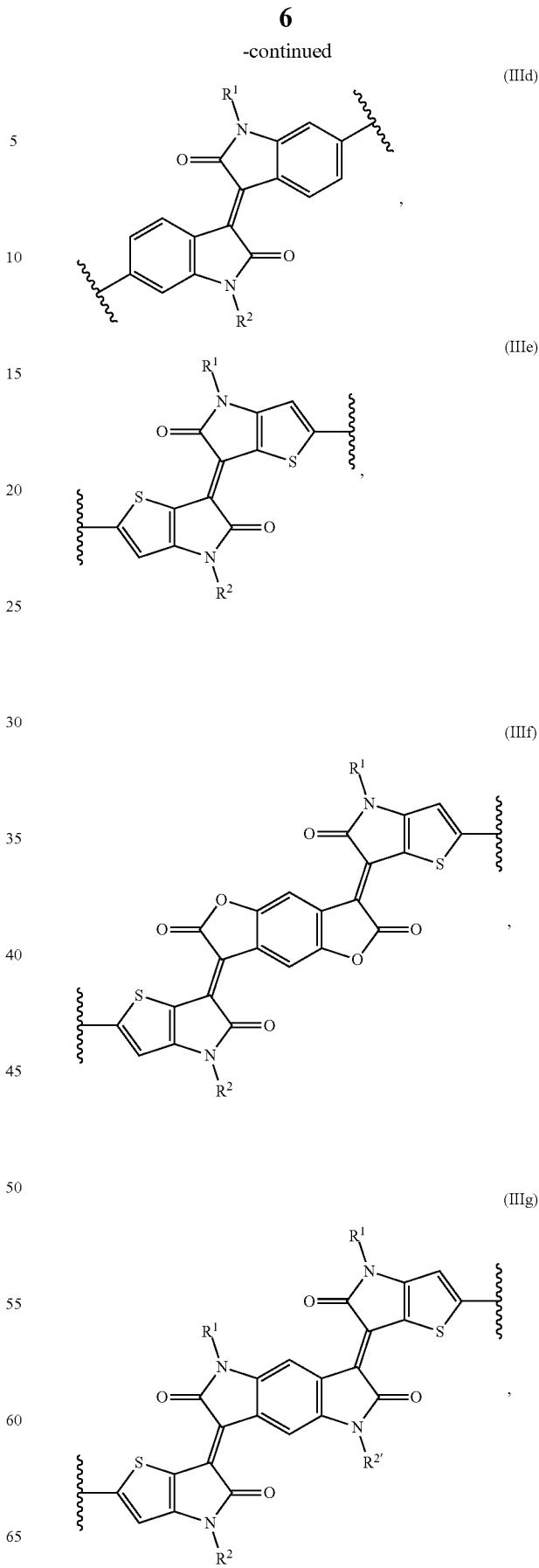

-continued

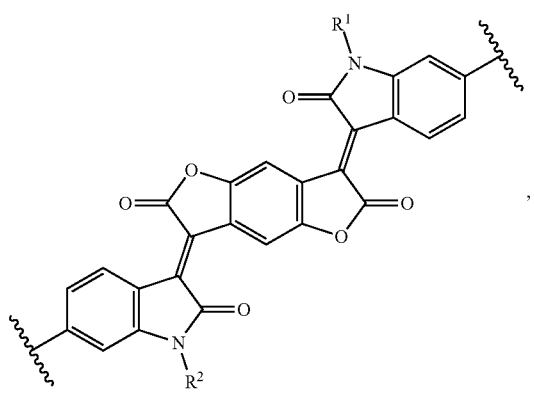
(IIIh), or

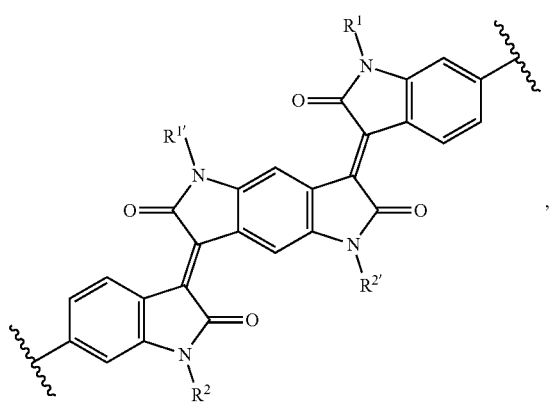
(IIIi)

which may optionally be substituted, wherein $R^1$ and $R^2$ are defined above, or below and $R^{1'}$ and $R^{2'}$ have the meaning of $R^1$, with the proviso that in case $Y(R^1)_{n1}(R^2)_{n2}$ is a group of formula

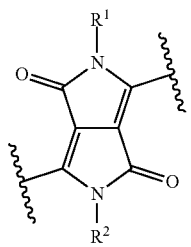
(IIIa)

a and a' in formula (I) are not 0. That is, the group of formula (IIIa) comprises at least one group $Ar^1$ and $Ar^{1'}$.

The group of formula $Y(R^1)_{n1}(R^2)_{n2}$ is more preferably a group of formula (IIIa), (IIIb), (IIId), (IIIe), (IIIf), (IIIg), (IIIh), or (IIIi), even more preferably a group of formula (IIIa), (IIIb), (IIId), (IIIe), (IIIh), or (IIIi), most preferably a group of formula (IIIa), (IIIb), or (IIId).

Examples of $C_6$-$C_{14}$arylen, $C_6$-$C_{24}$arylen groups and $C_2$-$C_{20}$heteroarylen groups, $Ar^1$, $Ar^{1'}$ $Ar^2$, $Ar^{2'}$, $Ar^3$ and $Ar^{3'}$, which can optionally be substituted, are shown below.

$C_6$-$C_{14}$arylen, $C_6$-$C_{24}$arylen groups and $C_2$-$C_{20}$heteroarylen groups can be substituted with one to ten substituents independently selected from the group consisting of $C_1$-$C_{25}$alkyl, $C_2$-$C_{25}$alkenyl, $C_2$-$C_{25}$alkynyl, $C_5$-$C_8$cycloalkyl, $C_6$-$C_{14}$aryl, $C_2$-$C_{20}$heteroaryl, $OR^{110}$, $OC(O)$—$R^{110}$, $C(O)$—$OR^{110}$, $C(O)$—$R^{110}$, $NR^{110}R^{111}$, $NR^{110}$—$C(O)R^{111}$, $C(O)$—$NR^{110}R^{111}$, $N[C(O)R^{110}][C(O)R^{111}]$, $SR^{110}$, halogen, CN, $SiR^{112}R^{113}R^{114}$ and $NO_2$, wherein $R^{110}$ and $R^{111}$ are independently selected from the group consisting of H, $C_1$-$C_{25}$alkenyl, $C_2$-$C_{25}$alkenyl, $C_2$-$C_{25}$alkynyl, $C_5$-$C_8$cycloalkyl, $C_6$-$C_{14}$aryl and $C_2$-$C_{20}$heteroaryl, R112, $R^{113}$ and $R^{114}$ are independently from each other selected from the group consisting of H, $C_1$-$C_{25}$alkyl, $C_2$-$C_{25}$alkenyl, $C_2$-$C_{25}$alkynyl, $C_5$-$C_8$cycloalkyl, phenyl and O—$Si(CH_3)_3$.

Preferably $C_6$-$C_{14}$arylen, $C_6$-$C_{24}$arylen groups and $C_2$-$C_{20}$heteroarylen groups can be substituted with one to ten substituents independently selected from the group consisting of $C_1$-$C_{25}$alkyl, $OR^{110}$, halogen and $SiR^{112}R^{113}R^{114}$, wherein $R^{110}$ is selected from the group consisting of H and $C_1$-$C_{25}$alkyl, and $R^{112}$, $R^{113}$ and $R^{114}$ are independently from each other selected from the group consisting of H, $C_1$-$C_{25}$alkyl, phenyl and O—$Si(CH_3)_3$.

More preferably $C_6$-$C_{14}$arylen, $C_6$-$C_{24}$arylen groups, or $C_2$-$C_{20}$heteroarylen groups can be substituted with one to ten substituents independently selected from the group consisting of $C_1$-$C_{25}$alkyl, $OR^{110}$ and halogen, wherein $R^{110}$ is selected from the group consisting of H and $C_1$-$C_{25}$alkyl.

Most preferably $C_6$-$C_{14}$arylen, $C_6$-$C_{24}$arylen groups, or $C_2$-$C_{20}$heteroarylen groups are not substituted.

$Ar^1$ and $Ar^{1'}$ are independently of each other a group of formula

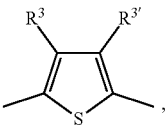
(XIa-1)

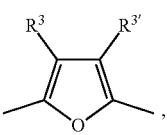
(XIa-2)

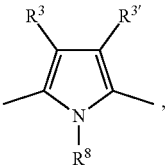
(XIa-3)

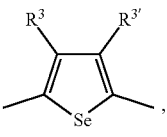
(XIa-4)

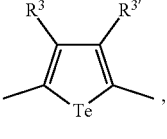
(XIa-5)

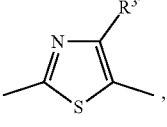
(XIb)

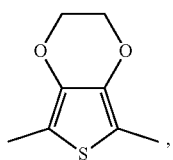 (XIc-1)
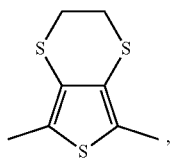 (XIc-2)
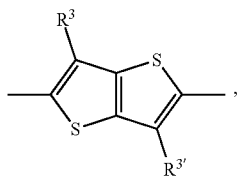 (XId)
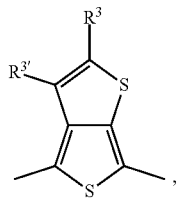 (XIe-1)
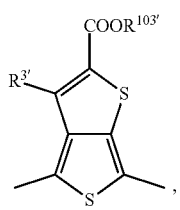 (XIe-2)
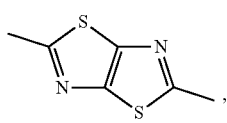 (XIf)
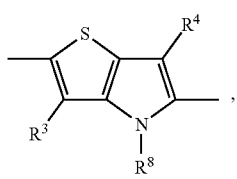 (XIg)
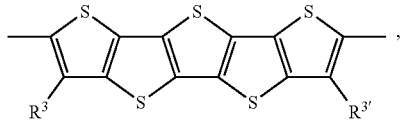 (XIh)
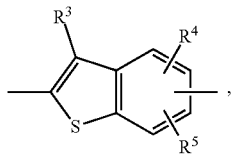 (XIi)
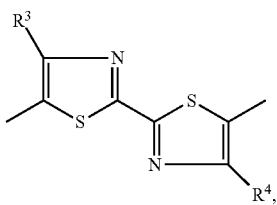 (XIj)
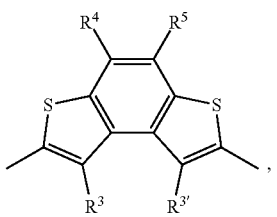 (XIk)
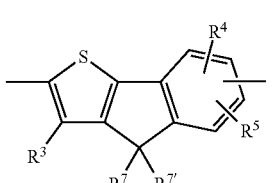 (XIl)
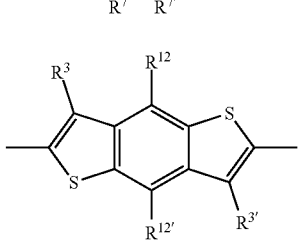 (XIm)
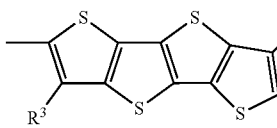 (XIn)
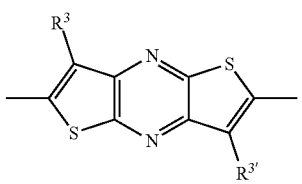 (XIo)
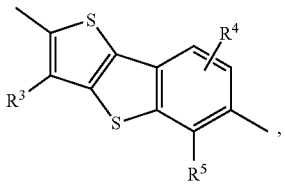 (XIp)
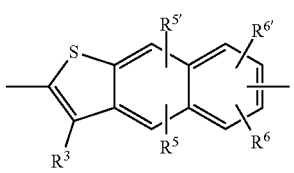 (XIq)

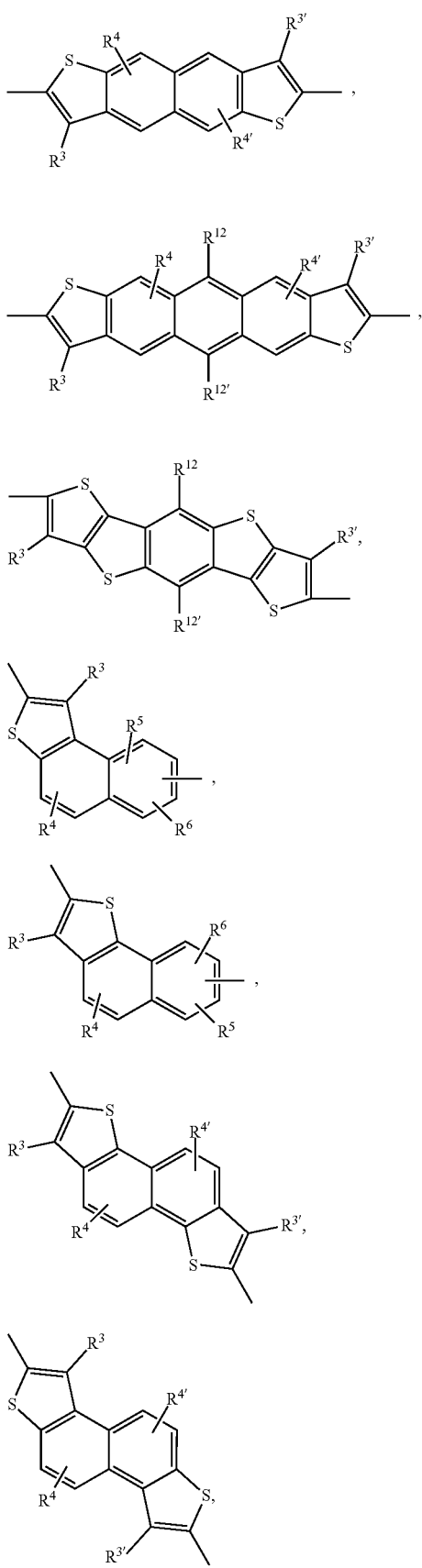
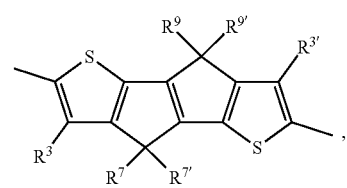
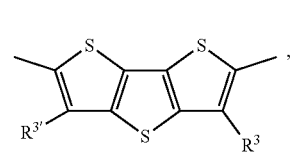
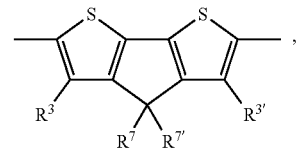
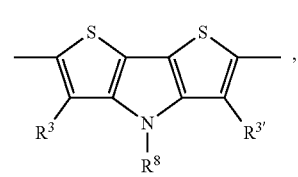
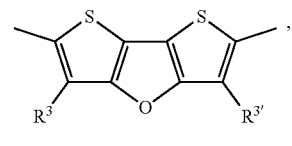
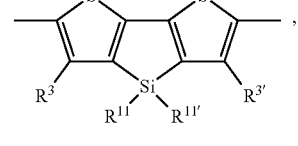
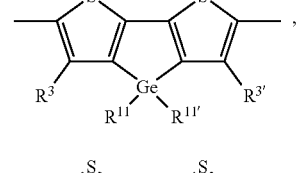
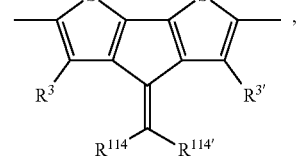
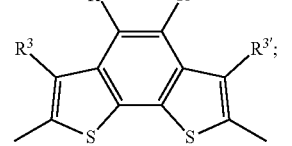

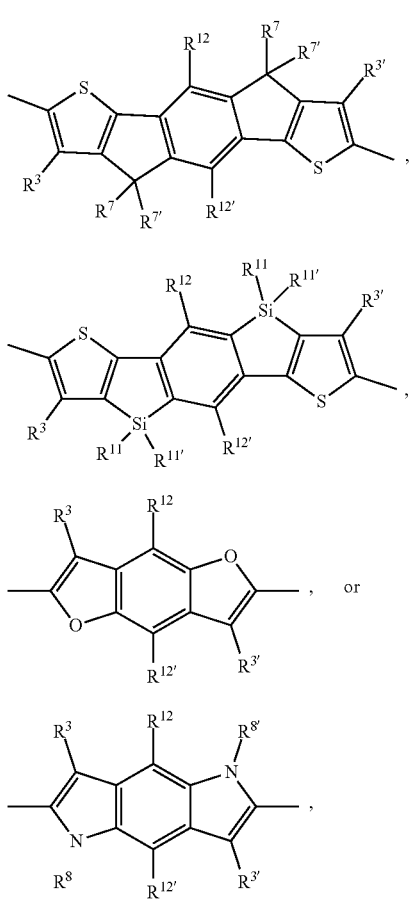

wherein

R$^{13}$ is a C$_1$-C$_{10}$alkyl group, or a tri(C$_1$-C$_8$alkyl)silyl group;

R$^{103'}$ is C$_1$-C$_{25}$alkyl, especially C$_3$-C$_{25}$alkyl, which may optionally be interrupted by one, or more oxygen, or sulphur atoms, and R$^{114}$ and R$^{114'}$ are independently of each other hydrogen, cyano, COOR$^{103'}$, a C$_1$-C$_{25}$alkyl group, or C$_6$-C$_{14}$aryl or C$_2$-C$_{20}$heteroaryl.

Ar$^1$ and Ar$^{1'}$ are preferably a group of formula XIa-1, XIa-2, XIa-4, XIb, XId, XIi, XIm, or XIz-1, more preferably a group of formula XIa-1, XIa-2, XIa-4, XId, or XIi, even more preferably a group of formula XIa-1, XIa-2, XIa-4, or XId, most preferably a group of formula XIa-1, or XIa-4.

Ar$^2$, Ar$^{2'}$, Ar$^3$ and Ar$^{3'}$ have independently of each other the meaning of Ar$^1$, wherein Ar$^1$ is defined above, or below, or are independently of each other

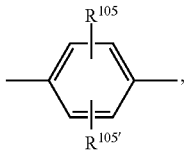

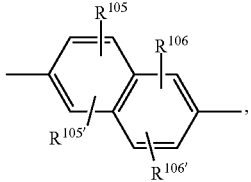

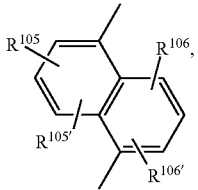

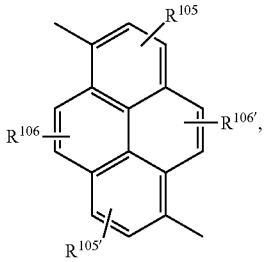

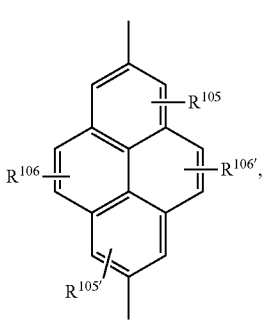

wherein R$^3$ and R$^{3'}$ are independently of each other hydrogen, halogen, halogenated C$_1$-C$_{25}$alkyl, especially CF$_3$, cyano, C$_1$-C$_{25}$alkyl, especially C$_3$-C$_{25}$alkyl, which may optionally be interrupted by one or more oxygen or sulphur atoms; C$_7$-C$_{25}$arylalkyl, or C$_1$-C$_{25}$alkoxy; R$^4$, R$^{4'}$, R$^5$, R$^{5'}$, R$^6$ and R$^{6'}$ are independently of each other hydrogen, halogen, halogenated C$_1$-C$_{25}$alkyl, especially CF$_3$, cyano, C$_1$-C$_{25}$alkyl, especially C$_3$-C$_{25}$alkyl, which may optionally be interrupted by one or more oxygen or sulphur atoms; C$_7$-C$_{25}$arylalkyl, or C$_1$-C$_{25}$alkoxy; R$^7$, R$^{7'}$, R$^9$ and R$^{9'}$ are independently of each other hydrogen, C$_1$-C$_{25}$alkyl, especially C$_3$-C$_{25}$alkyl, which may optionally be interrupted by one, or more oxygen, or sulphur atoms; or C$_7$-C$_{25}$arylalkyl, R$^8$ and R$^{8'}$ are independently of each other hydrogen, C$_6$-C$_{18}$aryl; C$_6$-C$_{18}$aryl which is substituted by C$_1$-C$_{25}$alkyl, or C$_1$-C$_{25}$alkoxy; or C$_1$-C$_{25}$alkyl, especially C$_3$-C$_{25}$alkyl, which may optionally be interrupted by one or more oxygen or sulphur atoms; or C$_7$-C$_{25}$arylalkyl, R$^{11}$ and R$^{11'}$ are independently of each other C$_1$-C$_{25}$alkyl group, especially a C$_1$-C$_8$alkyl group, C$_7$-C$_{25}$arylalkyl, or a phenyl group, which can be substituted one to three times with C$_1$-C$_8$alkyl and/or C$_1$-C$_8$alkoxy;

R$^{12}$ and R$^{12'}$ are independently of each other hydrogen, halogen, cyano, C$_1$-C$_{25}$alkyl, especially C$_3$-C$_{25}$alkyl, which may optionally be interrupted by one, or more oxygen, or sulphur atoms, C$_1$-C$_{25}$alkoxy, C$_7$-C$_{25}$arylalkyl, or -continued (XIIId)
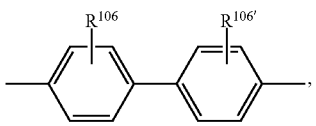

(XIIIe)
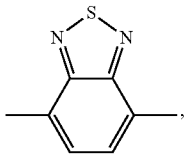

(XIIIf)
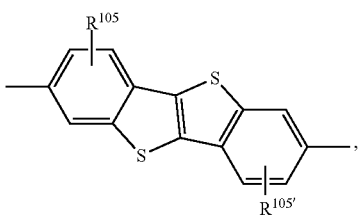

(XIIIg-1)
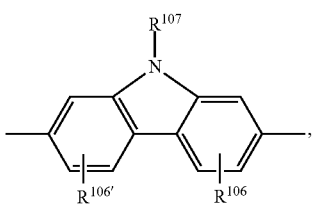

(XIIIg-2)
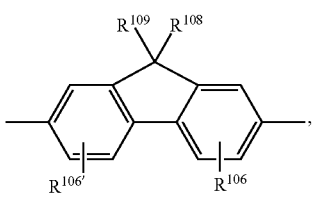

(XIIIg-3)
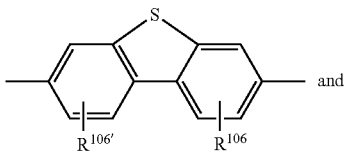 and (XIIIg-4)
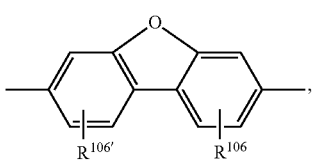

(XIIIh-1)
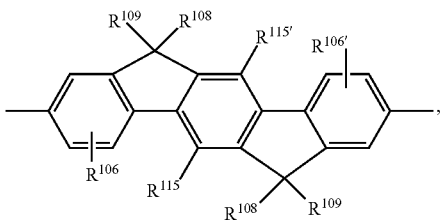

-continued (XIIIh-2)
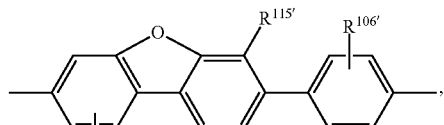

(XIIIh-3)
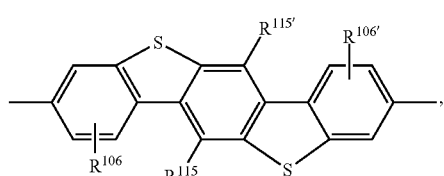

(XIIIi-1)
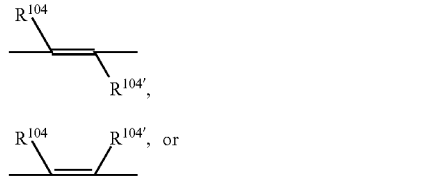

(XIIIi-2)
 or (XIIIj)

$R^{103}$ is $C_1$-$C_{25}$alkyl, especially $C_3$-$C_{25}$alkyl, which may optionally be interrupted by one, or more oxygen, or sulphur atoms;

$R^{104}$ and $R^{104'}$ are independently of each other hydrogen, cyano, $COOR^{103}$, a $C_1$-$C_{25}$alkyl group, or $C_6$-$C_{14}$aryl or $C_2$-$C_{20}$heteroaryl, $R^{105}$, $R^{105'}$, $R^{106}$ and $R^{106'}$ are independently of each other hydrogen, halogen, cyano, $C_1$-$C_{25}$alkyl, which may optionally be interrupted by one or more oxygen or sulphur atoms; $C_7$-$C_{25}$arylalkyl, or $C_1$-$C_{25}$alkoxy, $R^{107}$ is hydrogen, $C_7$-$C_{25}$arylalkyl, $C_6$-$C_{20}$aryl; $C_6$-$C_{20}$aryl which is substituted by $C_1$-$C_{25}$alkyl, or $C_1$-$C_{25}$alkoxy; $C_1$-$C_{18}$perfluoroalkyl; $C_1$-$C_{25}$alkyl; especially $C_3$-$C_{25}$alkyl, which may be interrupted by —O—, or —S—; or —$COOR^{103}$;

$R^{108}$ and $R^{109}$ are independently of each other hydrogen, $C_1$-$C_{25}$alkyl, especially $C_3$-$C_{25}$alkyl, which may optionally be interrupted by one, or more oxygen, or sulphur atoms; or $C_7$-$C_{25}$arylalkyl, $R^{115}$ and $R^{115'}$ are independently of each other hydrogen, halogen, cyano, $C_1$-$C_{25}$alkyl, especially $C_3$-$C_{25}$alkyl, which may optionally be interrupted by one, or more oxygen, or sulphur atoms, $C_1$-$C_{25}$alkoxy, $C_7$-$C_{25}$arylalkyl, or $$\equiv\!\!-R^{116},$$

wherein $R^{116}$ is a $C_1$-$C_{10}$alkyl group, or a tri($C_1$-$C_8$alkyl) silyl group.

$Ar^2$, $Ar^{2'}$, $Ar^3$ and $Ar^{3'}$ are preferably a group of formula XIa-1, XIa-2, XIa-4, XIb, XId, XIi, XIm, XIx-1, XIx-2, XIx-3, XIx-5, XIz-1, XIIIa, XIIIb-1, XIIIb-2, XIIIe, XIIIg-2, XIIIi-1, or XIIIj; more preferably a group of formula XIa-1, XIa-2, XIa-4, XId, XIi, XIx-1, XIx-2, XIIIa, XIIIg-2, or XIIIi-1; even more preferably a group of formula XIa-1, XIa-2, XIa-4, XId, or XIIi-1, most preferably a group of formula XIa-1, XIa-4, or XIIIi-1.

a is 0, 1, 2, or 3, a' is 0, 1, 2, or 3; b is 0, 1, 2, or 3; b' is 0, 1, 2, or 3; c is 0, 1, 2, or 3; c' is 0, 1, 2, or 3; preferably a is 0, 1, or 2; a' is 0, 1, or 2; b is 0, 1, or 2; b' is 0, 1, or 2; c is 0, 1, or 2; c' is 0, 1, or 2; more preferably a is 0, 1, or 2; a' is 0, 1 or 2; b is 0, or 1; b' is 0, or 1; c is 0, or 1; c' is 0, or 1; even more preferably a is 0, 1, or 2, a' is 0, 1 or 2; b is 0; b' is 0; c is 0; c' is 0; most preferably a is 0, or 1; a' is 0, or 1; b is 0; b' is 0; c is 0; c' is 0.
The repeating unit of formula (I) is preferably a repeating unit of formula
(Ia)
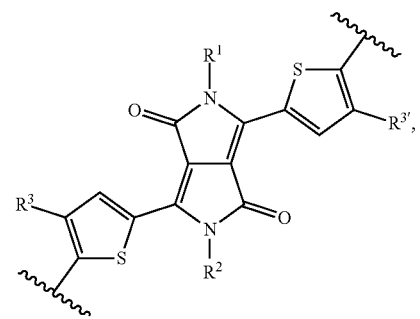
(Ib)
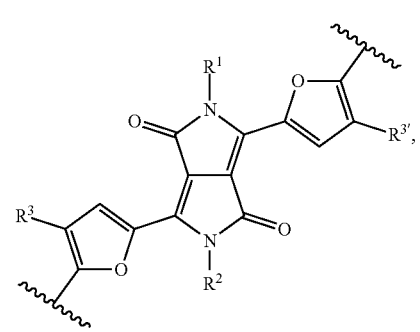
(Ic)
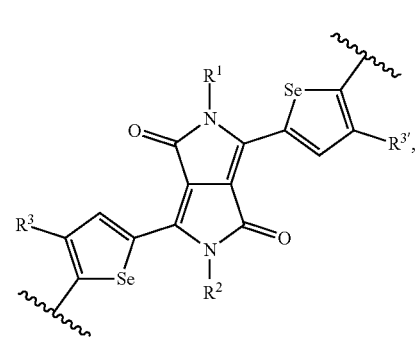
(Id)
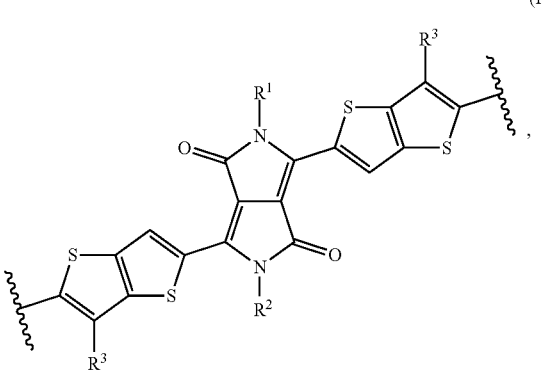
(Ie)
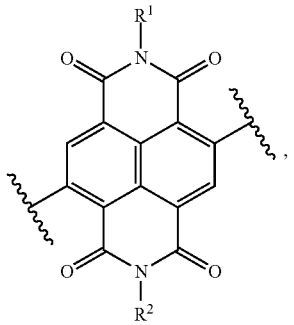
(If)
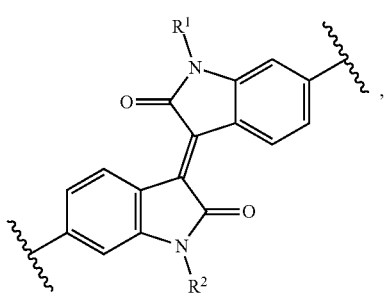
(Ig)
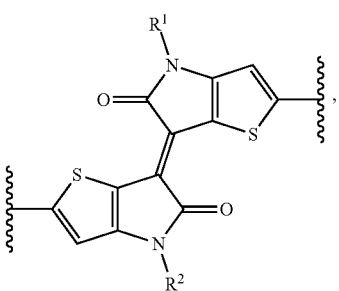
(Ih)
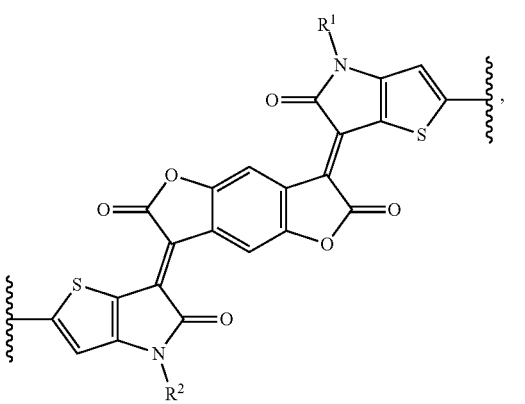

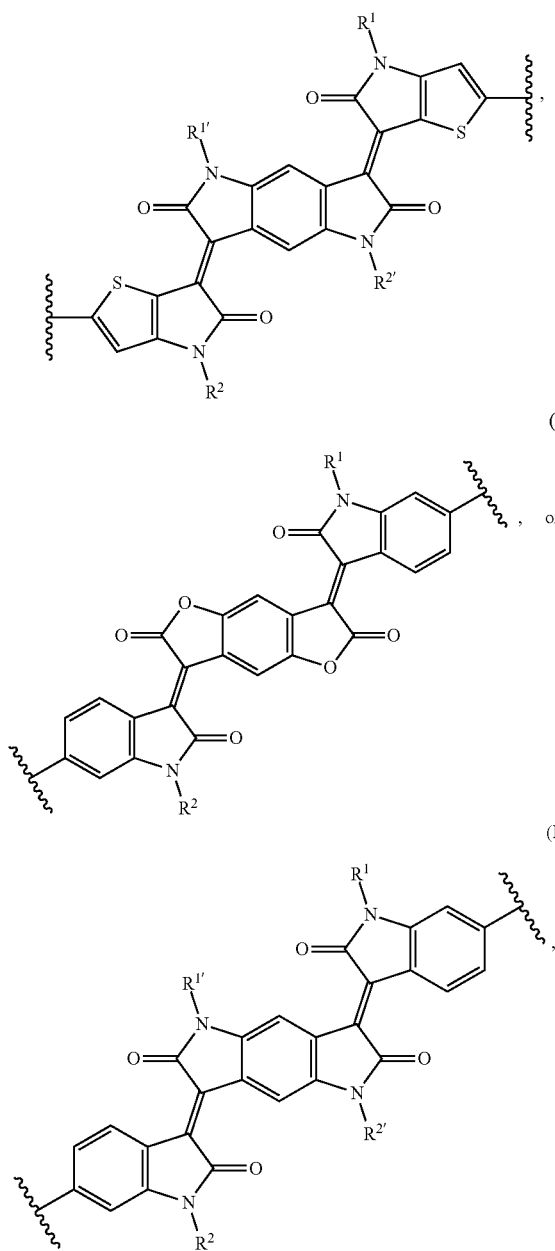

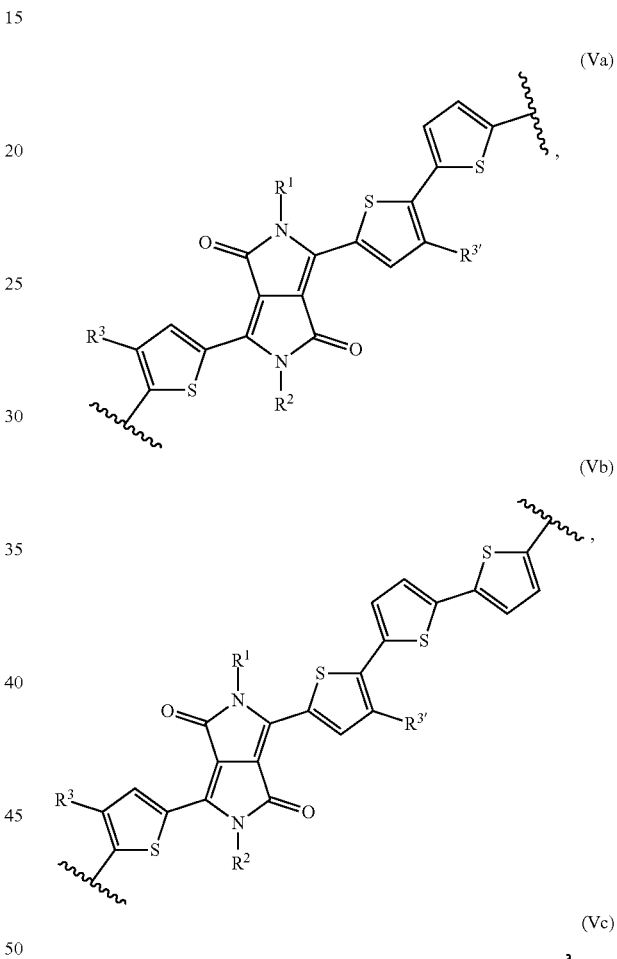

of —Ar²—, wherein Ar² is defined above, or below, n3 is an integer of 1 to 4, especially 1 to 3 and COM can be the same or, different in each occurrence, n is 4 to 1000, especially 5 to 200, very especially 6 to 100.

COM is preferably a group of formula XIa-1, XIa-2, XIa-4, XIb, XId, XIi, XIm, XIx-1, XIx-2, XIx-3, XIx-5, XIz-1, XIIIa, XIIIb-1, XIIIb-2, XIIIe, XIIIg-2, XIIII-1, or XIIIj; more preferably a group of formula XIa-1, XIa-2, XIa-4, XId, XIi, XIx-1, XIx-2, XII Ia, XIIIg-2, or XIIIi-1; even more preferably a group of formula XIa-1, XIa-2, XIa-4, XId, or XIIIi-1, most preferably a group of formula XIa-1, XIa-4, or XIIIi-1.

In said embodiment polymers are preferred, comprising repeating units -[A]-[COM]$_{n3}$- of formula

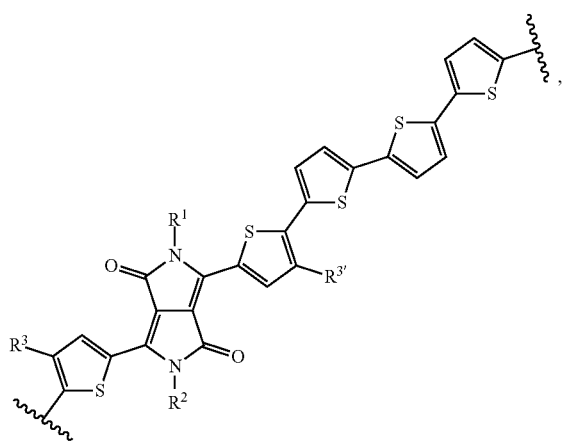

more preferably a repeating unit of formula (Ia), (Ic), (Ie), (If), (Ij), or (Ik), most preferably a repeating unit of formula (Ia), (Ic), (Ie), or (If), wherein $R^3$ and $R^{3'}$ are independently of each other hydrogen, halogen, especially fluorine, $C_1$-$C_{25}$alkyl, or $C_1$-$C_{25}$alkoxy, and $R^1$, $R^2$, $R^{1'}$ and $R^{2'}$ are defined above, or below.

In a preferred embodiment the present invention is directed to polymers, comprising a repeating unit -[A]-[COM]$_{n3}$- (V), wherein A is a unit of formula (I) and COM has the meaning of —Ar²—, wherein Ar² is defined above, or below, n3 is an integer of 1 to 4, especially 1 to 3 and COM can be the same or, different in each occurrence.

In another preferred embodiment the present invention is directed to polymers of formula -[[A]-[COM]$_{n3}$]$_n$- (V'), wherein A is a unit of formula (I) and COM has the meaning

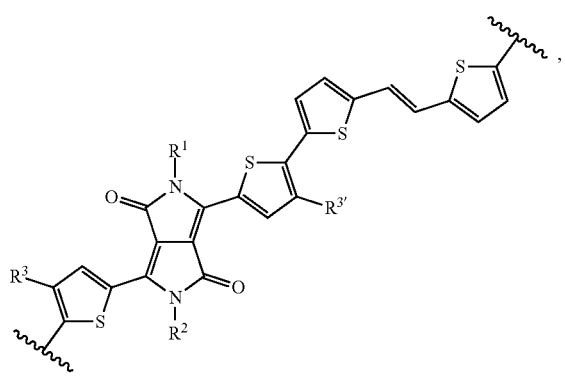
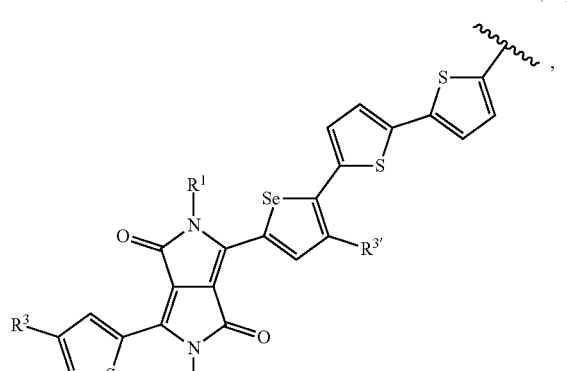
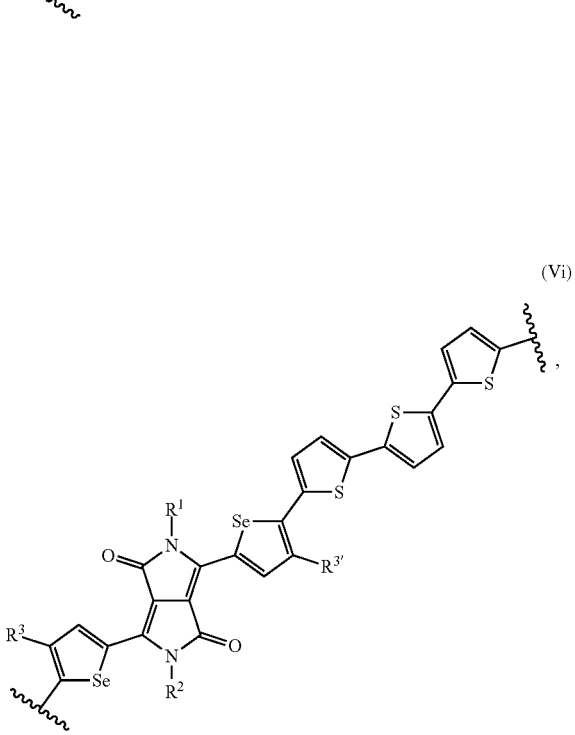

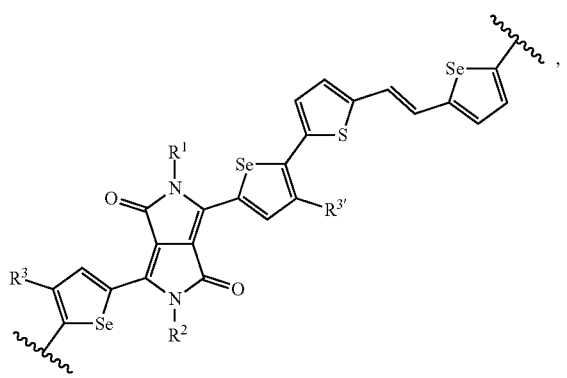

(Vk)

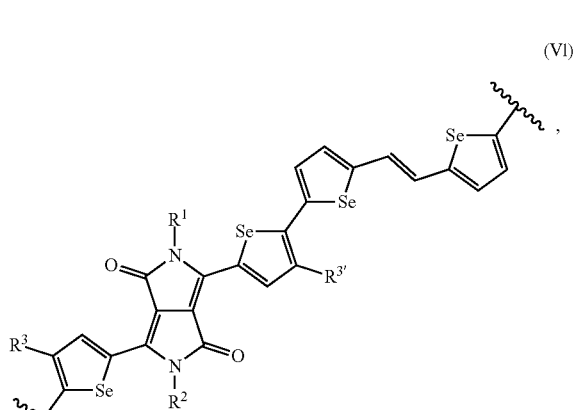

(Vl)

(Vm)

(Vn)

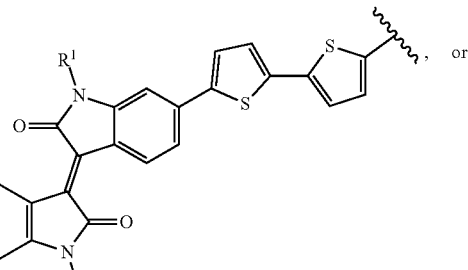

(Vo), or (Vp)

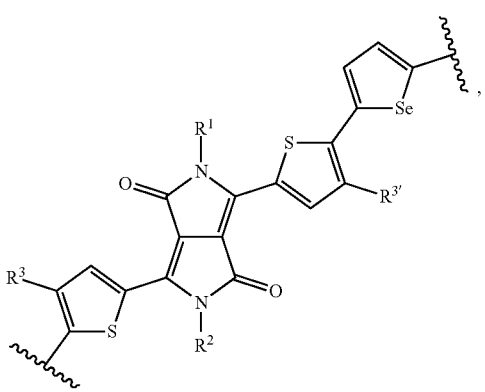

wherein
R³ and R³' are independently of each other hydrogen, fluorine, $C_1$-$C_{25}$alkyl, or $C_1$-$C_{25}$alkoxy, and R¹ and R² are defined above, or below.

R³ and R³' are preferably hydrogen.

The repeating unit of formula -[A]-[COM]$_{n3}$- is preferably a reapeating unit of formula Va, Vb, Vd, Ve, Vf, Vg, Vj, Vk, Vl, Vn, Vo, or Vp, more preferably a repeating unit of formula Va, Vb, Vd, Ve, Vf, Vn, Vo, or Vp, even more preferably a repeating unit of formula Va, Vb, or Vp, most preferred a repeating unit of formula Va.

Preferably the total weight of the repeating units -[A]-[COM]$_{n3}$- in a polymer of the present invention is more than 5 weight percent, preferably more than 20%, more preferably more than 50%, even more preferably more than 80%, most preferably more than 90% of the total weight of the polymer.

Examples of the polymer according to the present invention are shown below:

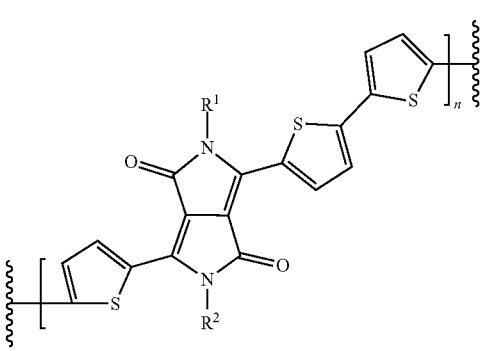

(Va')

(Vb')
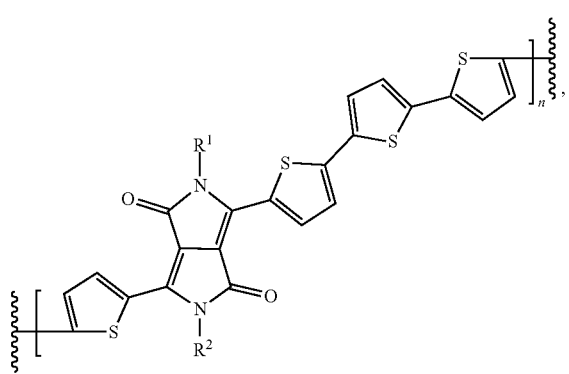
(Vc')
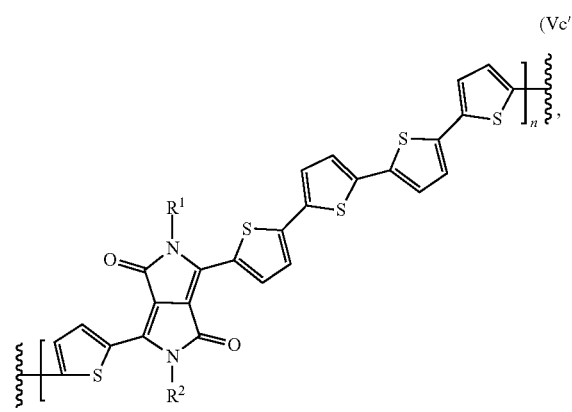
(Vd')
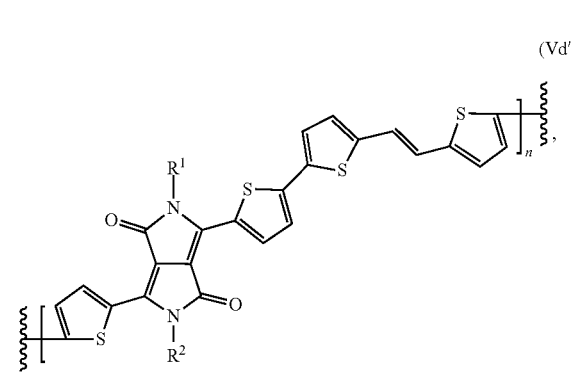
(Ve')
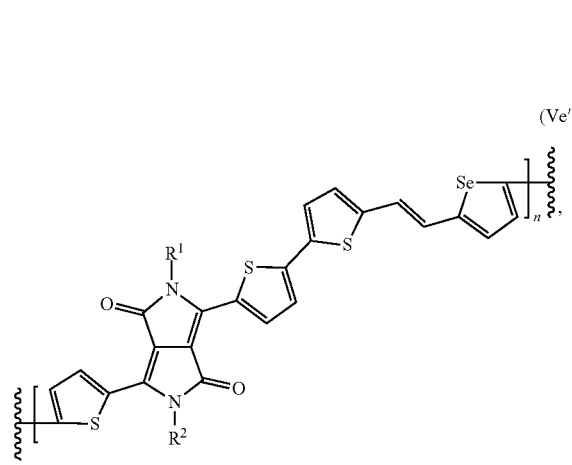
(Vf')
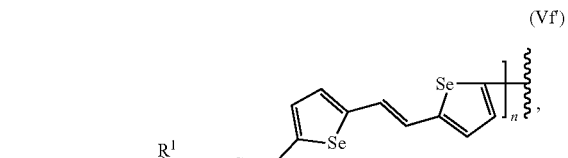
(Vg')
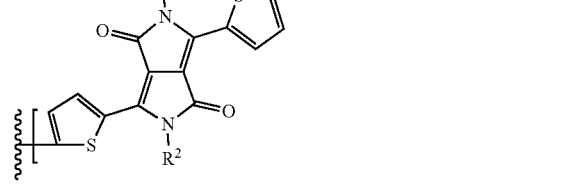
(Vh')
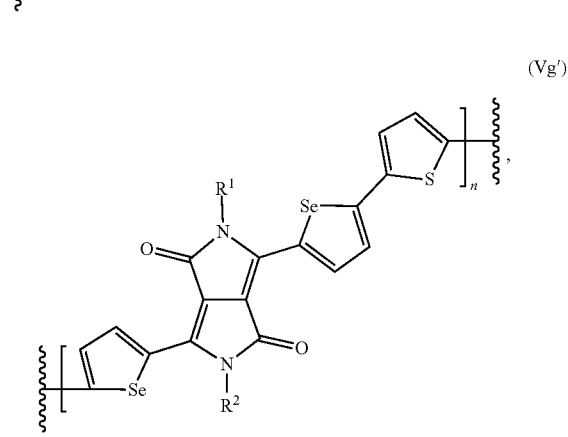
(Vi')
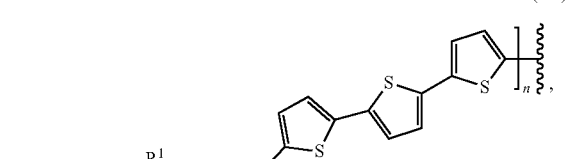

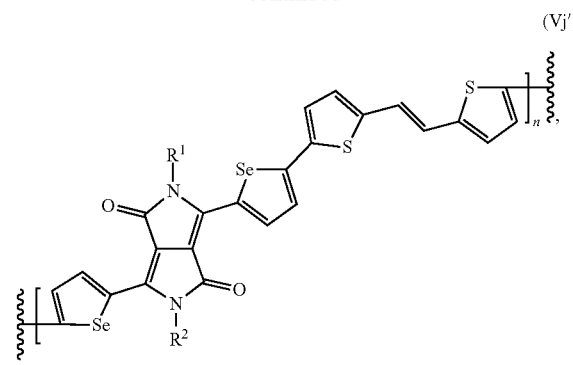

(Vj')

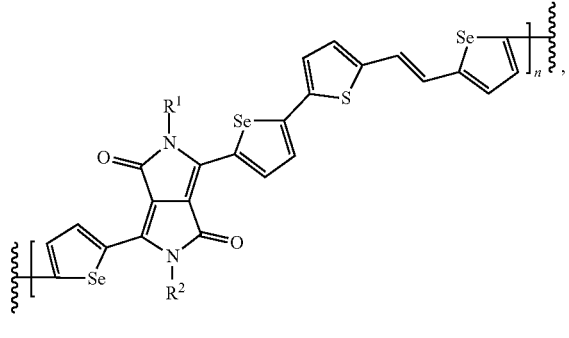

(Vk')

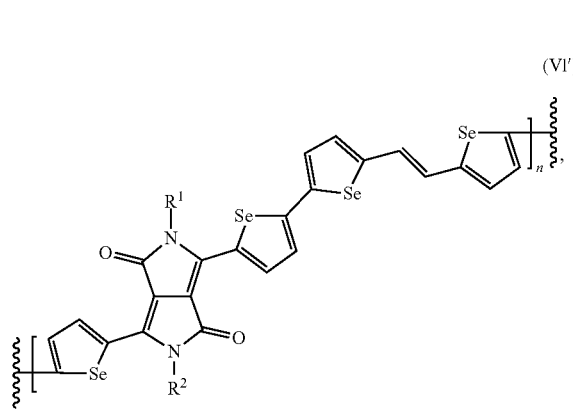

(Vl')

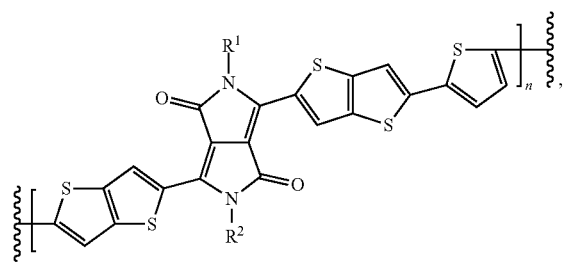

(Vm')

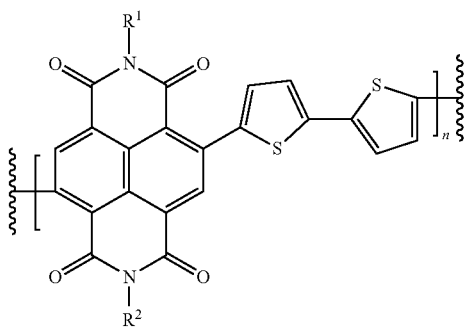

(Vn')

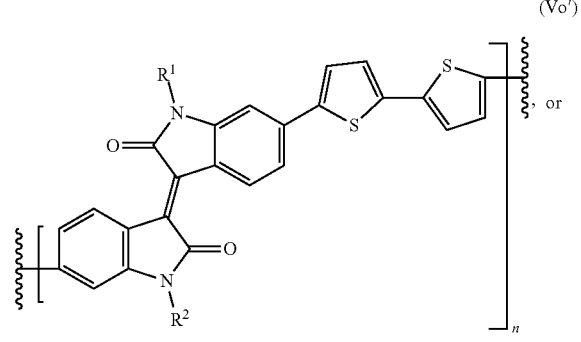

(Vo')

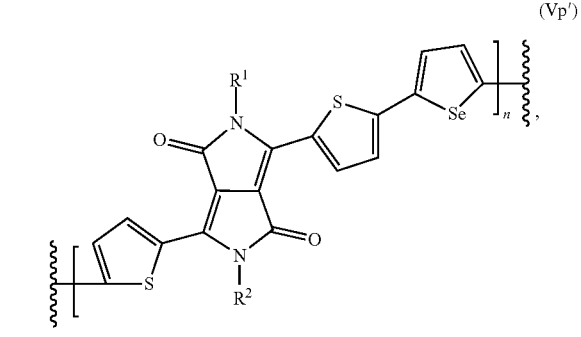

(Vp')

wherein n is 4 to 1000, especially 5 to 200, very especially 6 to 100, and $R^1$ and $R^2$ are defined above, or below.

Polymers of formulae Va', Vb', Vd', Ve', Vf, Vn', Vo' and Vp' are more preferred. Polymers of formulae Va', Vb', Vd', Ve', Vf and Vp' are even more preferred. Polymers of formula Va' are most preferred.

$R^1$, $R^2$, $R^{1'}$ and $R^{2'}$ are preferably independently of each other hydrogen, $COR^{38}$, $C_1$-$C_{50}$alkyl, $C_3$-$C_{50}$alkenyl, or $C_3$-$C_{50}$alkynyl, which can optionally be substituted one or more times with $C_1$-$C_{12}$alkoxy, halogen, $C_5$-$C_8$cycloalkyl, cyano, $C_6$-$C_{20}$aryl, $C_2$-$C_{20}$heteroaryl, or a silyl group; and/or can optionally be further interrupted by one or more —O—, —S—, —NR$^{39}$—, —CONR$^{39}$—, —NR$^{39}$CO—, —COO—, —CO—, or —OCO—, or a group of formula

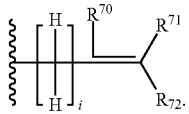

(II)

A silyl group is a group of formula —SiR$^{161}$R$^{162}$R$^{163}$, wherein R$^{161}$, R$^{162}$ and R$^{163}$ are independently of each other $C_1$-$C_8$alkyl, $C_5$-$C_6$cycloalkyl, which might optionally be substituted with $C_1$-$C_4$alkyl; halogenated $C_1$-$C_8$alkyl, $C_2$-$C_8$alkenyl, —O—$SiR^{164}R^{165}R^{166}$, —(O—$SiR^{164}R^{165})_d$—R166, or phenyl, $R^{164}$, $R^{165}$ and $R^{166}$ are independently of each other $C_1$-$C_8$alkyl, halogenated $C_1$-$C_8$alkyl, $C_2$-$C_8$alkenyl, —O—$SiR^{169}R^{170}R^{171}$, —(O—$SiR^{169}R^{170})_{d'}$—$R^{171}$, or phenyl; $R^{169}$, $R^{170}$ and $R^{171}$ are independently of each other $C_1$-$C_8$alkyl, halogenated $C_1$-$C_8$alkyl, $C_2$-$C_8$alkenyl, —O—$Si(CH_3)_3$, or phenyl; d is an integer from 1 to 10; d' is an integer from 1 to 10.

At least one of $R^1$, $R^2$, $R^{1'}$ and $R^{2'}$ is a group of formula (II). Preferably, $R^1$, $R^2$, $R^{1'}$ and $R^{2'}$ are independently of each other a group of formula (II).

i is an integer from 1 to 18, preferably 1 to 10, more preferably 1 to 5.

$R^{70}$, $R^{71}$ and $R^{72}$ are independently of each other hydrogen, $C_1$-$C_{50}$alkyl, $C_5$-$C_8$cycloalkyl, $C_6$-$C_{24}$aryl, $C_2$-$C_{20}$heteroaryl, $C_2$-$C_{50}$alkenyl or $C_2$-$C_{50}$alkynyl which can optionally be substituted one or more times with $C_1$-$C_{12}$alkoxy, fluorine, $C_5$-$C_8$cycloalkyl, $C_6$-$C_{24}$aryl, $C_2$-$C_{20}$heteroaryl, or a silyl group; and/or can optionally be further interrupted by one or more —O—, or —S—; preferably hydrogen, $C_1$-$C_{50}$alkyl, $C_2$-$C_{50}$alkenyl or $C_2$-$C_{50}$alkynyl which can optionally be substituted one or more times with fluorine; and/or can optionally be interrupted by one or more —O—, or —S—; more preferably hydrogen, $C_1$-$C_{50}$alkyl or $C_2$-$C_{50}$alkenyl; even more preferably hydrogen, or $C_1$-$C_{50}$alkyl; most preferably hydrogen, or $C_1$-$C_{36}$alkyl, especially hydrogen, or $C_6$-$C_{24}$alkyl.

Preferably at least two of the substituents $R^{70}$, $R^{71}$ and $R^{72}$ are different from hydrogen, more preferably two of the substituents $R^{70}$, $R^{71}$ and $R^{72}$ are different from hydrogen.

In case of $R^{70}$, $R^{71}$ and $R^{72}$ alkyl, alkenyl, or alkynyl can be linear or branched and are preferably linear.

$R^1$, $R^2$, $R^{1'}$ and $R^{2'}$ are preferably independently of each other a group of formula (II), wherein i is an integer from 1 to 10; $R^{70}$, $R^{71}$ and $R^{72}$ are independently of each other hydrogen or $C_1$-$C_{50}$alkyl; with the proviso that at least one of the substituents $R^{70}$, $R^{71}$ and $R^{72}$ is different from hydrogen.

$R_1$, $R_2$, $R^{1'}$ and $R^{2'}$ are most preferred independently of each other a group of formula (II), wherein i is an integer from 1 to 5; and $R^{70}$, $R^{71}$ and $R^{72}$ are independently of each other hydrogen or $C_1$-$C_{36}$alkyl; with the proviso that two of the substituents $R^{70}$, $R^{71}$ and $R^{72}$ are different from hydrogen.

In a preferred embodiment the present invention is directed to polymers, comprising a repeating unit of formula $$—[Ar^3]_c—[Ar^2]_b—[Ar^1]_a—Y(R^1)_{n1}(R^2)_{n2}—[Ar^{1'}]_{a'}—[Ar^{2'}]_{b'}—[Ar^{3'}]_{c'}— \quad (I),$$

wherein
a is 0, 1, or 2; a' is 0, 1, or 2; b is 0, 1, or 2; b' is 0, 1, or 2; c is 0, 1, or 2; c' is 0, 1, or 2; more preferably a is 0, 1, or 2; a' is 0, 1 or 2; b is 0, or 1; b' is 0, or 1; c is 0, or 1; c' is 0, or 1; even more preferably a is 0, 1, or 2, a' is 0, 1 or 2; b is 0; b' is 0; c is 0; c' is 0; most preferably a is 0, or 1; a' is 0, or 1; b is 0; b' is 0; c is 0; c' is 0;

$Y(R^1)_{n1}(R^2)_{n2}$ is a group of formula (IIIa), (IIIb), (IIIc), (IIId), (IIIe), (IIIf), (IIIg), (IIIh), or (IIIi), $Ar^1$ and $Ar^{1'}$ are independently of each other a group of formula XIa-1, XIa-2, XIa-4, XIb, XId, XIi, XIm, or XIz-1, $Ar^2$, $Ar^{2'}$, $Ar^3$ and $Ar^{3'}$ are independently of each other a group of formula XIa-1, XIa-2, XIa-4, XIb, XId, XIi, XIm, XIx-1, XIx-2, XIx-3, XIx-5, XIz-1, XIIIa, XIIIb-1, XIIIb-2, XIIIe, XIIIi-1, or XIIIj, $R^1$, $R^2$, $R^{1'}$ and $R^{2'}$ are independently of each other a group of formula $$\text{(II)}$$

wherein i is an integer from 1 to 10; $R^{70}$, $R^{71}$ and $R^{72}$ are independently of each other hydrogen or $C_1$-$C_{50}$alkyl; with the proviso that at least one of the substituents $R^{70}$, $R^{71}$ and $R^{72}$ is different from hydrogen.

In a more preferred embodiment the present invention is directed to polymers, comprising a repeating unit of formula $$—[Ar^3]_c—[Ar^2]_b—[Ar^1]_a—Y(R^1)_{n1}(R^2)_{n2}—[Ar^{1'}]_{a'}—[Ar^{2'}]_{b'}—[Ar^{3'}]_{c'}— \quad (I),$$

wherein
a is 0, 1, or 2; a' is 0, 1 or 2; b is 0, or 1; b' is 0, or 1; c is 0, or 1; c' is 0, or 1; preferably a is 0, 1, or 2, a' is 0, 1 or 2; b is 0; b' is 0; c is 0; c' is 0; more preferably a is 0, or 1; a' is 0, or 1; b is 0; b' is 0; c is 0; c' is 0;

$Y(R^1)_{n1}(R^2)_{n2}$ is a group of formula (IIIa), (IIIb), (IIId), (IIIe), (IIIh), or (IIIi),
$Ar^1$ and $Ar^{1'}$ are independently of each other a group of formula XIa-1, XIa-2, XIa-4, or XId, $Ar^2$, $Ar^{2'}$, $Ar^3$ and $Ar^{3'}$ are independently of each other a group of formula XIa-1, XIa-2, XIa-4, XId, or XIIIi-1, $R^1$, $R^2$, $R^{1'}$ and $R^{2'}$ are independently of each other a group of formula (II), wherein i is an integer from 1 to 10; $R^{70}$, $R^{71}$ and $R^{72}$ are independently of each other hydrogen or $C_1$-$C_{50}$alkyl; with the proviso that two of the substituents $R^{70}$, $R^{71}$ and $R^{72}$ are different from hydrogen.

In an even more preferred embodiment the present invention is directed to polymers, comprising a repeating unit of formula $$—[Ar^3]_c—[Ar^2]_b—[Ar^1]_a—Y(R^1)_{n1}(R^2)_{n2}—[Ar^{1'}]_{a'}—[Ar^{2'}]_{b'}—[Ar^{3'}]_{c'}— \quad (I),$$

wherein
a is 0, 1, or 2; a' is 0, 1 or 2; b is 0; b' is 0; c is 0; c' is 0; preferably a is 0, or 1; a' is 0, or 1; b is 0; b' is 0; c is 0; c' is 0;

$Y(R^1)_{n1}(R^2)_{n2}$ is a group of formula (IIIa), (IIIb), or (IIId),
$Ar^1$ and $Ar^{1'}$ are independently of each other a group of formula XIa-1, or XIa-4,
$Ar^2$, $Ar^{2'}$, $Ar^3$ and $Ar^{3'}$ are independently of each other a group of formula XIa-1, XIa-4, or XIIIi-1, $R^1$ and $R^2$ are independently of each other a group of formula (II), wherein i is an integer from 1 to 5; and $R^{70}$, $R^{71}$ and $R^{72}$ are independently of each other hydrogen or $C_1$-$C_{36}$alkyl; with the proviso that two of the substituents $R^{70}$, $R^{71}$ and $R^{72}$ are different from hydrogen.

Most preferred one of the substituents $R^{70}$, $R^{71}$ and $R^{72}$ is hydrogen and the other two of the substituents $R^{70}$, $R^{71}$ and $R^{72}$ are $C_1$-$C_{36}$alkyl, especially $C_6$-$C_{24}$alkyl, very especially $C_8$-$C_{18}$alkyl.

Halogen can be F, Cl, Br and I.

$C_1$-$C_4$alkyl, $C_1$-$C_{10}$alkyl, $C_1$-$C_{25}$alkyl and $C_1$-$C_{50}$alkyl can be branched or unbranched. Examples are methyl, ethyl, n-propyl, isopropyl, n-butyl, sec-butyl, isobutyl, tert-butyl, n-pentyl, neopentyl, isopentyl, n-(1-ethyl)propyl, n-hexyl, n-heptyl, n-octyl, n-(2-ethyl)hexyl, n-nonyl, n-decyl, n-undecyl, n-dodecyl, n-undecyl, n-dodecyl, n-tridecyl, n-tetradecyl, n-pentadecyl, n-hexadecyl, n-heptadecyl, n-octadecyl, n-nonadecyl, n-icosyl ($C_{20}$), n-docosyl ($C_{22}$), n-tetracosyl ($C_{24}$), n-hexacosyl ($C_{26}$), n-octacosyl ($C_{28}$) and n-triacontyl ($C_{30}$).

C$_2$-C$_8$alkenyl, C$_3$-C$_8$alkenyl, C$_2$-C$_{25}$alkenyl, C$_3$-C$_{25}$alkenyl, C$_2$-C$_{50}$alkenyl and C$_3$-C$_{50}$alkenyl can be branched or unbranched. Examples are vinyl, propenyl, cis-2-butenyl, trans-2-butenyl, 3-butenyl, cis-2-pentenyl, trans-2-pentenyl, cis-3-pentenyl, trans-3-pentenyl, 4-pentenyl, 2-methyl-3-butenyl, hexenyl, heptenyl, octenyl, nonenyl, docenyl, linoleyl (C$_{18}$), linolenyl (C$_{18}$), oleyl (C$_{18}$), arachidonyl (C$_{20}$) and erucyl (C$_{22}$).

C$_2$-C$_{25}$alkynyl, C$_3$-C$_{25}$alkynyl, C$_2$-C$_{50}$alkynyl and C$_3$-C$_{50}$alkynyl can be branched or unbranched. Examples are ethynyl, 2-propynyl, 2-butynyl, 3-butynyl, pentynyl, hexynyl, heptynyl, octynyl, nonynyl, undecynyl, dodecynyl, undecynyl, dodecynyl, tridecynyl, tetradecynyl, pentadecynyl, hexadecynyl, heptadecynyl, octadecynyl, nonadecynyl and icosynyl (C$_{20}$).

Halogenated C$_1$-C$_8$alkyl and C$_1$-C$_{25}$alkyl (C$_1$-C$_{25}$haloalkyl) are a C$_1$-C$_{25}$alkyl group, where a part or all of the hydrogen atoms are replaced by halogen atoms, such as, for example, CF$_3$.

C$_1$-C$_{25}$alkanoyl (C$_{2-18}$alkanoyl) refers to a group R$^w$—(C=O)—, with R$^w$ is C$_{1-25}$alkyl (C$_{1-18}$alkyl). Specific examples thereof include an acetyl group, a n-propanoyl group, an isopropanoyl group, a n-butyroyl group, and a tert-butyroyl group.

Examples of C$_5$-C$_8$cycloalkyl and C$_5$-C$_{12}$cycloalkyl are cyclopentyl, cyclohexyl, cycloheptyl, cyclooctyl and cyclododecyl.

Examples of C$_6$-C$_{14}$aryl and C$_6$-C$_{24}$aryl are phenyl,

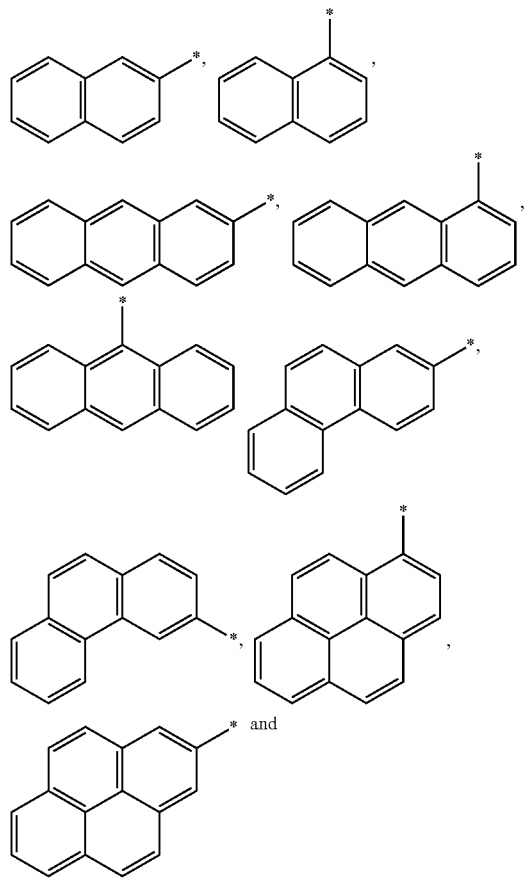

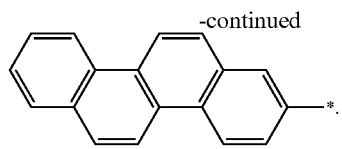

C$_6$-C$_{14}$aryl or C$_6$-C$_{24}$aryl may be optionally further substituted with one or more C$_1$-C$_{12}$alkyl, C$_1$-C$_{12}$alkoxy, or halogen, especially fluorine. C$_6$-C$_{14}$aryl or C$_6$-C$_{24}$aryl are preferably unsubstituted.

C$_2$-C$_{20}$heteroaryl is a monocyclic or polycyclic, such as dicyclic, tricyclic or tetracyclic, ring system, which comprise at least one heteroaromatic ring, and which may also comprise non-aromatic rings, which may be substituted by =O.

Examples of heteroaryl are

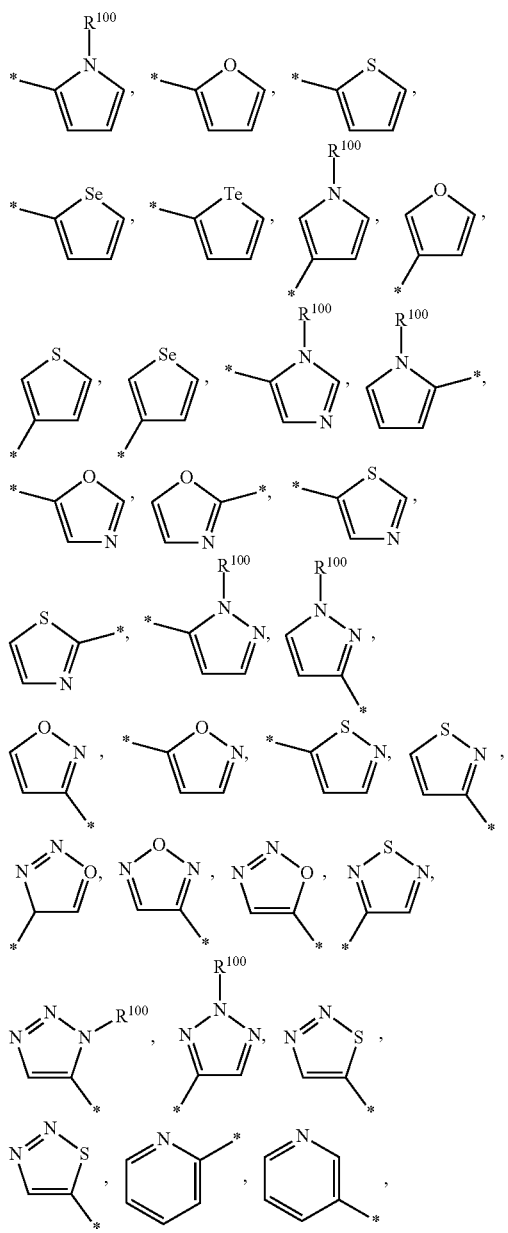

-continued
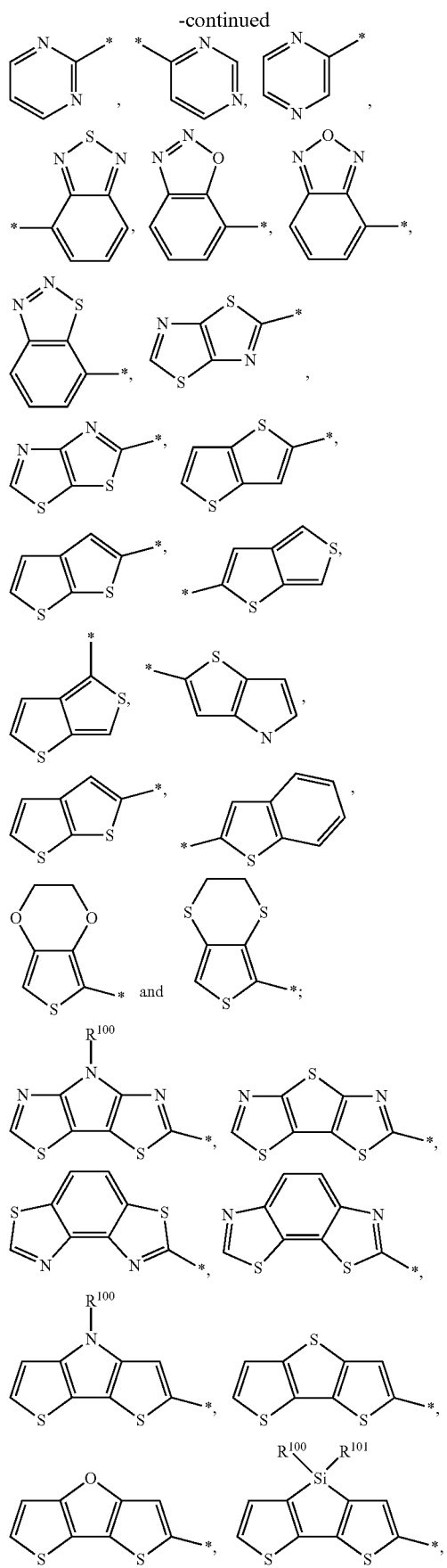
-continued
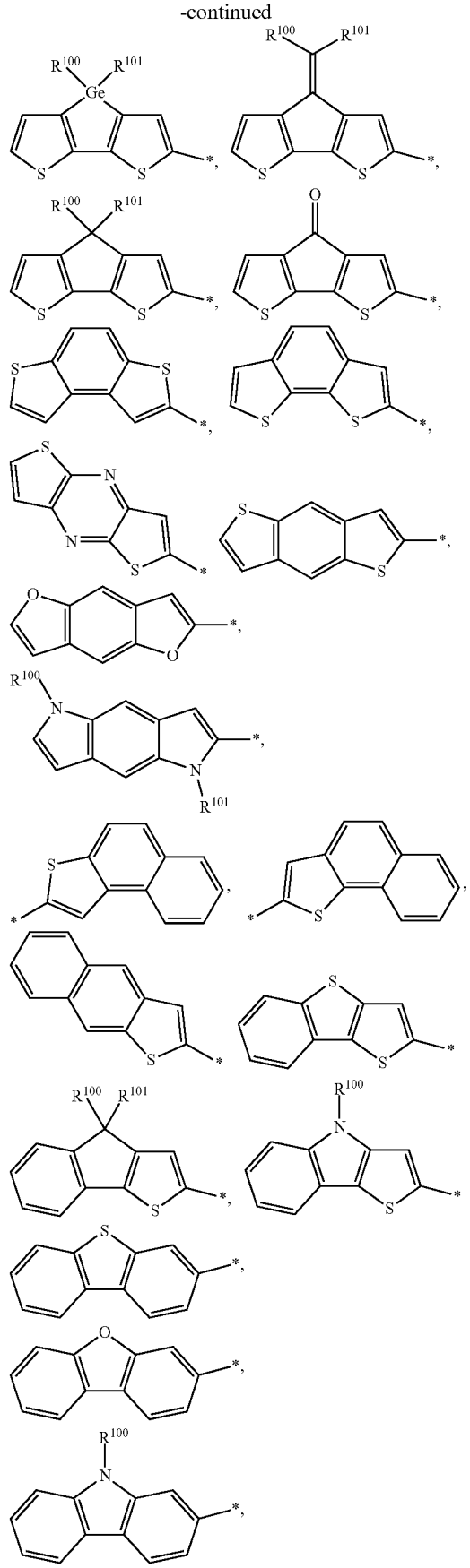

-continued
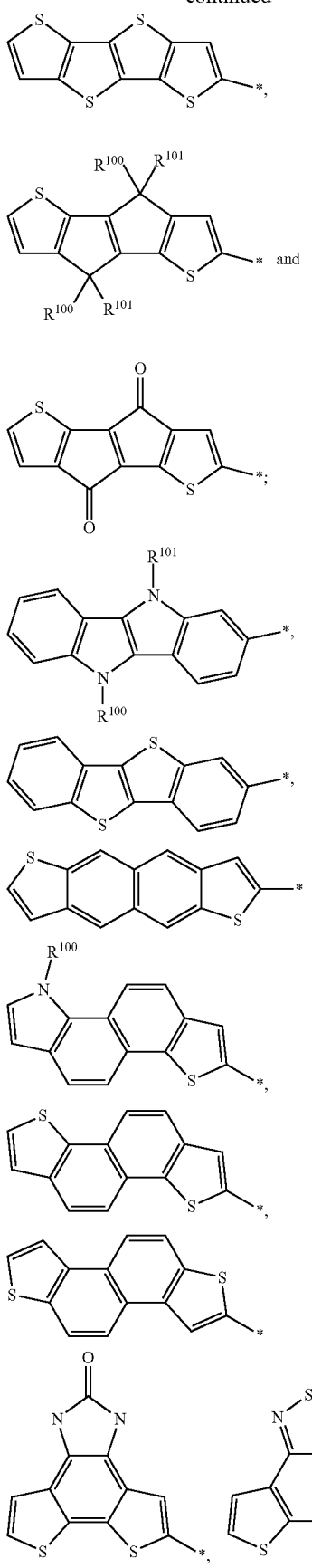
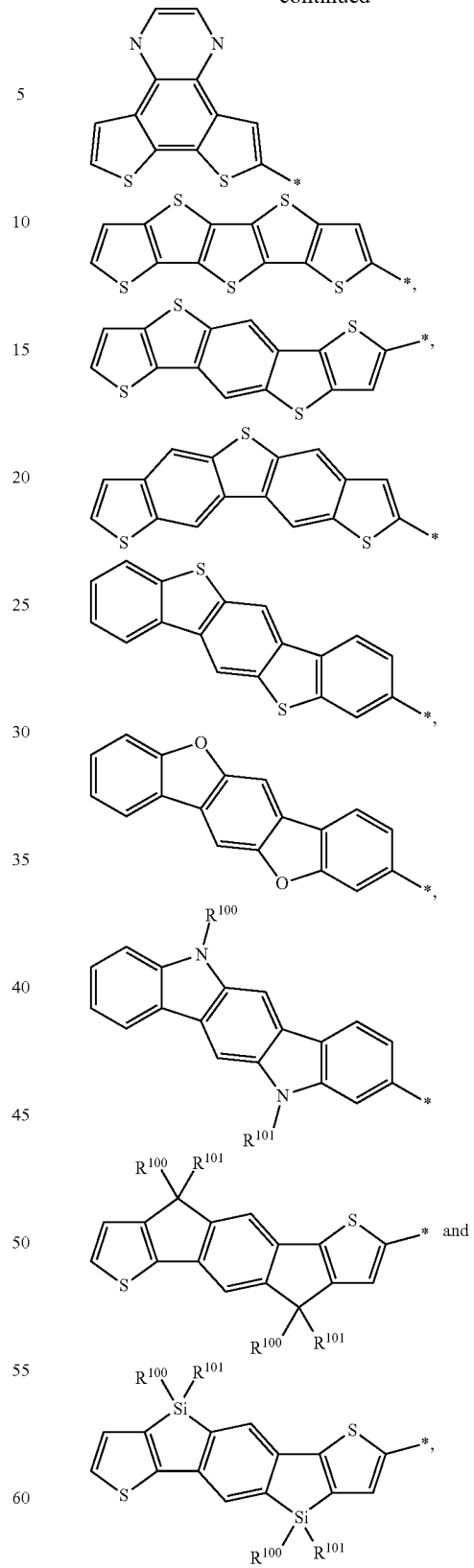
wherein $R^{100}$ and $R^{101}$ are independently and at each occurrence selected from the group consisting of H, $C_1$-$C_{20}$alkyl, $C_{2-20}$alkenyl, $C_{2-20}$alkynyl, $C_{5-8}$cycloalkyl, $C_{6-14}$aryl and $C_2$-$C_{20}$heteroaryl, or $R^{100}$ and $R^{101}$, if attached to the same atom, together with the atom, to which they are attached, form a 5 to 12 membered ring system. $C_2$-$C_{20}$heteroaryl may be optionally further substituted with one or more $C_1$-$C_{12}$alkyl, $C_1$-$C_{12}$alkoxy, or halogen, especially fluorine. $C_2$-$C_{20}$heteroaryl is preferably unsubstituted.

The 5 to 12 membered ring system can contain, in addition to the atom, to which $R^{100}$ and $R^{101}$, respectively are attached, ring members selected from the group consisting of $CH_2$, O, S and $NR^{102}$, werein $R^{102}$ is at each occurrence selected from the group consisting of H, $C_1$-$C_{10}$alkyl, $C_3$-$C_{10}$alkenyl and $C_3$-$C_{10}$alkynyl.

$C_7$-$C_{25}$aralkyl is typically benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted. Preferred examples are benzyl, 2-phenylethyl, 3-phenylpropyl, naphthylethyl, naphthylmethyl, and cumyl.

$C_1$-$C_{25}$alkoxy groups ($C_1$-$C_{12}$alkoxy groups) are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy.

The compounds of formula $X^3$—$[Ar^3]_c$—$[Ar^2]_b$—$[Ar^1]_a$—$Y(R^1)_{n1}(R^2)_{n2}$—$[Ar^{1'}]_{a'}$—$[Ar^{2'}]_{b'}$—$[Ar^{3'}]_{c'}$—$X^4$ (X) are new and form a further subject of the present invention, wherein a, a', b, b', c, c', Y, n1, n2, $Ar^2$, $Ar^{2'}$, $Ar^3$, $Ar^{3'}$, $R^1$ and $R^2$ are defined above, or below, $Ar^1$ and $A^{1'}$ are defined above, or below, $X^3$ and $X^4$ are independently of each other hydrogen, halogen, $ZnX^{12}$, —$SnR^{207}R^{208}R^{209}$, wherein $R^{207}$, $R^{208}$ and $R^{209}$ are identical or different and are H or $C_1$-$C_6$alkyl, wherein two radicals optionally form a common ring and these radicals are optionally branched or unbranched and $X^{12}$ is a halogen atom; or —OS(O)$_2$CF$_3$, —OS(O)$_2$-aryl, —OS(O)$_2$CH$_3$, —B(OH)$_2$, —B(OY$^1$)$_2$,

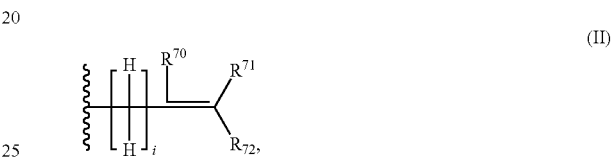

—BF$_4$Na, or —BF$_4$K, wherein $Y^1$ is independently in each occurrence a $C_1$-$C_{10}$alkyl group and $Y^2$ is independently in each occurrence an optionally substituted $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —C(CH$_3$)$_2$C(CH$_3$)$_2$—, —CH$_2$C(CH$_3$)$_2$CH$_2$—, or —C(CH$_3$)$_2$CH$_2$C(CH$_3$)$_2$—, and $Y^{13}$ and $Y^{14}$ are independently of each other hydrogen, or a $C_1$-$C_{10}$alkyl group.

In a preferred embodiment the present invention is directed to compounds of formula (X), wherein a is 0, 1, or 2; a' is 0, 1, or 2; b is 0, 1, or 2; b' is 0, 1, or 2; c is 0, 1, or 2; c' is 0, 1, or 2; more preferably a is 0, 1, or 2; a' is 0, 1 or 2; b is 0, or 1; b' is 0, or 1; c is 0, or 1; c' is 0, or 1; even more preferably a is 0, 1, or 2, a' is 0, 1 or 2; b is 0; b' is 0; c is 0; c' is 0; most preferably a is 0, or 1; a' is 0, or 1; b is 0; b' is 0; c is 0; c' is 0; with the proviso that if Y is IIIa, a and a' are not 0, $Y(R^1)_{n1}(R^2)_{n2}$ is a group of formula (IIIa), (IIIb), (IIIc), (IIId), (IIIe), (IIIf), (IIIg), (IIIh), or (IIIi), $Ar^1$ and $Ar^{1'}$ are independently of each other a group of formula XIa-1, XIa-2, XIa-4, XIb, XId, XIi, XIm, or XIz-1, $Ar^2$, $Ar^{2'}$, $Ar^3$ and $Ar^{3'}$ are independently of each other a group of formula XIa-1, XIa-2, XIa-4, XIb, XId, XIi, XIm, XIx-1, XIx-2, XIx-3, XIx-5, XIz-1, XIIIa, XIIIb-1, XIIIb-2, XIIIe, XIIIi-1, or XIIIj, $R^1$, $R^2$, $R^{1'}$ and $R^{2'}$ are independently of each other a group of formula

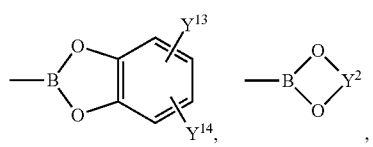

wherein i is an integer from 1 to 10; $R^{70}$, $R^{71}$ and $R^{72}$ are independently of each other hydrogen or $C_1$-$C_{50}$alkyl; with the proviso that at least one of the substituents $R^{70}$, $R^{71}$ and $R^{72}$ is different from hydrogen.

In a more preferred embodiment the present invention is directed to compounds of formula (X), wherein a is 0, 1, or 2; a' is 0, 1 or 2; b is 0, or 1; b' is 0, or 1; c is 0, or 1; c' is 0, or 1; preferably a is 0, 1, or 2, a' is 0, 1 or 2; b is 0; b' is 0; c is 0; c' is 0; more preferably a is 0, or 1; a' is 0, or 1; b is 0; b' is 0; c is 0; c' is 0; with the proviso that if Y is IIIa, a and a' are not 0, $Y(R^1)_{n1}(R^2)_{n2}$ is a group of formula (IIIa), (IIIb), (IIId), (IIIe), (IIIh), or (IIIi), $Ar^1$ and $Ar^{1'}$ are independently of each other a group of formula XIa-1, XIa-2, XIa-4, or XId, $Ar^2$, $Ar^{2'}$, $Ar^3$ and $Ar^{3'}$ are independently of each other a group of formula XIa-1, XIa-2, XIa-4, XId, or XIIIi-1, $R^1$, $R^2$, $R^{1'}$ and $R^{2'}$ are independently of each other a group of formula (II), wherein i is an integer from 1 to 10; $R^{70}$, $R^{71}$ and $R^{72}$ are independently of each other hydrogen or $C_1$-$C_{50}$alkyl; with the proviso that two of the substituents $R^{70}$, $R^{71}$ and $R^{72}$ are different from hydrogen.

In an even more preferred embodiment the present invention is directed to compounds of formula (X), wherein a is 0, 1, or 2; a' is 0, 1 or 2; b is 0; b' is 0; c is 0; c' is 0; preferably a is 0, or 1; a' is 0, or 1; b is 0; b' is 0; c is 0; c' is 0; with the proviso that if Y is IIIa, a and a' are not 0, $Y(R^1)_{n1}(R^2)_{n2}$ is a group of formula (IIIa), (IIIb), or (IIId), $Ar^1$ and $Ar^{1'}$ are independently of each other a group of formula XIa-1, or XIa-4, $Ar^2$, $Ar^{2'}$, $Ar^3$ and $Ar^{3'}$ are independently of each other a group of formula XIa-1, XIa-4, or XIIIi-1, $R^1$ and $R^2$ are independently of each other a group of formula (II), wherein i is an integer from 1 to 5; and $R^{70}$, $R^{71}$ and $R^{72}$ are independently of each other hydrogen or $C_1$-$C_{36}$alkyl; with the proviso that two of the substituents $R^{70}$, $R^{71}$ and $R^{72}$ are different from hydrogen. Halogen can be F, Cl, Br and I.

$X^3$ and $X^4$ are preferably hydrogen, or halogen, more preferably H, Cl, Br, or I, more preferably H, Br, or I, most preferred H, or Br.

Examples of the compound of formula (X) are shown below:
(I-1)
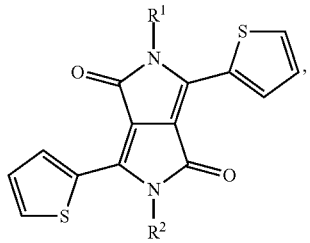
(I-2)
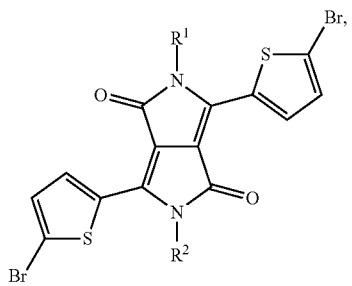
(I-3)
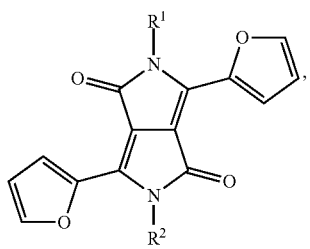
(I-4)
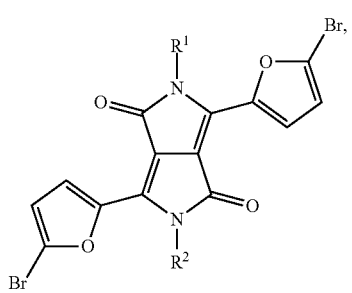
(I-5)
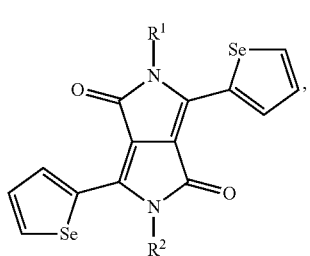
(I-6)
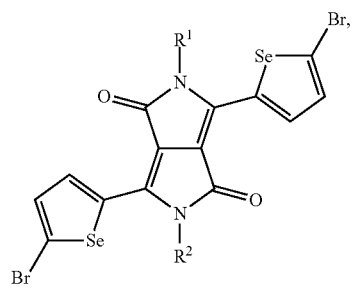
(I-7)
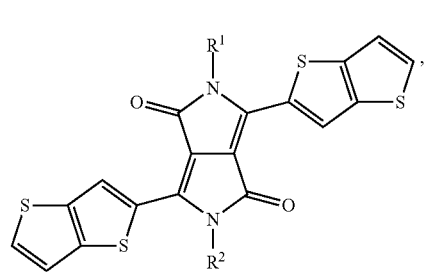
(I-8)
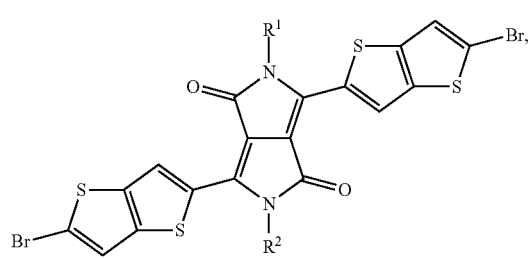
(I-9)
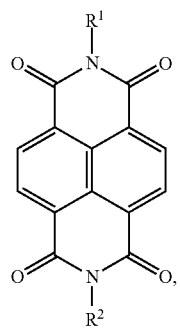
(I-10)

41
-continued
(I-11)
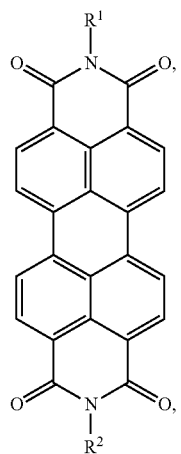
(I-12)
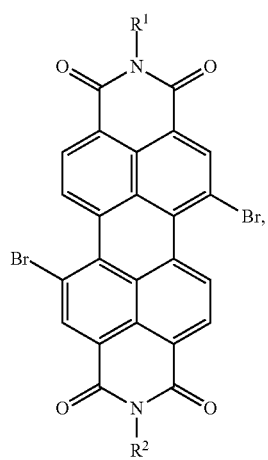
(I-13)
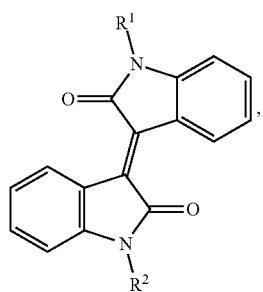
(I-14)
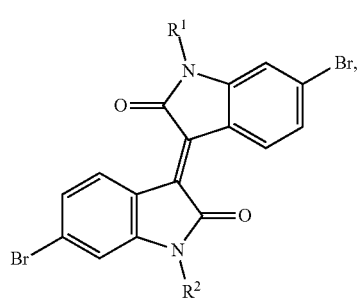
42
-continued
(I-15)
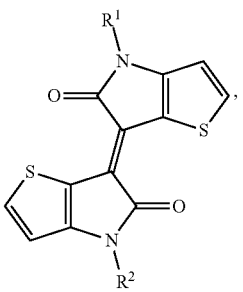
(I-16)
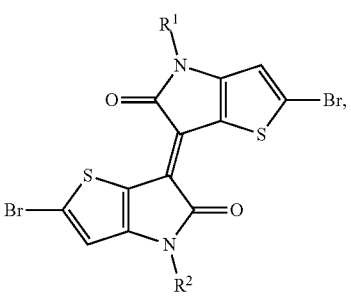
(I-17)
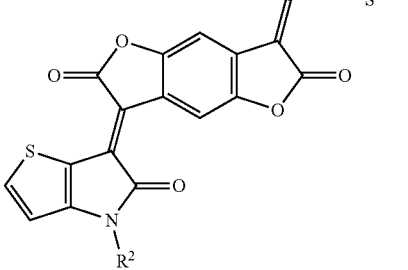
(I-18)
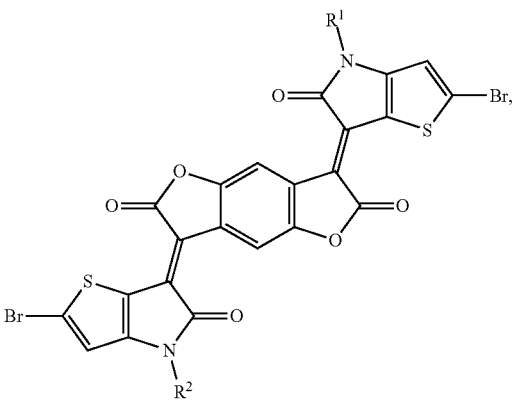

(I-19)
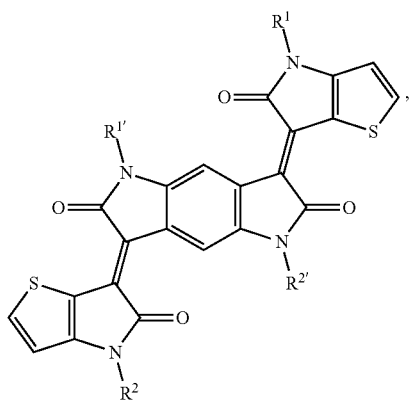

(I-20)
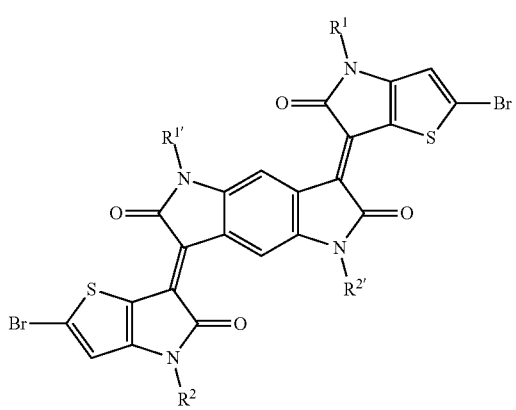

(I-21)
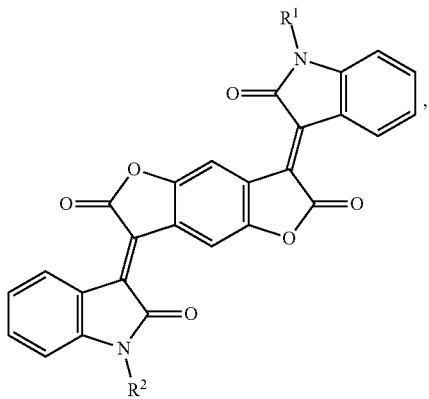

(I-22)
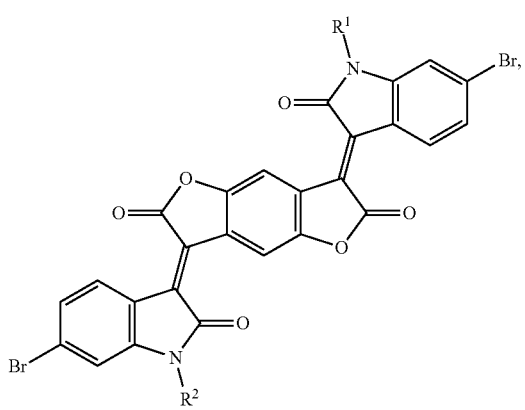

(I-23)
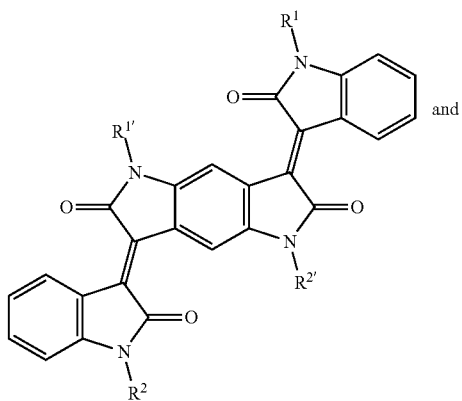

and (I-24)
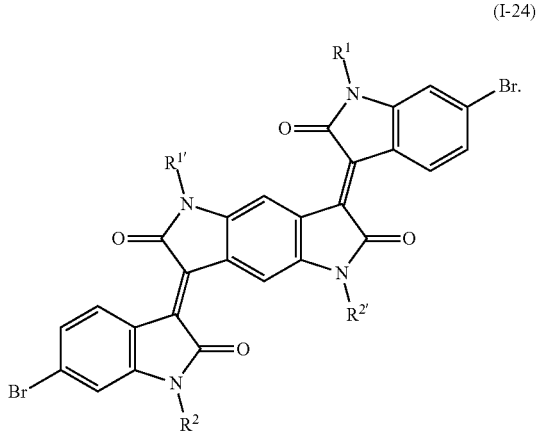

More preferred are compounds of the formula I-1, I-2, I-5, I-6, I-9, I-10, I-13, I-14, I-21, I-22, I-23 and I-24 and even more preferred are compounds of the formulae I-1, I-2, I-5, I-6, I-9, I-10, I-13 and I-14. Preferably, $R^1$, $R^2$, $R^{1'}$ and $R^{2'}$ are independently of each other a group of formula (II)
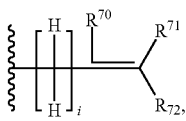

wherein i is an integer from 1 to 10; $R^{70}$, $R^{71}$ and $R^{72}$ are independently of each other hydrogen or $C_1$-$C_{50}$alkyl; with the proviso that at least one of the substituents $R^{70}$, $R^{71}$ and $R^{72}$ is different from hydrogen. More preferably, $R^1$, $R^2$, $R^{1'}$ and $R^{2'}$ are independently of each other a group of formula (II), wherein i is an integer from 1 to 10, especially 1 to 5; $R^{70}$, $R^{71}$ and $R^{72}$ are independently of each other hydrogen or $C_1$-$C_{50}$alkyl; with the proviso that two of the substituents $R^{70}$, $R^{71}$ and $R^{72}$ are different from hydrogen.

The synthesis of the compounds of formula (X) is described in more detail on basis of a compound where Y is a group of formula

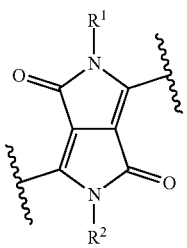

A compound of the formula

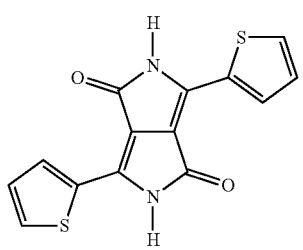

(IX)

may be transformed into a desired product of the formula

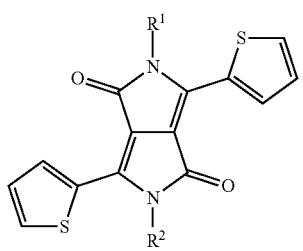

(X)

wherein $R^1$ and $R^2$ are independently of each other a group of formula (II) by N-alkylation by heating a mixture of a compound of formula IX and potassium carbonate in dimethyl formamide followed by addition of

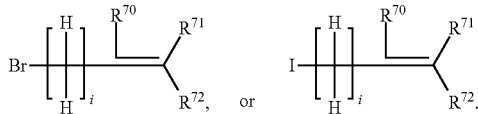

For example, a mixture of a compound of the formula (IX) in dimethylformamide is treated at room temperature with a suitable base, e.g. $K_2CO_3$. Thereafter, the iodide of the formula

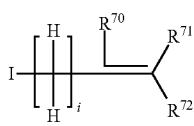

is added and the reaction mixture is heated to 50 to 100° C. for 2 to 24 h. The obtained compound can be further brominated in analogy to a procedure described in WO2009/047104 to obtain a compound of formula

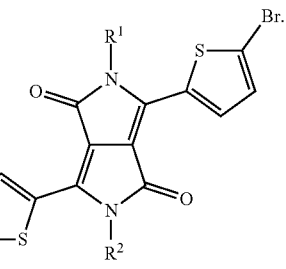

Alternatively, the compound of formula

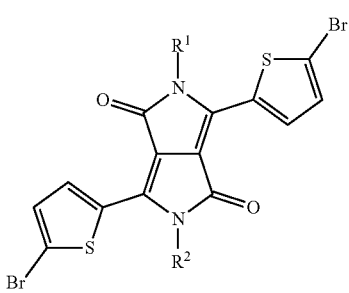

can be obtained from a compound of formula

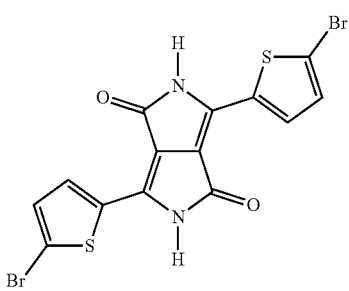 [SMILES: O=C1NC(c2ccc(Br)s2)=C2C(=O)NC(c3ccc(Br)s3)=C12]

by alkylation, for example, via a procedure described in US2014/0264184.

The preparation of the compounds of formula (IX) is, for example, described in WO2009/047104, or can be done in analogy to the methods described therein.

The compounds of formula

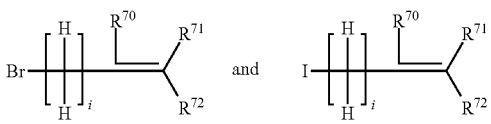

can be obtained, for example, by reacting a compound of formula

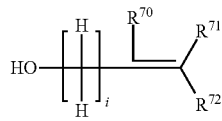

with N-bromosuccinimide, Br$_2$, or I$_2$ in a solvent, like dichloromethane, for example, in the presence of imidazole and/or triphenylphosphine.

The compound of formula

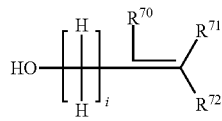

can be synthesized via the following route (Wittig reaction):

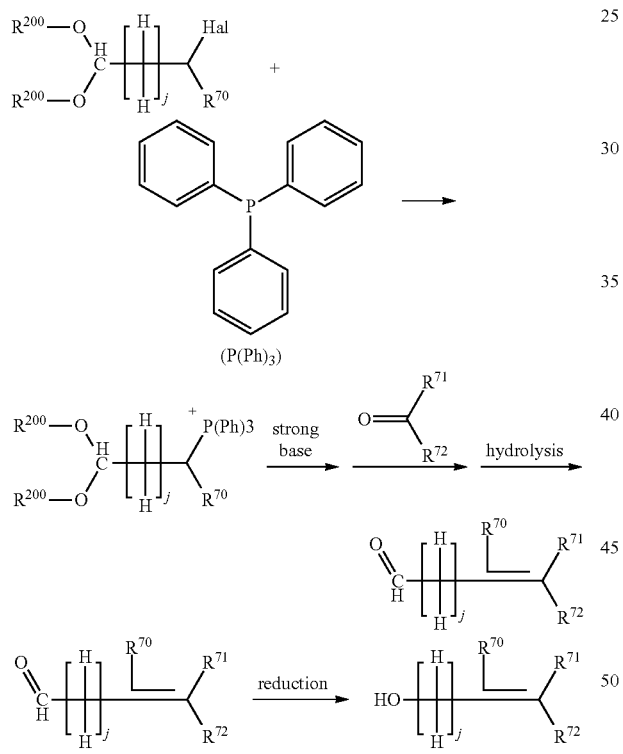

$R^{70}$ is preferably hydrogen and $R^{71}$ and $R^{72}$ are preferably $C_1$-$C_{36}$alkyl, j is i-1, $R^{200}$ is in each occurence $C_1$-$C_{12}$alkyl or both substituents $R^{200}$ together form a group —(CH$_2$)$_m$— and m is 2 to 4.

Alternatively, compounds of formula

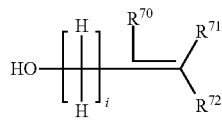

can be obtained by dehydration of a compound of formula

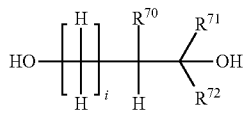

in a solvent, like toluene, in the presence of an acid, like p-toluenesulfonic, at elevated temperature, for example, at reflux temperature. If $R^{71}$ and/or $R^{72}$ contain α-hydrogens in relation to the carbon atom where $R^{71}$ and/or $R^{72}$ are attached, isomeric mixtures can be obtained. An example of the synthesis of an isomeric mixture is given below.

$R^{70}$ is preferably hydrogen and $R^{71}$ and $R^{72}$ are preferably $C_1$-$C_{36}$alkyl.

In case of the following dihydroxy compound

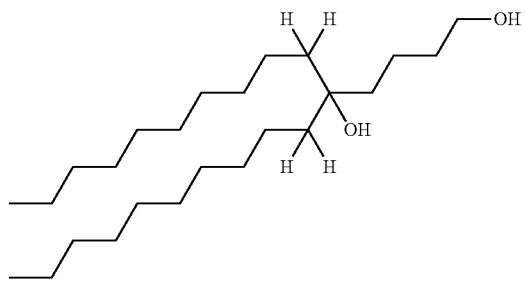 [SMILES: CCCCCCCCCCC(O)(CCCCO)CCCCCCCCCC]

the dehydration process may lead to the following three isomers:

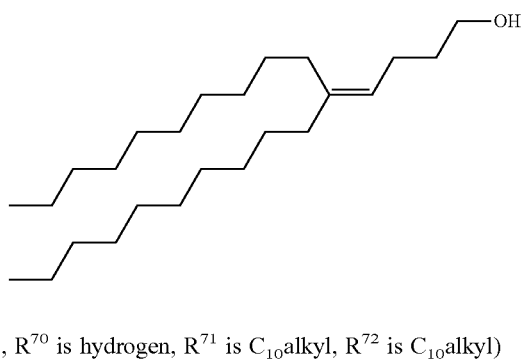

(i=3, $R^{70}$ is hydrogen, $R^{71}$ is $C_{10}$alkyl, $R^{72}$ is $C_{10}$alkyl)

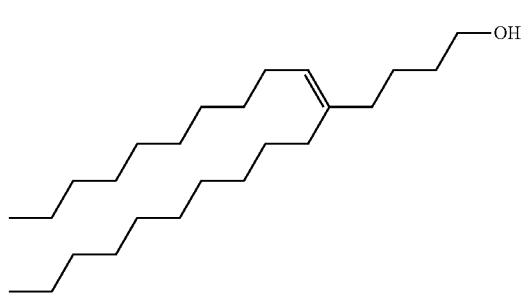 [SMILES: CCCCCCCCC/C=C(/CCCCO)CCCCCCCCCC]

(i=4, $R^{70}$ is $C_{10}$alkyl, $R^{71}$ is $C_9$alkyl, $R^{72}$ is hydrogen) and

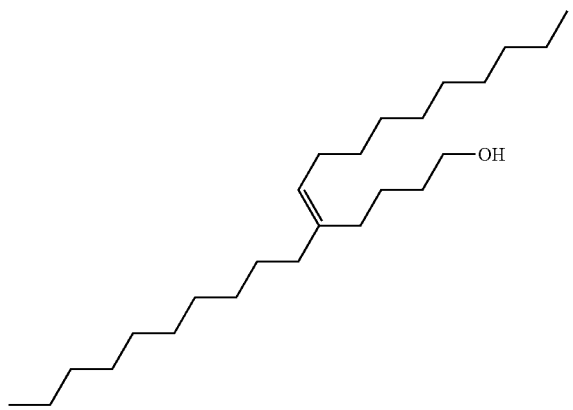 [SMILES: CCCCCCCCC/C=C(\CCCCO)CCCCCCCCCC]

(i=4, $R^{70}$ is $C_{10}$alkyl, $R^{71}$ is hydrogen, $R^{72}$ is $C_9$alkyl). Hence, all products derived from such an isomeric mixture may contain isomers. That is, the side chains, $R^1$, $R^2$, $R^{1'}$ and $R^{2'}$, may consist of different isomers.

The diols of formula

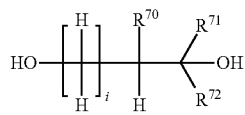

are commercially available, or can be produced, for example, in analogy to methods described in US2014/0011973 WO2007/091009, as shown in Example 1 of the present application.

Polymers made with monomers containing the group of formula (II) show high mobilities and high solubility which is important for printed electronic applications.

Polymers of formula -[[A]-[COM]$_{n3}$]n- (V'), can be obtained, for example, by the Suzuki reaction. The condensation reaction of di-boronate and a di-halogenide, especially a dibromide, commonly referred to as the "Suzuki reaction", is tolerant of the presence of a variety of organic functional groups as reported by N. Miyaura and A. Suzuki in Chemical Reviews, Vol. 95, pp. 457-2483 (1995).

To prepare polymers corresponding to formula -[[A]-[COM]$_{n3}$]n- (V'), dihalogenides corresponding to formula $X^{11'}$-A-$X^{11'}$ are reacted with diboronic acids, or diboronates corresponding to formula $X^{11}$-[COM]$_{n3}$-$X^{11}$; or diboronic acids, or diboronates corresponding to formula $X^{11}$-A-$X^{11}$ are reacted with dihalogenides of formula $X^{11'}$-[COM]$_{n3}$-$X^{11'}$, wherein $X^{11'}$ is independently in each occurrence Cl, Br, or I, and $X^{11}$ is independently in each occurrence —B(OH)$_2$, —B(OY$^1$)$_2$,

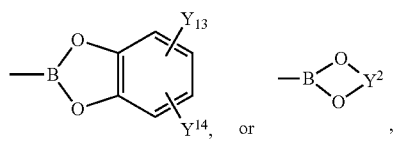

wherein $Y^1$ is independently in each occurrence a $C_1$-$C_{10}$alkyl group and $Y^2$ is independently in each occurrence a $C_2$-$C_{10}$alkylene group, such as —CY$^3$Y$^4$— CY$^5$Y$^6$—, or —CY$^7$Y$^8$—CY$^9$Y$^{10}$—CY$^{11}$Y$^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —C(CH$_3$)$_2$C(CH$_3$)$_2$—, —CH$_2$C(CH$_3$)$_2$CH$_2$—, or —C(CH$_3$)$_2$CH$_2$C(CH$_3$)$_2$—, and $Y^{13}$ and $Y^{14}$ are independently of each other hydrogen, or a $C_1$-$C_{10}$alkyl group, in a solvent and in the presence of a catalyst, such as, for example, under the catalytic action of Pd and triphenylphosphine.

Preferred catalysts are 2-dicyclohexylphosphino-2',6'-dialkoxybiphenyl/palladium(II) acetates, tri-alykl-phosphonium salts/palladium (0) derivatives and tri-alkylphosphine/palladium (0) derivatives. Especially preferred catalysts are 2-dicyclohexylphosphino-2',6'-di-methoxybiphenyl (sPhos)/palladium(II)acetate and, tri-tert-butylphosphonium tetrafluoroborate ((t-Bu)$_3$P*HBF$_4$)/tris(dibenzylideneacetone) dipalladium (0) (Pd$_2$(dba)$_3$) and tri-tert-butylphosphine (t-Bu)$_3$P/tris(dibenzylideneacetone) dipalladium (0) (Pd$_2$(dba)$_3$). The reaction is typically conducted at about 0° C. to 180° C. in an aromatic hydrocarbon solvent such as toluene, xylene. Other solvents such as dimethylformamide, dioxane, dimethoxyethan and tetrahydrofuran can also be used alone, or in mixtures with an aromatic hydrocarbon. An aqueous base, preferably sodium carbonate or bicarbonate, potassium phosphate, potassium carbonate or bicarbonate is used as activation agent for the boronic acid, boronate and as the HBr scavenger. A polymerization reaction may take 0.2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252. Control of molecular weight is possible by using either an excess of dibromide, diboronic acid, or diboronate, or a chain terminator.

A particularly preferred process is described in WO2010/136352. According to the process described in WO2010/136352 the polymerisation is carried out in presence of a) a catalyst/ligand system comprising a palladium catalyst and a specific organic phosphine, or phosphonium compound, b) a base, c) a solvent or a mixture of solvents. Preferred organic phosphines are selected from trisubstituted phosphines of formula (VI)

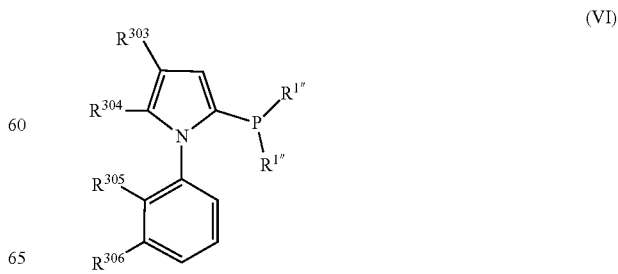

| Cpd. | R¹'' | $R^{305}$ | $R^{306}$ | $R^{303}$ | $R^{304}$ |
|---|---|---|---|---|---|
| A-1 | $H_3C$-C(CH$_3$)-CH$_3$ (tert-butyl) | H | H | H | H |
| A-2 | cyclohexyl | H | H | H | H |
| A-3 | phenyl | H | H | H | H |
| A-4 | adamantyl | H | H | H | H |
| A-5 | cyclohexyl | —OCH$_3$ | H | H | H |
| A-6 | cyclohexyl | 1) | 1) | H | H |
| A-7 | tert-butyl | 1) | 1) | H | H |
| A-8 | phenyl | 1) | 1) | H | H |
| A-9 | adamantyl | 1) | 1) | H | H |
| A-10 | cyclohexyl | H | H | 2) | 2) |
| A-11 | tert-butyl | H | H | 2) | 2) |
| A-12 | phenyl | H | H | 2) | 2) |
| A-13 | adamantyl | H | H | 2) | 2) |

1) $R^{305}$ and $R^{306}$ together form a ring 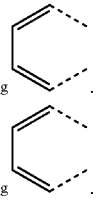

2) $R^{303}$ and $R^{304}$ together form a ring

Examples of preferred catalysts include the following compounds:

palladium(II) acetylacetonate, palladium(0) dibenzylidene-acetone complexes, palladium(II) propionate, Pd$_2$(dba)$_3$: [tris(dibenzylideneacetone) dipalladium(0)], Pd(dba)$_2$: [bis(dibenzylideneacetone) palladium(0)], Pd(PR$_3$)$_2$, wherein PR$_3$ is a trisubstituted phosphine of formula VI, Pd(OAc)$_2$: [palladium(II) acetate], palladium(II) chloride, palladium(II) bromide, lithium tetrachloropalladate(II), PdCl$_2$(PR$_3$)$_2$; wherein PR$_3$ is a trisubstituted phosphine of formula VI; palladium(0) diallyl ether complexes, palladium (II) nitrate, PdCl$_2$(PhCN)$_2$: [dichlorobis(benzonitrile) palladium(II)], PdCl$_2$(CH$_3$CN): [dichlorobis(acetonitrile) palladium(II)], and PdCl$_2$(COD): [dichloro(1,5-cyclooctadiene) palladium (II)].

Especially preferred are PdCl$_2$, Pd$_2$(dba)$_3$, Pd(dba)$_2$, Pd(OAc)$_2$, or Pd(PR$_3$)$_2$. Most preferred are Pd$_2$(dba)$_3$ and Pd(OAc)$_2$.

The palladium catalyst is present in the reaction mixture in catalytic amounts. The term "catalytic amount" refers to an amount that is clearly below one equivalent of the (hetero)aromatic compound(s), preferably 0.001 to 5 mol-%, most preferably 0.001 to 1 mol-%, based on the equivalents of the (hetero)aromatic compound(s) used.

The amount of phosphines or phosphonium salts in the reaction mixture is preferably from 0.001 to 10 mol-%, most preferably 0.01 to 5 mol-%, based on the equivalents of the (hetero)aromatic compound(s) used. The preferred ratio of Pd:phosphine is 1:4.

The base can be selected from all aqueous and nonaqueous bases and can be inorganic, or organic. It is preferable that at least 1.5 equivalents of said base per functional boron group is present in the reaction mixture. Suitable bases are, for example, alkali and alkaline earth metal hydroxides, carboxylates, carbonates, fluorides and phosphates such as sodium and potassium hydroxide, acetate, carbonate, fluoride and phosphate or also metal alcoholates. It is also possible to use a mixture of bases. The base is preferably a lithium salt, such as, for example, lithium alkoxides (such as, for example, lithium methoxide and lithium ethoxide), lithium hydroxide, carboxylate, carbonate, fluoride and/or phosphate.

The at present most preferred base is aqueous LiOHxH$_2$O (monohydrate of LiOH) and (waterfree) LiOH.

The reaction is typically conducted at about 0° C. to 180° C., preferably from 20 to 160° C., more preferably from 40 to 140° C. and most preferably from 40 to 120° C. A polymerization reaction may take 0.1 to 100 hours, especially 0.2 to 100 hours.

The solvent is for example selected from toluene, xylenes, anisole, THF, 2-methyltetrahydrofuran, dioxane, chlorobenzene, fluorobenzene or solvent mixtures comprising one or more solvents like e.g. THF/toluene and optionally water. Most preferred is THF, or THF/water.

In a preferred embodiment of the present invention the solvent is THF, the base is LiOH*H$_2$O and the reaction is conducted at reflux temperature of THF (about 65° C.).

Advantageously, the polymerisation is carried out in presence of a) palladium(II) acetate, or Pd$_2$(dba)$_3$, (tris(dibenzylideneacetone)dipalladium(0)) and an organic phosphine A-1 to A-13, b) LiOH, or LiOHxH$_2$O; and c) THF, and optionally water. If the monohydrate of LiOH is used, no water needs to be added.

Preferably the polymerization reaction is conducted under inert conditions in the absence of oxygen. Nitrogen and more preferably argon are used as inert gases.

The process described in WO2010/136352 is suitable for large-scale applications, is readily accessible and convert starting materials to the respective polymers in high yield, with high purity and high selectivity. If desired, a monofunctional aryl halide or aryl boronate may be used as a chain-terminator in such reactions, which will result in the formation of a terminal aryl group.

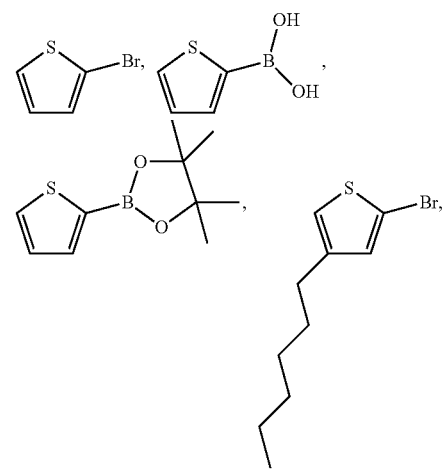

It is possible to control the sequencing of the monomeric units in the resulting copolymer by controlling the order and composition of monomer feeds in the Suzuki reaction.

Alternative preparation methods for the polymers of the present invention are illustrated in more detail below.

The polymers of the present invention can also be synthesized by the Stille coupling (see, for example, Babudri et al, J. Mater. Chem., 2004, 14, 11-34; J. K. Stille, Angew. Chemie Int. Ed. Engl. 1986, 25, 508).

To prepare polymers corresponding to formula -[[A]-[COM]$_{n3}$]n- (V'), dihalogenides of formula $X^{11'}$-A-X11' are reacted with compounds of formula $X^{21}$-[COM]$_{n3}$-$X^{21}$; or dihalogenides of formula $X^{11'}$-[COM]$_{n3}$-$X^{11'}$ are reacted with compounds of formula $X^{21}$-A-$X^{21}$, wherein $X^{21}$ is a group —SnR$^{207}$R$^{208}$ R$^{209}$ and $X^{11'}$ is as defined above, in an inert solvent at a temperature in range from 0° C. to 200° C. in the presence of a palladium-containing catalyst, wherein R$^{207}$, R$^{208}$ and R$^{209}$ are identical or different and are H or C$_1$-C$_6$alkyl, wherein two radicals optionally form a common ring and these radicals are optionally branched or unbranched. It must be ensured here that the totality of all monomers used has a highly balanced ratio of organotin functions to halogen functions. In addition, it may prove advantageous to remove any excess reactive groups at the end of the reaction by end-capping with monofunctional reagents. In order to carry out the process, the tin compounds and the halogen compounds are preferably introduced into one or more inert organic solvents and stirred at a temperature of from 0 to 200° C., preferably from 30 to 170° C. for a period from 1 hour to 200 hours, preferably from 5 hours to 150 hours. The crude product can be purified by methods known to the person skilled in the art and appropriate for the respective polymer, for example, Soxhlet extraction, repeated re-precipitation or even by dialysis.

Suitable organic solvents for the process described are, for example, ethers, for example diethyl ether, dimethoxyethane, diethylene glycol dimethyl ether, tetrahydrofuran, dioxane, dioxolane, diisopropyl ether and tert-butyl methyl ether, hydrocarbons, for example hexane, isohexane, heptane, cyclohexane, benzene, toluene and xylene, alcohols, for example methanol, ethanol, 1-propanol, 2-propanol, ethylene glycol, 1-butanol, 2-butanol and tert-butanol, ketones, for example acetone, ethyl methyl ketone and isobutyl methyl ketone, amides, for example dimethylformamide (DMF), dimethylacetamide and N-methylpyrrolidone, nitriles, for example acetonitrile, propionitrile and butyronitrile, and mixtures thereof.

The palladium and phosphine components should be selected analogously to the description for the Suzuki variant.

Alternatively, the polymers of the present invention can also be synthesized by the Negishi reaction using zinc reagents A-(ZnX$^{22}$)$_2$, wherein X$^{22}$ is halogen and halides, and [COM]$_{n3}$-(X$^{23}$)$_2$, wherein X$^{23}$ is halogen or triflate, or using [COM]$_{n3}$-(X$^{22}$)$_2$, and A-(ZnX$^{23}$)$_2$. Reference is, for example, made to E. Negishi et al., Heterocycles 18 (1982) 117-22.

Alternatively, the polymers of the present invention can also be synthesized by the Hiyama reaction using organosilicon reagents A-(SiR$^{210}$R$^{211}$R$^{212}$)$_2$, wherein R$^{210}$, R$^{211}$ and R$^{212}$ are identical or different and are halogen, or C$_1$-C$_6$alkyl, and [COM]$_{n3}$-(X$^{23}$)$_2$, wherein X$^{23}$ is halogen or triflate, or using A-(X$^{23}$)$_2$ and [COM]$_{n3}$-(SiR$^{210}$R$^{211}$R$^{212}$)$_2$. Reference is, for example, made to T. Hiyama et al., Pure Appl. Chem. 66 (1994) 1471-1478 and T. Hiyama et al., Synlett (1991) 845-853.

Alternatively, the polymers of the present invention can also be synthesized by a direct arylation polymerization method described in Macromolecules 2015, 48, 6978-6986.

In another embodiment the present invention is directed to homopolymers of the type (A)$_n$. Homopolymers of the type (A)$_n$ can be obtained via Yamamoto coupling of dihalides $X^{11'}$-A-$X^{11'}$, where $X^{11'}$ is halogen, especially Cl, Br, or I, very especially Br. Alternatively homopolymers of the type (A)$_n$ can be obtained via oxidative polymerization of units $X^{11'}$-A-$X^{11'}$, where $X^{11'}$ is hydrogen, e.g. with FeCl$_3$ as oxidizing agent.

A mixture containing a polymer of the present invention results in a semi-conducting layer comprising a polymer of the present invention (typically 5% to 99.9999% by weight, especially 20 to 85% by weight) and at least another material. The other material can be, but is not restricted to a fraction of the same polymer of the present invention with different molecular weight, another polymer of the present invention, a semi-conducting polymer, organic small molecules, carbon nanotubes, a fullerene derivative, inorganic particles (quantum dots, quantum rods, quantum tripods, $TiO_2$, ZnO etc.), conductive particles (Au, Ag etc.), insulator materials like the ones described for the gate dielectric (PET, PS etc.). The polymers of the present invention can be blended with small molecules described, for example, in WO2009/047104, WO2010108873, WO09/047104, U.S. Pat. No. 6,690,029, WO2007082584, and WO2008107089.

The polymer can contain a small molecule, or a mixture of two, or more small molecule compounds.

Accordingly, the present invention also relates to an organic semiconductor material, layer or component, comprising a polymer according to the present invention.

The polymers of the invention can be used as the semiconductor layer in semiconductor devices. Accordingly, the present invention also relates to semiconductor devices, comprising a polymer of the present invention, or an organic semiconductor material, layer or component. The semiconductor device is especially an organic photovoltaic (PV) device (solar cell), a photodiode, or an organic field effect transistor.

The polymers of the invention can be used alone or in combination as the organic semiconductor layer of the semiconductor device. The layer can be provided by any useful means, such as, for example, vapor deposition (for materials with relatively low molecular weight) and printing techniques. The compounds of the invention may be sufficiently soluble in organic solvents and can be solution deposited and patterned (for example, by spin coating, dip coating, ink jet printing, gravure printing, blading, slot die coating, spraying, flexo printing, offset printing, screen printing, microcontact (wave)-printing, drop or zone casting, or other known techniques).

The polymers of the invention can be used in integrated circuits comprising a plurality of OTFTs, as well as in various electronic articles. Such articles include, for example, radio-frequency identification (RFID) tags, backplanes for flexible displays (for use in, for example, personal computers, cell phones, or handheld devices), smart cards, medical devices, memory devices, sensors (e.g. light-, image-, bio-, chemo-, mechanical- or temperature sensors), especially photodiodes, or security devices and the like.

The polymers of the present invention are typically used as organic semiconductors in form of thin organic layers or films, preferably less than 30 microns thick. Typically the semiconducting layer of the present invention is at most 1 micron (=1 µm) thick, although it may be thicker if required. For various electronic device applications, the thickness may also be less than about 1 micron thick. For example, for use in an OFET the layer thickness may typically be 100 nm or less. The exact thickness of the layer will depend, for example, upon the requirements of the electronic device in which the layer is used.

For example, the active semiconductor channel between the drain and source in an OFET may comprise a polymer of the present invention. OFETs have been described in the literature in many different architectures and specifications known to the person skilled in the art. Reference is made to all these OFETs, replacing their semiconducting material in part or completely with a semiconducting material of the present application.

Typically, an organic field effect transistor comprises a dielectric layer, a semiconducting layer and a substrate. In addition, an organic field effect transistor usually comprises a gate electrode and source/drain electrodes.

An OFET device according to the present invention preferably comprises:
a source electrode,
a drain electrode,
a gate electrode,
a semiconducting layer,
one or more gate insulator layers, and
optionally a substrate, wherein the semiconductor layer comprises one or more polymers of the present invention.

The semiconducting layer can have a thickness of 5 to 500 nm, preferably of 10 to 100 nm, more preferably of 20 to 50 nm.

The insulator layer comprises a dielectric material. The dielectric material can be silicon dioxide or aluminium oxide, or, an organic polymer such as polystyrene (PS), poly(methylmethacrylate) (PMMA), poly(4-vinylphenol) (PVP), poly(vinyl alcohol) (PVA), benzocyclobutene (BCB), or polyimide (PI). The insulator layer can have a thickness of 10 to 2000 nm, preferably of 50 to 1000 nm, more preferably of 100 to 800 nm.

The insulator layer can in addition to the dielectric material comprise a self-assembled monolayer of organic silane derivates or organic phosphoric acid derivatives. An example of an organic silane derivative is octyltrichlorosilane. An example of an organic phosphoric acid derivative is octyldecylphosphoric acid. The self-assembled monolayer comprised in the insulator layer is usually in contact with the semiconducting layer.

The source/drain electrodes can be made from any suitable organic or inorganic source/drain material. Examples of inorganic source/drain materials are gold (Au), silver (Ag) or copper (Cu), as well as alloys comprising at least one of these metals. The source/drain electrodes can have a thickness of 1 to 100 nm, preferably from 20 to 70 nm.

The gate electrode can be made from any suitable gate material such as highly doped silicon, aluminium (Al), tungsten (W), indium tin oxide or gold (Au), or alloys comprising at least one of these metals. The gate electrode can have a thickness of 1 to 200 nm, preferably from 5 to 100 nm.

The substrate can be any suitable substrate such as glass, or a plastic substrate such as polyethersulfone, polycarbonate, polysulfone, polyethylene terephthalate (PET) and polyethylene naphthalate (PEN). Depending on the design of the organic field effect transistor, the gate electrode, for example highly doped silicon can also function as substrate.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably, the OFET comprises an insulator having a first side and a second side, a gate electrode located on the first side of the insulator, a layer comprising a polymer of the present invention located on the second side of the insulator, and a drain electrode and a source electrode located on the polymer layer.

The OFET device can be a top gate device or a bottom gate device.

Suitable structures and manufacturing methods of an OFET device are known to the person skilled in the art and are described in the literature, for example in WO03/052841.

The semiconducting layer comprising a polymer of the present invention may additionally comprise at least another material. The other material can be, but is not restricted to another polymer of the present invention, a semi-conducting polymer, a polymeric binder, organic small molecules different from a polymer of the present invention, carbon nanotubes, especially semiconducting carbon nanotubes, a fullerene derivative, inorganic particles (quantum dots, quantum rods, quantum tripods, $TiO_2$, ZnO etc.), conductive particles (Au, Ag etc.), and insulator materials like the ones described for the gate dielectric (PET, PS etc.). As stated above, the semiconductive layer can also be composed of a mixture of one or more polymers of the present invention and a polymeric binder. The ratio of the polymers of the present invention to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA). With this technique, a degradation of the electrical performance can be avoided (cf. WO2008/001123A1).

The polymers of the present invention are advantageously used in organic photovoltaic (PV) devices (solar cells). Accordingly, the invention provides PV devices comprising a polymer according to the present invention. A device of this construction will also have rectifying properties so may also be termed a photodiode. Photoresponsive devices have application as solar cells which generate electricity from light and as photodetectors which measure or detect light.

The PV device comprise in this order:
(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the polymers of the present invention. Preferably, the photoactive layer is made of a conjugated polymer of the present invention, as an electron donor and an acceptor material, like a fullerene, particularly a functionalized fullerene PCBM, as an electron acceptor. As stated above, the photoactive layer may also contain a polymeric binder. The ratio of the polymers of formula (I) to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA).

For heterojunction solar cells the active layer comprises preferably a mixture of a polymer of the present invention and a fullerene, such as [60]PCBM (=6,6-phenyl-$C_{61}$-butyric acid methyl ester), or [70]PCBM, in a weight ratio of 1:1 to 1:3. The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$-$C_{1000}$. Preferably, the fullerene is selected from the range of $C_{60}$ to $C_{96}$. Most preferably the fullerene is $C_{60}$ or $C_{70}$, such as [60]PCBM, or [70]PCBM. It is also permissible to utilize chemically modified fullerenes, provided that the modified fullerene retains acceptor-type and electron mobility characteristics. The acceptor material can also be a material selected from the group consisting of any semi-conducting polymer, such as, for example, a polymer of the present invention, provided that the polymers retain acceptor-type and electron mobility characteristics, organic small molecules, carbon nanotubes, inorganic particles (quantum dots, quantum rods, quantum tripods, $TiO_2$, ZnO etc.).

The photoactive layer is made of a polymer of the present invention as an electron donor and a fullerene, particularly functionalized fullerene PCBM, as an electron acceptor. These two components are mixed with a solvent and applied as a solution onto the smoothing layer by, for example, the spin-coating method, the drop casting method, the Langmuir-Blodgett ("LB") method, the ink jet printing method and the dripping method. A squeegee or printing method could also be used to coat larger surfaces with such a photoactive layer. Instead of toluene, which is typical, a dispersion agent such as chlorobenzene is preferably used as a solvent. Among these methods, the vacuum deposition method, the spin-coating method, the ink jet printing method and the casting method are particularly preferred in view of ease of operation and cost.

In the case of forming the layer by using the spin-coating method, the casting method and ink jet printing method, the coating can be carried out using a solution and/or dispersion prepared by dissolving, or dispersing the composition in a concentration of from 0.01 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide, chlorobenzene, 1,2-dichlorobenzene and mixtures thereof.

The photovoltaic (PV) device can also consist of multiple junction solar cells that are processed on top of each other in order to absorb more of the solar spectrum. Such structures are, for example, described in App. Phys. Let. 90, 143512 (2007), Adv. Funct. Mater. 16, 1897-1903 (2006) and WO2004/112161.

The PV device can also be processed on a fiber as described, for example, in US20070079867 and US 20060013549.

The following examples are included for illustrative purposes only and do not limit the scope of the claims. Unless otherwise stated, all parts and percentages are by weight.

Weight-average molecular weight (Mw) and polydispersity (Mw/Mn=PD) are determined by High Temperature Gel Permeation Chromatography (HT-GPC) [Apparatus: GPC PL 220 from Polymer laboratories (Church Stretton, UK; now Varian) yielding the responses from refractive index (RI), Chromatographic conditions: Column: 3 "PLgel Olexis" column from Polymer Laboratories (Church Stretton, UK); with an average particle size of 13 ìm (dimensions 300×8 mm I.D.) Mobile phase: 1,2,4-trichlorobenzene purified by vacuum distillation and stabilised by butylhydroxytoluene (BHT, 200 mg/l), Chromatographic temperature: 150° C.; Mobile phase flow: 1 ml/min; Solute concentration: about 1 mg/ml; Injection volume: 200 ìl; Detection: RI, Procedure of molecular weight calibration: Relative calibration is done by use of a set of 10 polystyrene calibration standards obtained from Polymer Laboratories (Church Stretton, UK) spanning the molecular weight range from 1'930'000 Da-5'050 Da, i. e., PS 1'930'000, PS 1'460'000, PS 1'075'000, PS 560'000, PS 330'000, PS 96'000, PS 52'000, PS 30'300, PS 10'100, PS 5'050 Da. A polynomic calibration is used to calculate the molecular weight.

All polymer structures given in the examples below are idealized representations of the polymer products obtained via the polymerization procedures described. If more than two components are copolymerized with each other sequences in the polymers can be either alternating or random depending on the polymerisation conditions. All experiments are carried out in protective gas atmosphere. The percentages and ratios mentioned in the examples below—unless stated otherwise—are % by weight and weight ratios.

EXAMPLES

Example 1 a) Synthesis of the Diol 1

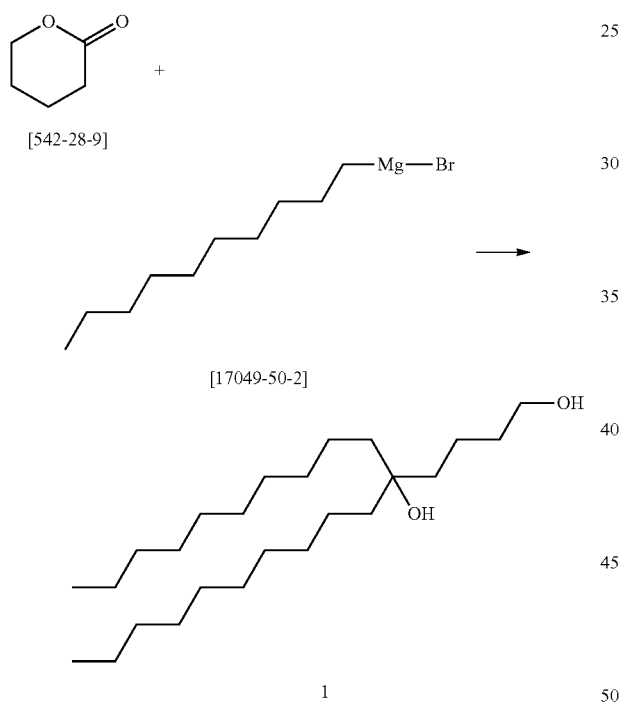

4.55 g of δ-valerolactone [542-28-9] dissolved in 45 ml of diethylether are added under stirring dropwise to 100 ml of a 1 M Grignard-solution of decyl-magnesium-bromide (in diethylether) [17049-50-2] at room temperature. The reaction mixture is then refluxed over night. The reaction mixture is then cooled to 0° C. and carefully quenched by the addition of 100 ml water, followed by the addition of 200 ml of saturated ammonium chloride solution. The layers are separated and the aqueous layer is once more extracted with ethylacetate. The combined organic layers are washed with brine and water, and are then dried over MgSO$_4$. After filtration and evaporation of the solvents, crude diol 1 is obtained. The crude material is used directly in the next step. $^1$H-NMR data (ppm, CDCl$_3$) correspond: 3.66 2H t, 1.63-1.52 2H m, 1.52-1.38 6H m, 1.38-1.20 34H m, 0.90 6H t.

b) Synthesis of the Olefinic Alcohol 2 Via Dehydration

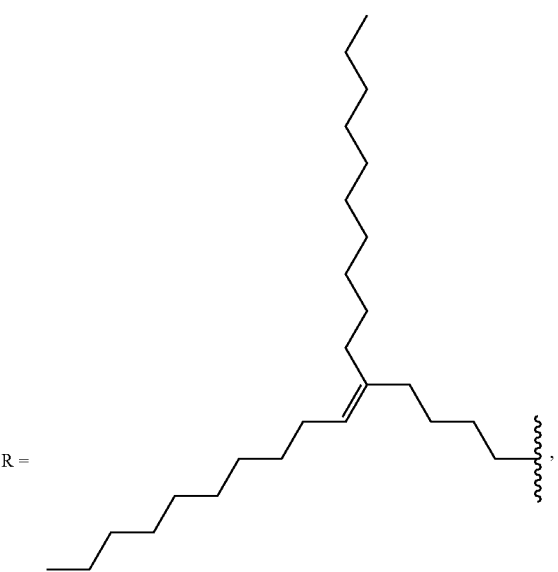

20.5 g of the crude diol 1 is dissolved in 350 ml of toluene. 0.39 g of para-toluenesulfonic acid are added and the reaction mixture is refluxed over night in a water separator. The reaction mixture is then cooled to room temperature and washed with water. The organic phase is dried over MgSO$_4$ and filtered and the solvent is evaporated to give the crude colorless olefinic compound 2 as isomeric mixture. The crude material is used directly in the next step. $^1$H-NMR data (ppm, CDCl$_3$) correspond: 5.14 1H broad t, 3.66 2H t, 2.08-1.94 6H m, 1.68-1.55 2H m, 1.55-1.22 32H m, 0.91 6H t;

For the dehydration product only one possible isomer is drawn. Different possible isomers can be obtained during this dehydration process, where all isomers form a mixture 2 containing different R—OH, wherein

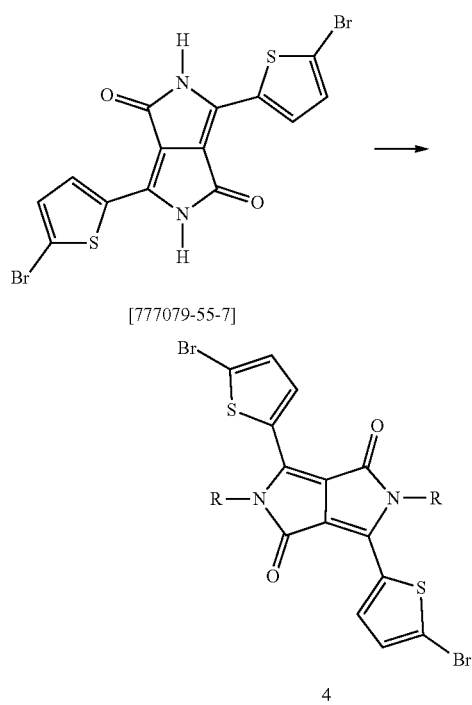

[777079-55-7]

d) Synthesis of the Alkylated DPP 4

6.14 g of the DPP-pigment [777079-55-7] is suspended in 150 ml dry dimethylformamide together with 5.56 g of K$_2$CO$_3$ under nitrogen. Then 16 g of crude compound mixture 3 are added and the mixture is heated to 90° C. and stirred overnight. After cooling 200 ml of water are added and the product is extracted with toluene. The toluene phase is washed with water, dried over MgSO$_4$, filtered and evaporated to give crude compound 4 as isomeric mixture. The product is purified via column chromatography over silica gel, to remove e.g. mono-alkylated product. $^1$H-NMR data 300 MHz (ppm, CDCl$_3$): 8.71 2H d, 7.25 2H d, 5.19-5.10 2H m, 4.01 4H t, 2.19-1.95 12H m, 1.85-1.22 68H m, 0.90 12H t; mass spectrum corresponds.

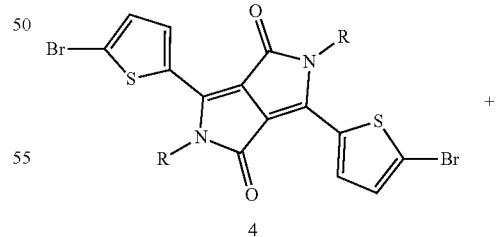

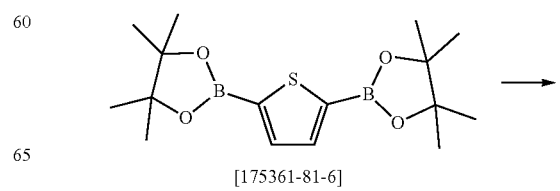

[175361-81-6]

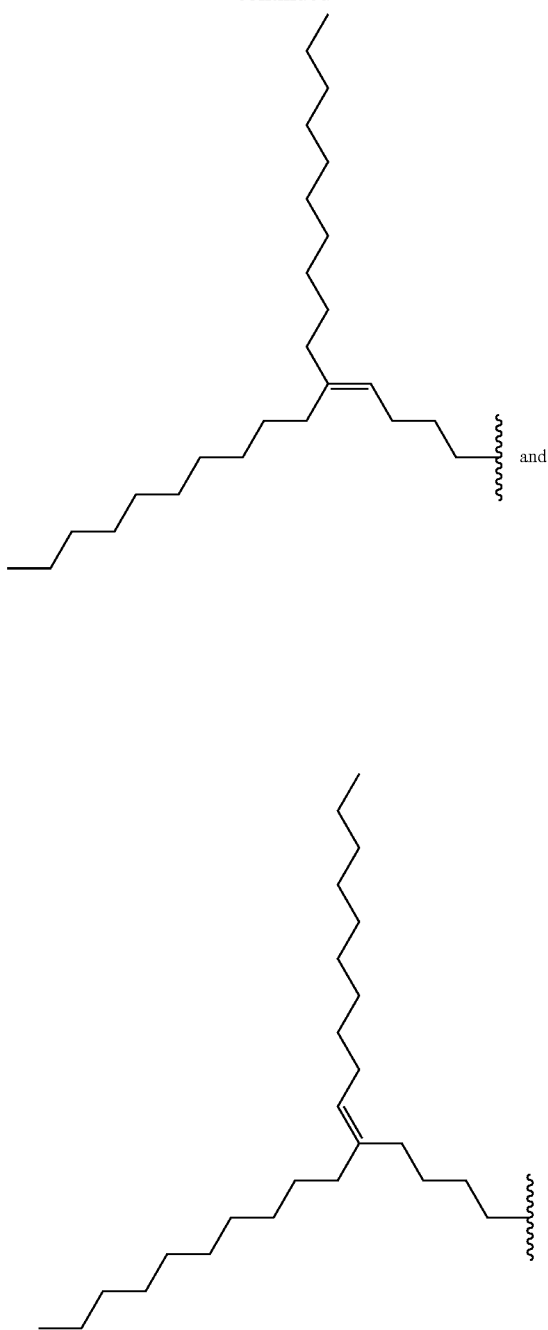

c) Synthesis of the Olefinic Alkylating Agent 3

4.01 g of imidazole and 15.45 g of triphenylphosphine are dissolved in 200 ml of dichloromethane under argon and cooled to 0° C. Then 14.95 g of iodine are added. After stirring for 15 minutes, 18 g of compound 2 is added. The temperature is then rised to room temperature and the mixture is stirred for 4 hours. The dichloromethane is evaporated and the reminder is filtered with heptane over a silica plug. After the removal of the heptane, crude compound 3 is obtained as isomeric mixture R-I. The crude material is used directly in the next step.

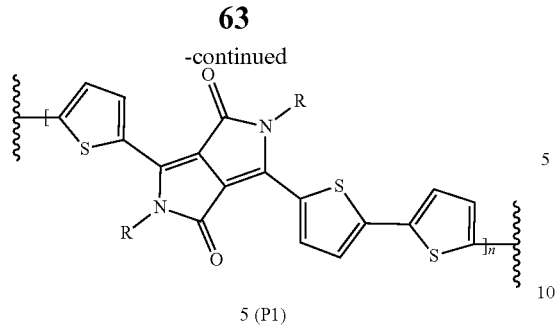

5 (P1)

e) Co-Polymerization of DPP 4 to the Polymer 5

1 g of DPP compound 4 and 291 mf of the boronicacidester [175361-81-6] are mixed together with 7.8 mg of palladium(II)acetat, 46.7 mg 2-(di-tert-butylphosphino)-1-phenylindol [740815-37-6] and 217.9 mg LiOH.H$_2$O in 15 ml of degassed tetrahydrofuran under argon. The whole reaction mixture is stirred and the temperature rised to reflux temperature. The reaction mixture is refluxed for 1.5 hours. The reaction mixture is then cooled to room temperature and 40 ml of a water-methanol mixture is added to precipitate the polymer of structure 5 (P1). The mixture is filtered and the residual polymer is washed with water and dryed. The polymer is then extracted in a Soxhlet equipment with heptane, and then tetrahydrofuran. The tetrahydrofuran fraction is analyzed by high temperature GPC (1,2,4-trichlorobenzene at 150° C.). Mw is 31'056 g/mol, PDI is 1.76.

Application Example 1

Fabrication and Electrical Characterization of an Organic Field-Effect Transistor (OFET) Based on Compound P1

Preparation of Back-Contact, Top-Gate FETs

Compound P1 is dissolved at a concentration of 0.75 wt % in dichlorobenzene and subsequently coated onto a PET-substrate with lithographically prepatterned gold contacts, serving as source and drain contact of the FET. 100 μl of the formulation is coated by a standard blade coater yielding a homogenous layer of the semiconductor over the entire substrate. After the coating is completed, the substrate is immediately transferred onto a preheated hotplate and heated for 30 s at 90° C. Next the gate dielectric layer consisting of polystyrene 4 wt % dissolved in PGMEA is spincoated on top of the organic semiconductor (2500 rpm, 30 s). After spincoating, the substrate is again transferred to the hotplate and annealed for another 5 Min at 100° C. The thickness of the dielectric layer is 430 nm measured by profilometer. Finally 50 nm thick shadow-mask patterned gold gate electrodes are deposited by vacuum evaporation to complete FETs in the BCTG-configuration.

Electrical Characterization

FIG. 1 show representative transfer characteristics of an FET fabricated from compound P1 with $V_{GS}$=10 V to −30 V at 0.5V step size with $V_{DS}$=−30V. Drain current (black solid curve), Gate current (dotted grey curve), Square root of drain current (grey solid curve), and fitted slope of square root (dashed black curve).

The mobility μ is calculated from the root representation of the transfer characteristic curve (solid grey curve) calculated in the saturation region. The slope m is determined from the dashed black line in FIG. 1. The dashed black line in FIG. 1 is fitted to a region of the square root representation of the drain current ID such that a good correlation to the linear slope of the root representation is obtained.

The threshold voltage $U_{Th}$ can be taken from the intersection of black dashed line in FIG. 1 with the X-axis portion ($V_{GS}$).

In order to calculate the electrical properties of the OFET, the following equations are employed:

$$\mu = \frac{m^2 * 2L}{C_G * W} \quad C_G = \varepsilon_0 * \varepsilon_r \frac{1}{d} \quad U_{Th} = -1 * \frac{m}{b} \quad ON/OFF = \frac{I_D \max}{I_D \min}$$

where $\varepsilon_0$ is the vacuum permittivity of 8.85×10$^{-12}$ As/Vm. $\varepsilon_r$=2.6 for polystyrene and d=430 nm is the thickness of the dielectric. With the channel length L=200 μm and the channel width W=4000 μm.

The following mobilities, threshold voltage and ON/OFF ratio have been calculated for the respective compound from an average of 4 TFTs:

| Compound | Field-effect mobility μ [cm$^2$/Vs] | Threshold voltage $U_{TH}$ [V] | ON/OFF ratio |
|---|---|---|---|
| P1 | 0.18 | −0.6 | 3.6E4 |

The invention claimed is:

1. A polymer, comprising a repeating unit of formula (I):

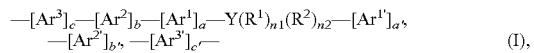

(I), wherein
a is 0, 1, 2, or 3;
a' is 0, 1, 2, or 3;
b is 0, 1, 2, or 3;
b' is 0, 1, 2, or 3;
c is 0, 1, 2, or 3;
c' is 0, 1, 2, or 3;
n1 is 1, or 2;
n2 is 1, or 2;
Y is a bivalent heterocyclic group, or ring system, which may optionally be substituted;
Ar$^1$, Ar$^{1'}$, Ar$^2$, Ar$^{2'}$, Ar$^3$ and Ar$^{3'}$ are independently of each other a C$_6$-C$_{24}$arylen group, which can optionally be substituted, or a C$_2$-C$_{20}$heteroarylen group, which can optionally be substituted;
R$^1$ and R$^2$ in each occurrence are independently of each other hydrogen, C$_5$-C$_{12}$cycloalkyl, COR$^{38}$, C$_1$-C$_{50}$alkyl, C$_3$-C$_{50}$alkenyl, or C$_3$-C$_{50}$alkynyl, which can optionally be substituted one or more times with C$_1$-C$_{12}$alkoxy, halogen, C$_5$-C$_8$cycloalkyl, cyano, C$_6$-C$_{24}$aryl, C$_2$-C$_{20}$heteroaryl, or a silyl group; and/or can optionally be further interrupted by one or more —O—, —S—, —NR$^{39}$—, —CONR$^{39}$—, —NR$^{39}$CO—, —COO—, —CO—, or —OCO—, or a group of formula:

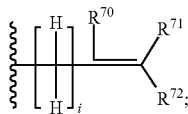

(II)

i is an integer from 1 to 18;

R$^{70}$, R$^{71}$ and R$^{72}$ are independently of each other hydrogen, C$_1$-C$_{50}$alkyl, C$_5$-C$_{12}$cycloalkyl, C$_6$-C$_{24}$aryl, C$_2$-C$_{20}$heteroaryl, C$_2$-C$_{50}$alkenyl or C$_2$-C$_{50}$alkynyl which can optionally be substituted one or more times with C$_1$-C$_{12}$alkoxy, halogen (especially F), C$_5$-C$_8$cycloalkyl, cyano, C$_6$-C$_{24}$aryl, C$_2$-C$_{20}$heteroaryl, or a silyl group; and/or can optionally be further interrupted by one or more —O—, —S—, —NR$^{39}$—, —CONR$^{39}$—, —NR$^{39}$CO—, —COO—, —CO—, or —OCO—; with the proviso that at least one of the substituents R$^{70}$, R$^{71}$ and R$^{72}$ is different from hydrogen;

R$^{38}$ is C$_1$-C$_{50}$alkyl, C$_2$-C$_{50}$alkenyl, C$_2$-C$_{50}$alkynyl or C$_1$-C$_{50}$alkoxy, which can optionally be substituted one or more times with C$_1$-C$_{12}$alkoxy, halogen, C$_5$-C$_8$cycloalkyl, cyano, C$_6$-C$_{24}$aryl, C$_2$-C$_{20}$heteroaryl, or a silyl group; and/or can optionally be further interrupted by one or more —O—, —S—, —NR$^{39}$—, —CONR$^{39}$—, —NR$^{39}$CO—, —COO—, —CO—, or —OCO—; and R$^{39}$ is hydrogen, C$_1$-C$_{25}$alkyl, C$_1$-C$_{18}$haloalkyl, C$_7$-C$_{25}$arylalkyl, or C$_1$-C$_{18}$alkanoyl, with the proviso that at least one of R$^1$ and R$^2$ is a group of formula (II).

2. The polymer according to claim 1, wherein —Y(R$^1$)$_{n1}$(R$^2$)$_{n2}$— is a group of formula:

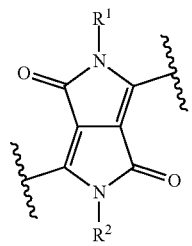

(IIIa)

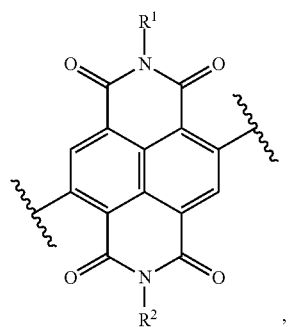

(IIIb)

-continued

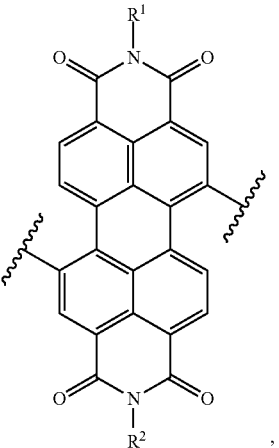

(IIIc)

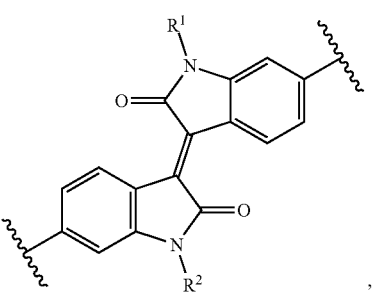

(IIId)

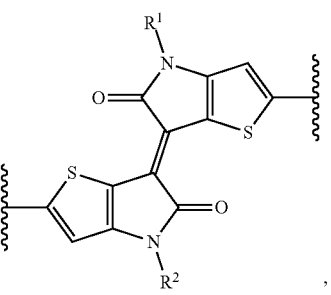

(IIIe)

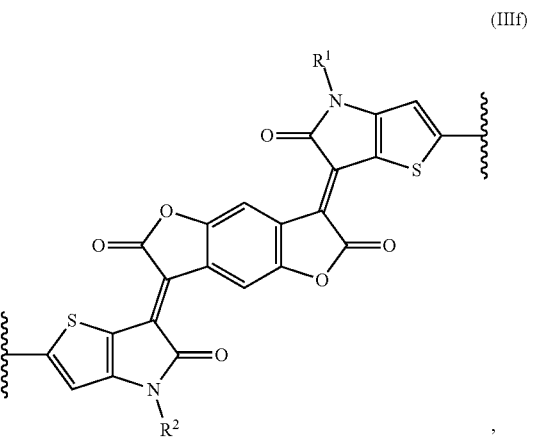

(IIIf)

-continued
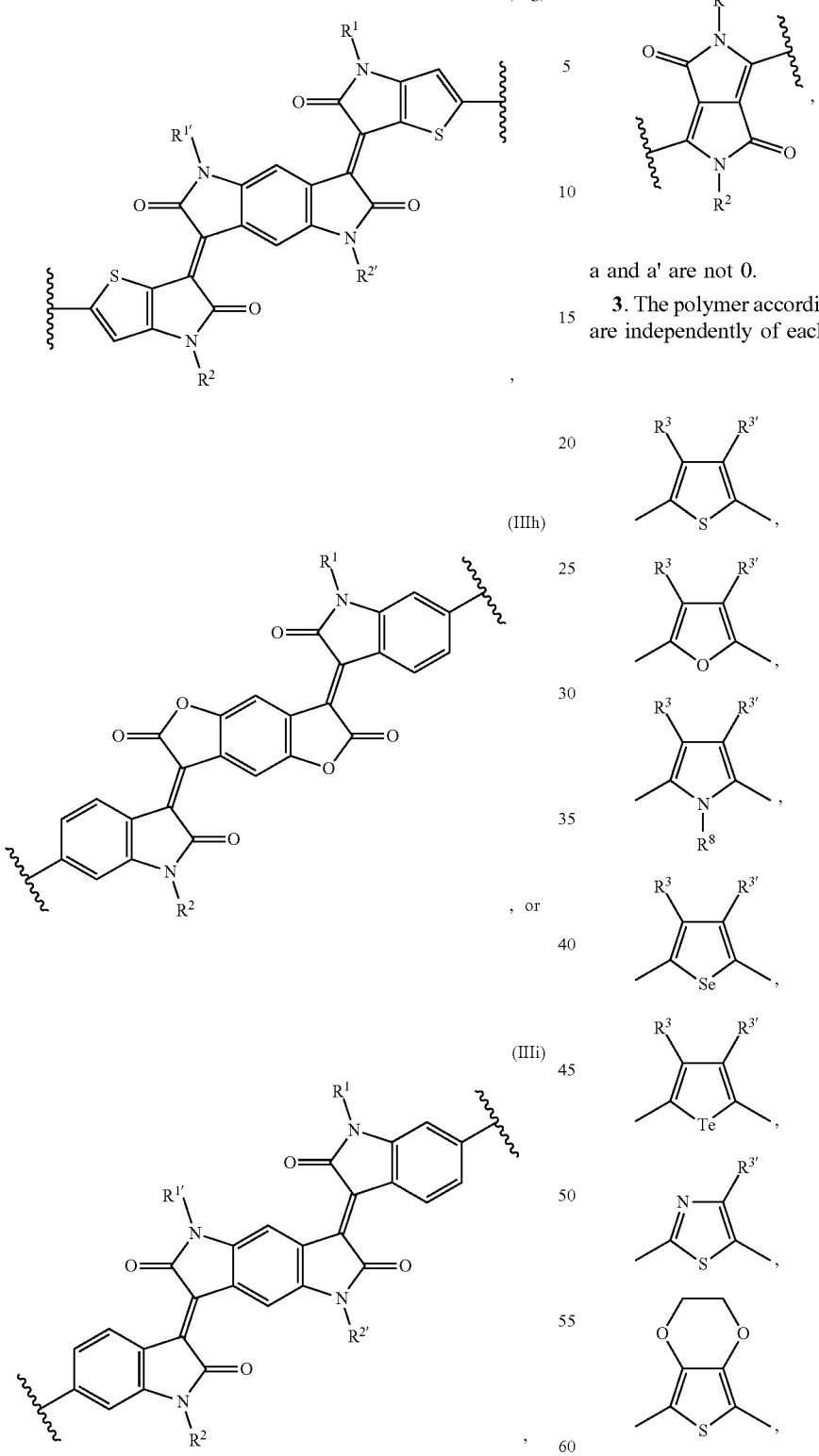
which may optionally be substituted,
wherein:
R$^1$ and R$^2$ are defined in claim 1; and
R$^{1'}$ and R$^{2'}$ have the meaning of with the proviso that in case —Y(R$^1$)$_{n1}$(R$^2$)$_{n2}$— is a group of formula:
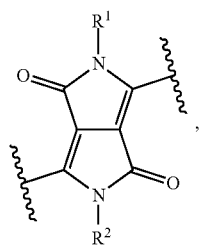
a and a' are not 0.
3. The polymer according to claim 1, wherein Ar$^1$ and Ar$^{1'}$ are independently of each other a group of formula
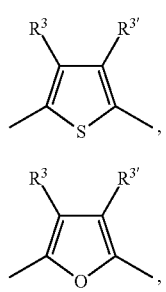
(XIa-1)
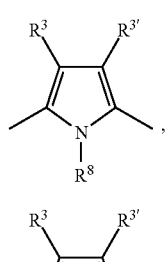
(XIa-2)
(XIa-3)
(XIa-4)
(XIa-5)
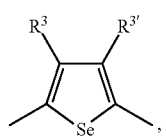
(XIb)
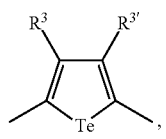
(XIc-1)
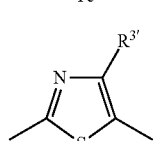
(XIc-2)
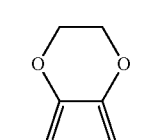
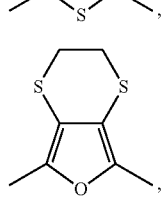

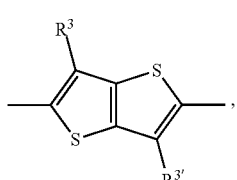 (XId)
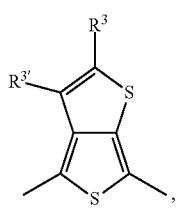 (XIe-1)
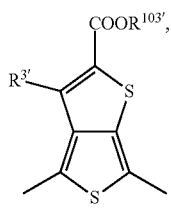 (XIe-2)
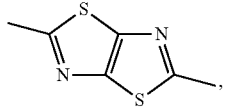 (XIf)
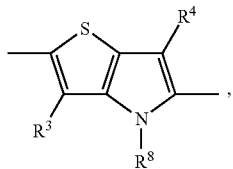 (XIg)
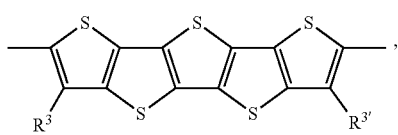 (XIh)
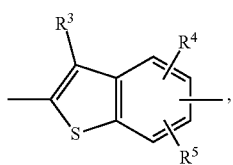 (XIi)
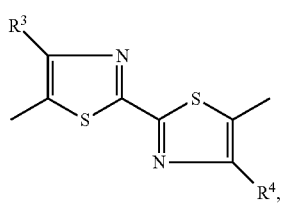 (XIj)
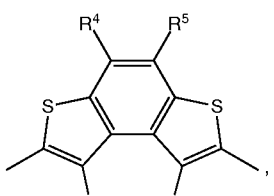 (XIk)
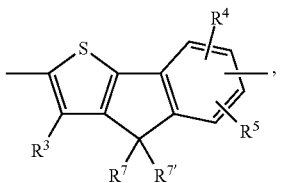 (XIl)
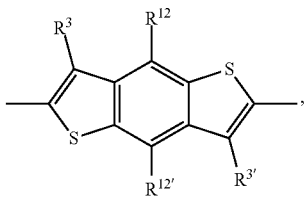 (XIm)
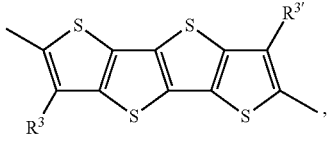 (XIn)
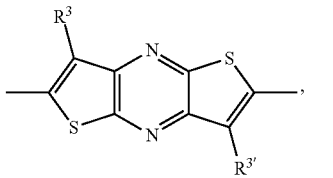 (XIo)
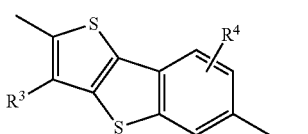 (XIp)
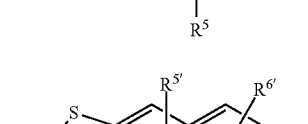 (XIq)
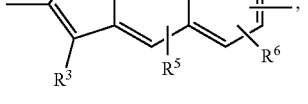 (XIr)

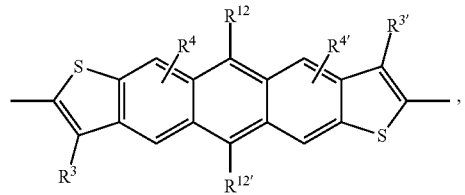
(XIs)
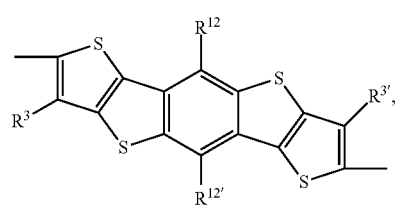
(XIt)
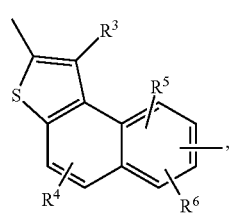
(XIu-1)
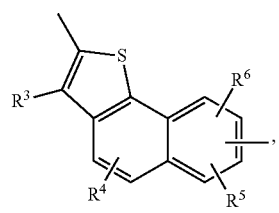
(XIu-2)
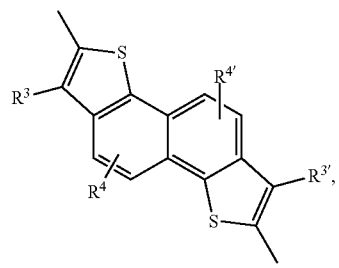
(XIv-1)
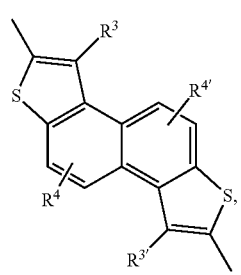
(XIv-2)
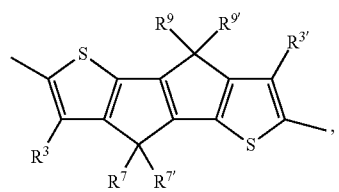
(XIw)
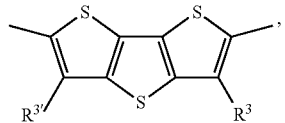
(XIx-1)
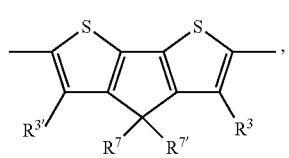
(XIx-2)
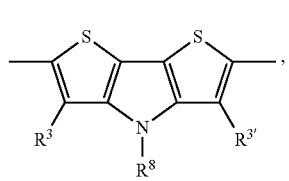
(XIx-3)
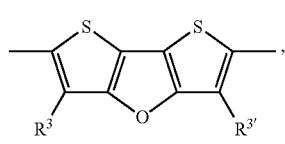
(XIx-4)
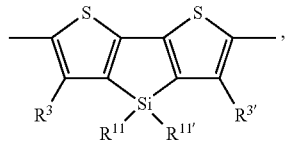
(XIx-5)
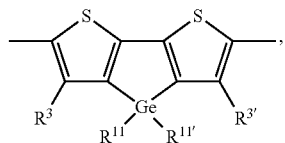
(XIx-6)
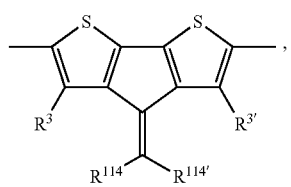
(XIx-7)
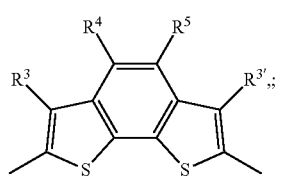
(XIx-8)
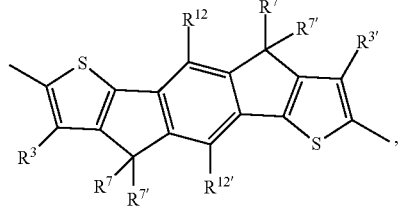
(XIy-1)

-continued

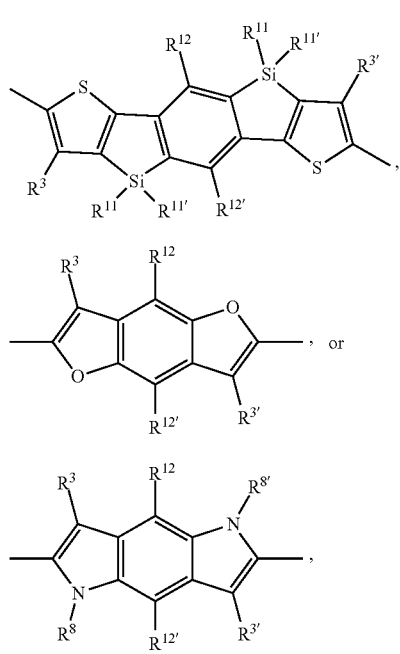
(XIy-2)

(XIz-1)

(XIz-2)

wherein:
R³ and R³' are independently of each other hydrogen, halogen, halogenated $C_1$-$C_{25}$alkyl, especially $CF_3$, cyano, $C_1$-$C_{25}$alkyl, especially $C_3$-$C_{25}$alkyl, which may optionally be interrupted by one or more oxygen or sulphur atoms; $C_7$-$C_{25}$arylalkyl, or $C_1$-$C_{25}$alkoxy;

$R^4$, $R^{4'}$, $R^5$, $R^{5'}$, $R^6$ and $R^{6'}$ are independently of each other hydrogen, halogen, halogenated $C_1$-$C_{25}$alkyl, especially $CF_3$, cyano, $C_1$-$C_{25}$alkyl, especially $C_3$-$C_{25}$alkyl, which may optionally be interrupted by one or more oxygen or sulphur atoms; $C_7$-$C_{25}$arylalkyl, or $C_1$-$C_{25}$alkoxy;

$R^7$, $R^{7'}$, $R^9$ and $R^{9'}$ are independently of each other hydrogen, $C_1$-$C_{25}$alkyl, especially $C_3$-$C_{25}$alkyl, which may optionally be interrupted by one, or more oxygen, or sulphur atoms; or $C_7$-$C_{25}$arylalkyl, $R^8$ and $R^{8'}$ are independently of each other hydrogen, $C_6$-$C_{18}$aryl; $C_6$-$C_{18}$aryl which is substituted by $C_1$-$C_{25}$alkyl, or $C_1$-$C_{25}$alkoxy, or $C_1$-$C_{25}$alkyl, especially $C_3$-$C_{25}$alkyl, which may optionally be interrupted by one or more oxygen or sulphur atoms; or $C_7$-$C_{25}$arylalkyl, $R^{11}$ and $R^{11'}$ are independently of each other $C_1$-$C_{25}$alkyl group, especially a $C_1$-$C_8$alkyl group, $C_7$-$C_{25}$arylalkyl, or a phenyl group, which can be substituted one to three times with $C_1$-$C_8$alkyl and/or $C_1$-$C_8$alkoxy;

$R^{12}$ and $R^{12'}$ are independently of each other hydrogen, halogen, cyano, $C_1$-$C_{25}$alkyl, especially $C_3$-$C_{25}$alkyl, which may optionally be interrupted by one, or more oxygen, or sulphur atoms, $C_1$-$C_{25}$alkoxy, $C_7$-$C_{25}$arylalkyl, or $R^{13}$;

$R^{13}$ is a $C_1$-$C_{10}$alkyl group, or a tri($C_1$-$C_8$alkyl)silyl group;

$R^{103'}$ is $C_1$-$C_{25}$alkyl, especially $C_3$-$C_{25}$alkyl, which may optionally be interrupted by one, or more oxygen, or sulphur atoms; and $R^{114}$ and $R^{114'}$ are independently of each other hydrogen, cyano, $COOR^{103'}$, a $C_1$-$C_{25}$alkyl group, or $C_6$-$C_{14}$aryl or $C_2$-$C_{20}$heteroaryl.

4. The polymer according to claim 3, wherein:
$Ar^2$, $Ar^{2'}$, $Ar^3$ and $Ar^{3'}$ have independently of each other the meaning of $Ar^1$;
$Ar^1$ is defined in claim 3, or are independently of each other

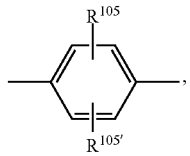
(XIIIa)

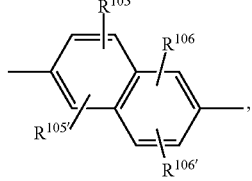
(XIIIb-1)

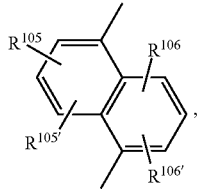
(XIIIb-2)

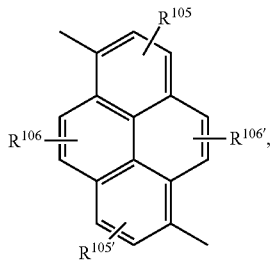
(XIIIc-1)

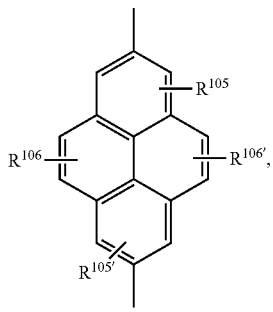
(XIIIc-2)

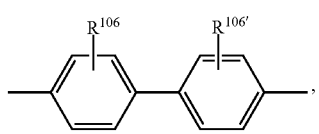
(XIIId)

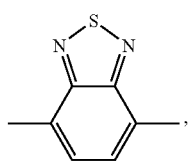
(XIIIe)

-continued (XIIIf)
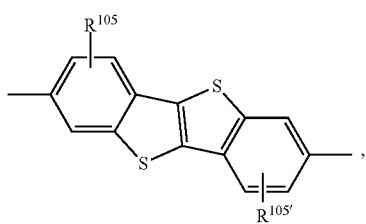

(XIIIg-1)
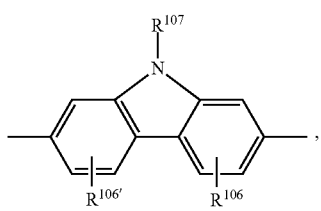

(XIIIg-2)
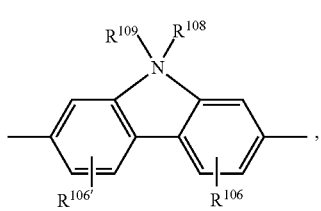

(XIIIg-3)
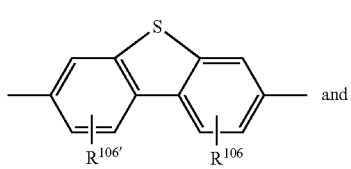 and (XIIIg-4)
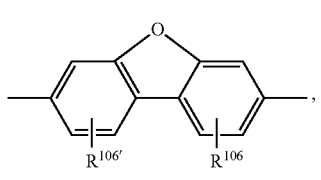

(XIIIh-1)
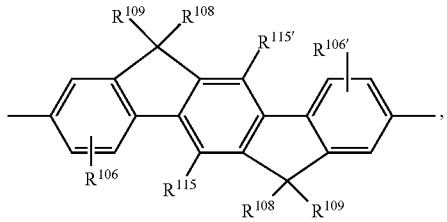

(XIIIh-2)
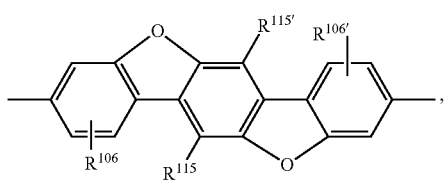

(XIIIh-3)
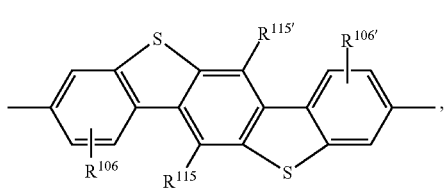

-continued (XIIIi-1)
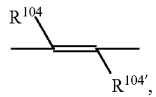

(XIIIi-2)
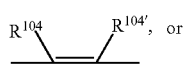, or (XIIIj)

$R^{104}$ and $R^{104'}$ are independently of each other hydrogen, cyano, COOR$^{103}$, a C$_1$-C$_{25}$alkyl group, or C$_6$-C$_{14}$aryl or C$_2$-C$_{20}$heteroaryl;

$R^{105}$, $R^{105'}$, $R^{106}$ and $R^{106'}$ are independently of each other hydrogen, halogen, cyano, C$_1$-C$_{25}$alkyl, which may optionally be interrupted by one or more oxygen or sulphur atoms; C$_7$-C$_{25}$arylalkyl, or C$_1$-C$_{25}$alkoxy;

$R^{107}$ is hydrogen, C$_7$-C$_{25}$arylalkyl, C$_6$-C$_{20}$aryl; C$_6$-C$_{20}$aryl which is substituted by C$_1$-C$_{25}$alkyl, or C$_1$-C$_{25}$alkoxy; C$_1$-C$_{18}$perfluoroalkyl; C$_1$-C$_{25}$alkyl; especially C$_3$-C$_{25}$alkyl, which may be interrupted by —O—, or —S—; or —COOR$^{103}$; wherein R$^{103}$ is C$_1$-C$_{25}$alkyl, especially C$_3$-C$_{25}$alkyl, which may optionally be interrupted by one, or more oxygen, or sulphur atoms;

$R^{108}$ and $R^{109}$ are independently of each other hydrogen, C$_1$-C$_{25}$alkyl, especially C$_3$-C$_{25}$alkyl, which may optionally be interrupted by one, or more oxygen, or sulphur atoms; or C$_7$-C$_2$arylalkyl;

$R^{115}$ and $R^{115'}$ are independently of each other hydrogen, halogen, cyano, C$_1$-C$_{25}$alkyl, especially C$_3$-C$_{25}$alkyl, which may optionally be interrupted by one, or more oxygen, or sulphur atoms, C$_1$-C$_{25}$alkoxy, C$_7$-C$_2$arylalkyl, or

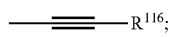

and $R^{116}$ is a C$_1$-C$_{10}$alkyl group, or a tri(C$_1$-C$_8$alkyl)silyl group.

5. The polymer according to claim 2, comprising a repeating unit of formula (Ia)
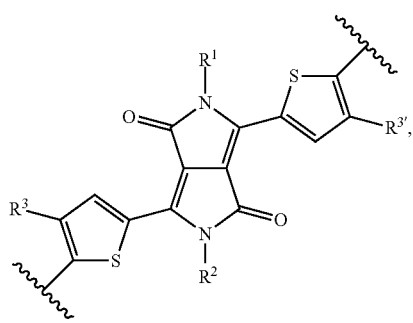

-continued
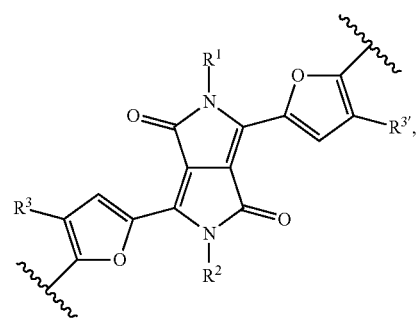
(Ib)
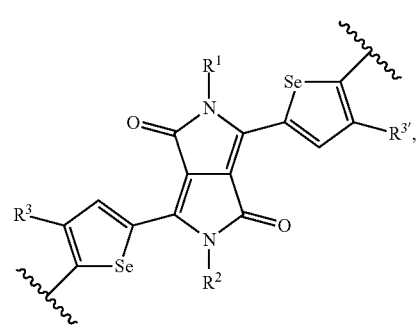
(Ic)
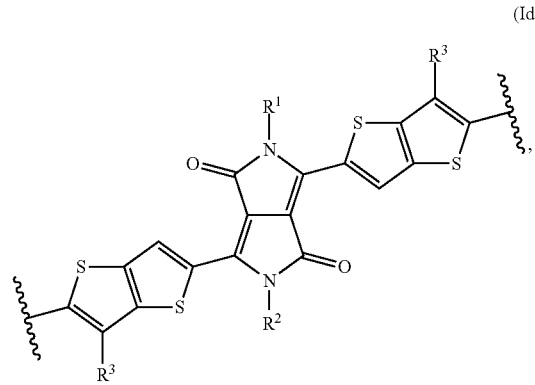
(Id)
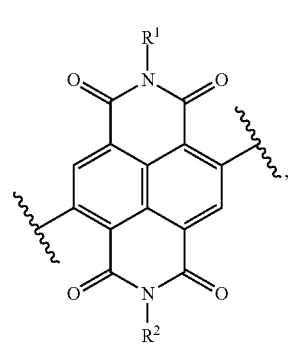
(Ie)
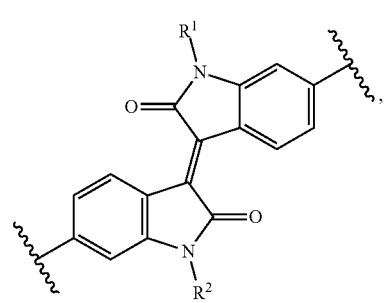
(If)
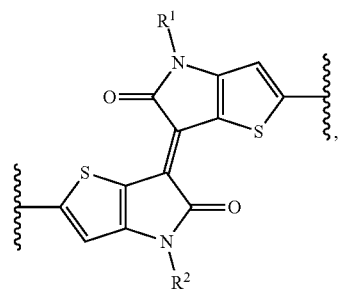
(Ig)
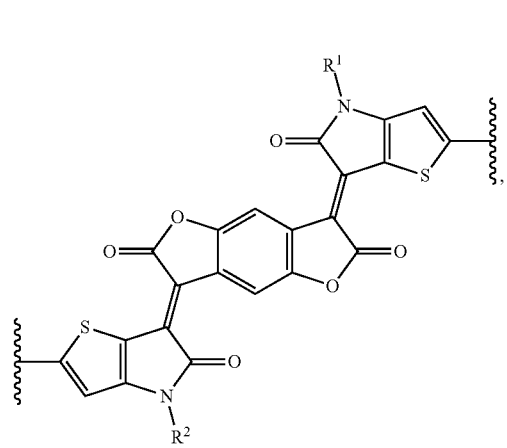
(Ih)
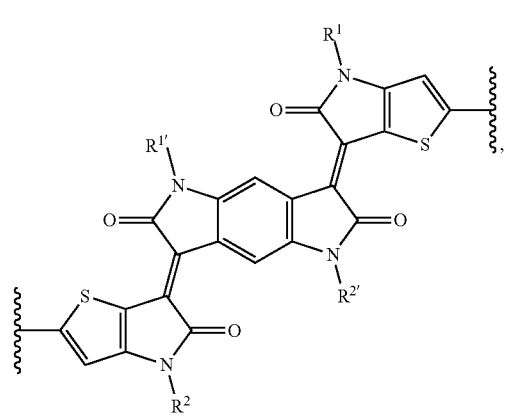
(Ii)
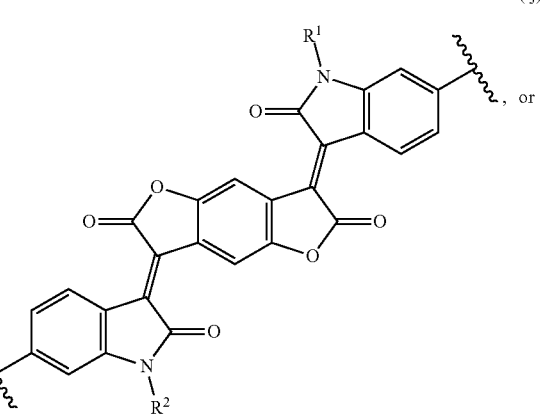
(Ij)
, or -continued (Ik)

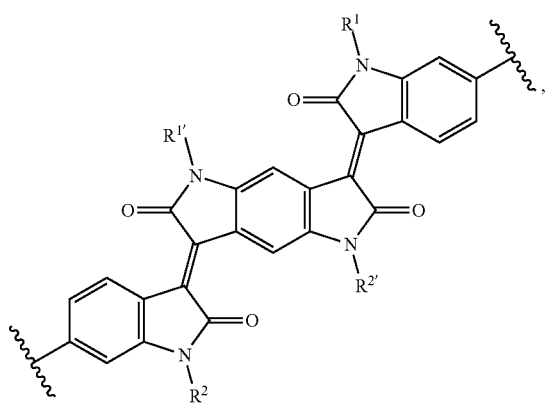

wherein:

$R^3$ and $R^{3'}$ are independently of each other hydrogen, halogen, $C_1$-$C_{25}$alkyl, or $C_1$-$C_{25}$alkoxy; and $R^1$, $R^2$, $R^{1'}$ and $R^{2'}$ are defined in claim 2.

6. The polymer according to claim 1, comprising a repeating unit of formula:

(Ia)

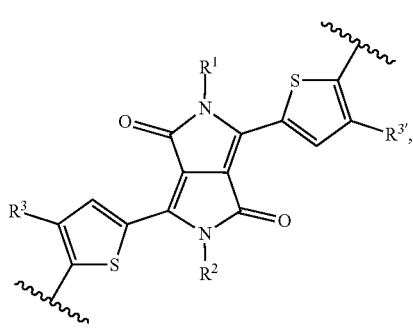

(Ic)

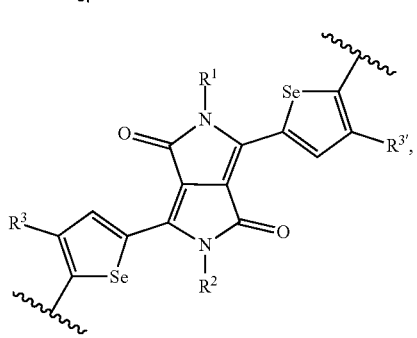

(Ie)

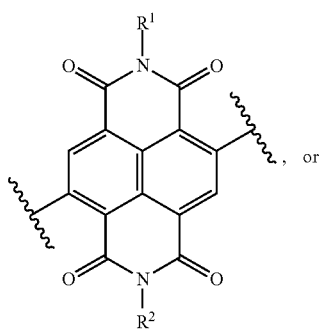, or

-continued (If)

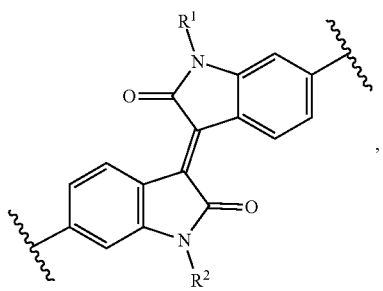

wherein:

$R^3$ and $R^{3'}$ are independently of each other hydrogen, fluorine, $C_1$-$C_{25}$alkyl, $C_1$-$C_{25}$alkoxy; and $R^1$ and $R^2$ are defined in claim 1.

7. The polymer according to claim 4, comprising a repeating unit -[A]-[COM]$_{n3}$- (V), wherein:

A is a unit of formula (I);

COM has the meaning of $Ar^2$;

$Ar^2$ is defined in claim 4;

n3 is an integer of 1 to 4; and

COM can be the same or, different in each occurrence.

8. The polymer according to claim 7, wherein the repeating unit -[A]-[COM]$_{n3}$- is a repeating unit of formula:

(Va)

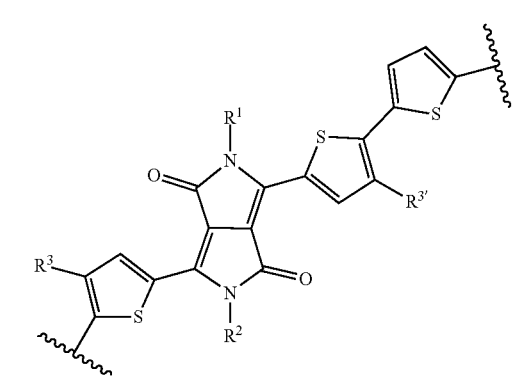, (Vb)

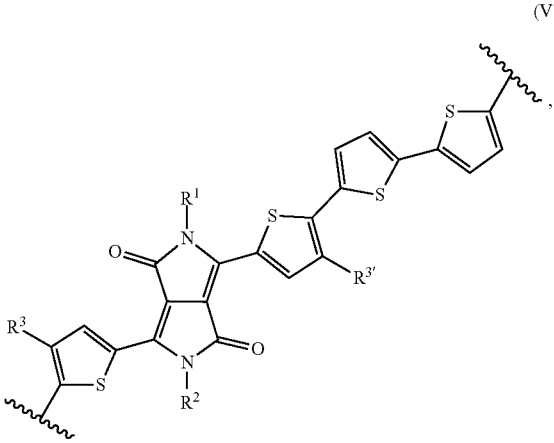,

-continued
(Vc)
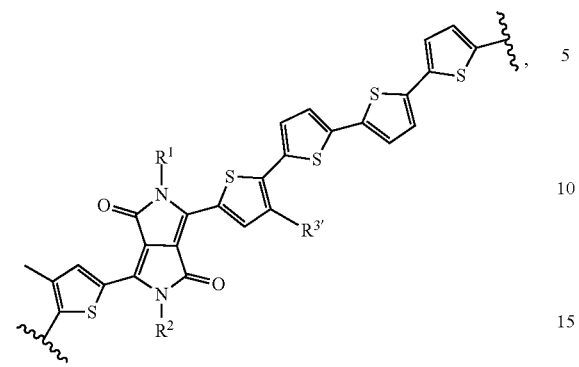
(Vd)
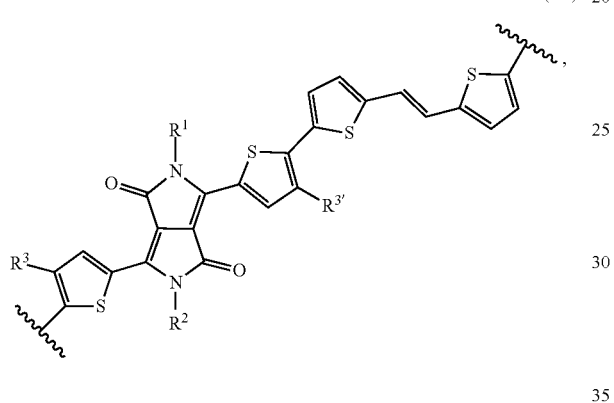
(Ve)
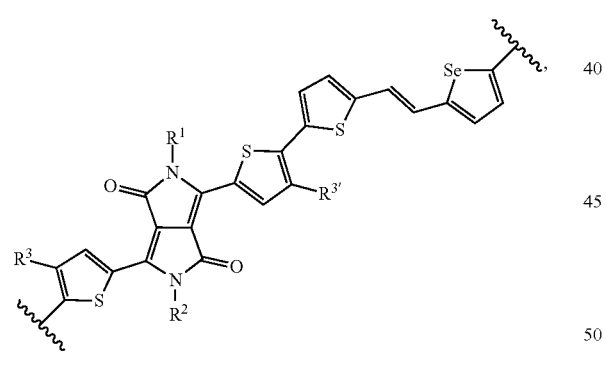
(Vf)
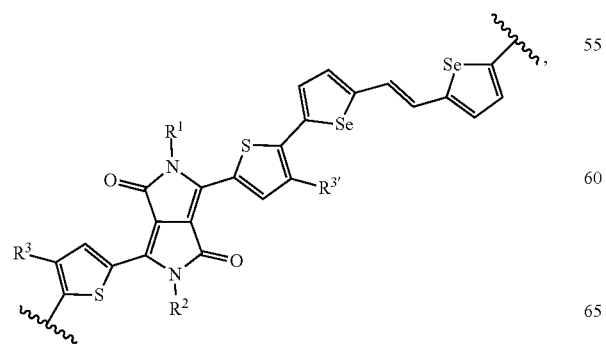
(Vg)
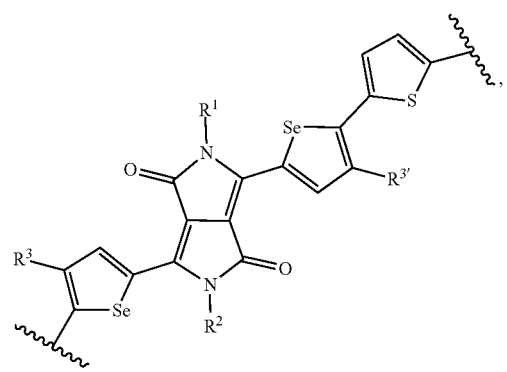
(Vh)
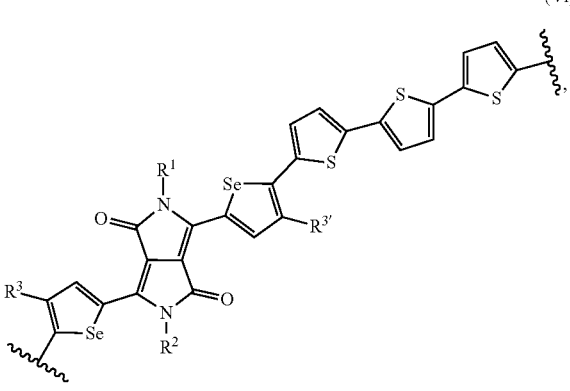
(Vi)
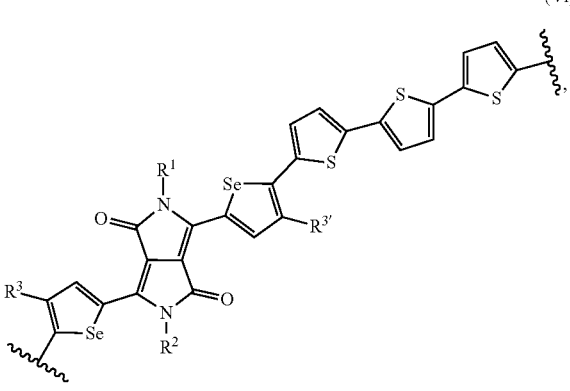
(Vj)
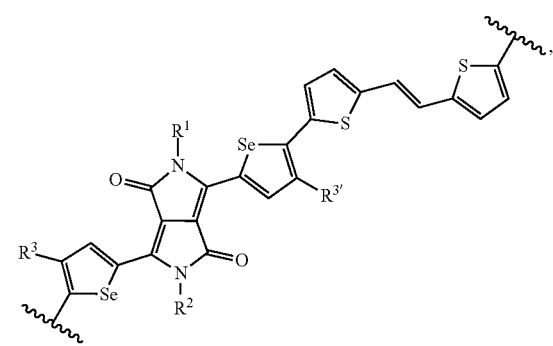

(Vk)
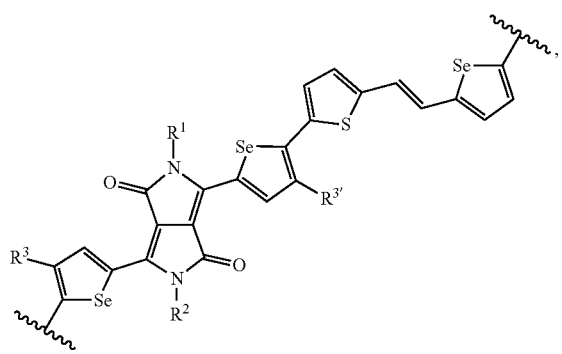
(Vl)
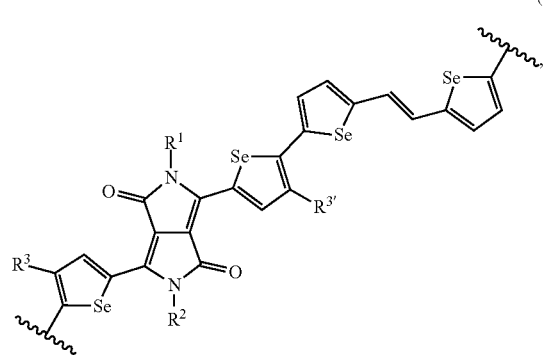
(Vm)
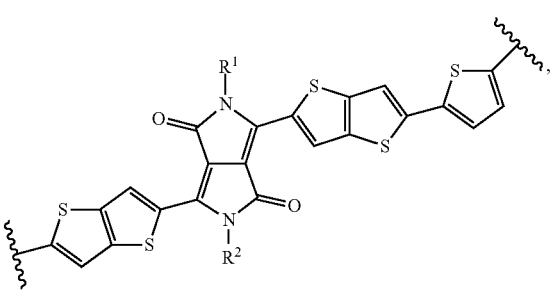
(Vn)
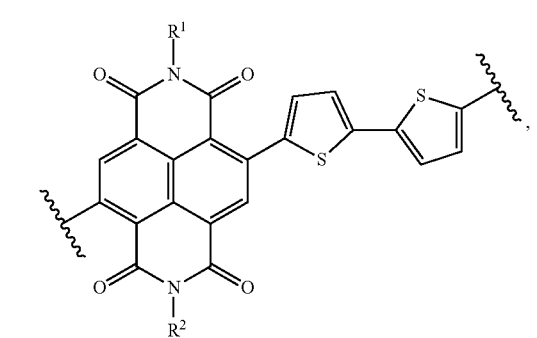
(Vo)
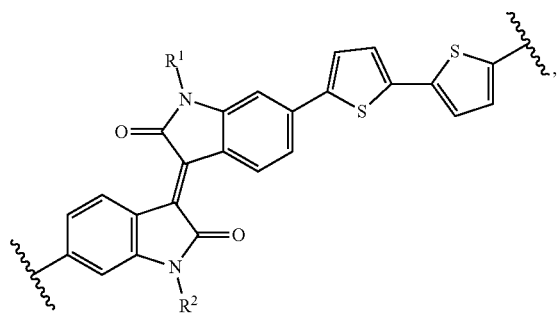
(Vp)
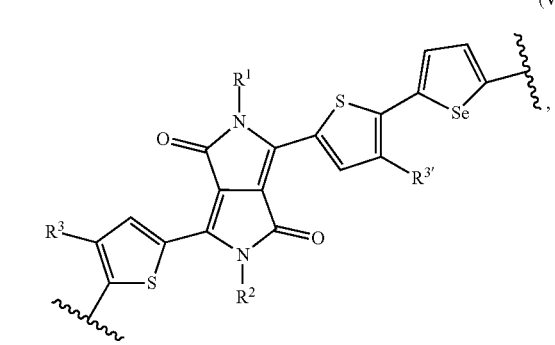
wherein:
R³ and R³' are independently of each other hydrogen, fluorine, C₁-C₂₅alkyl, or C₁-C₂₅alkoxy; and
R¹ and R² are defined in claim 1.
9. The polymer according to claim 1, which is a polymer of formula:
(Va')
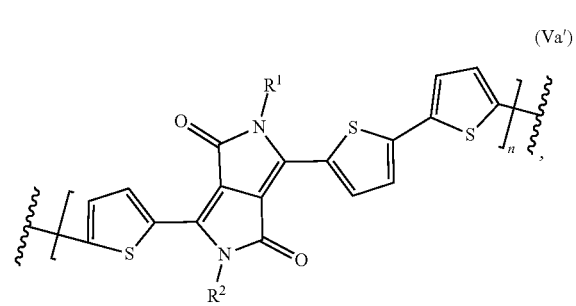
(Vb')
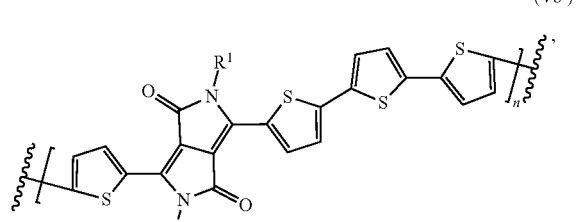
(Vc')
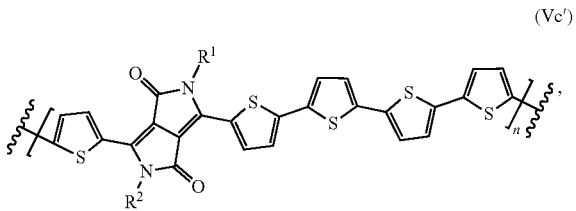

-continued
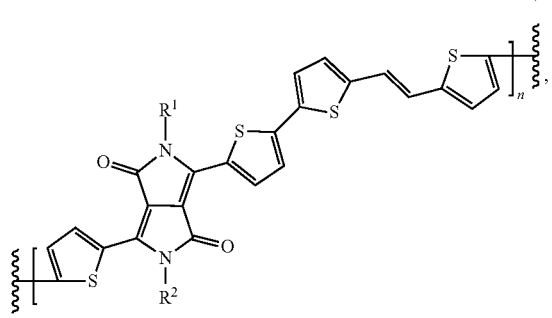
(Vd')
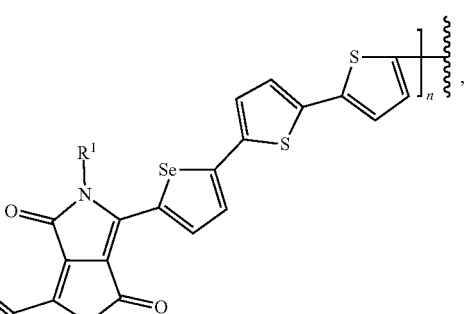
(Vh')
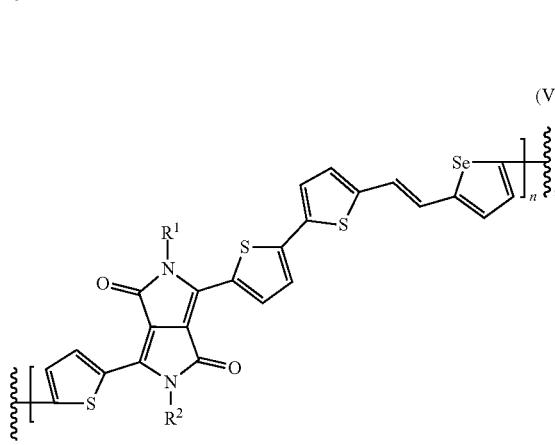
(Ve')
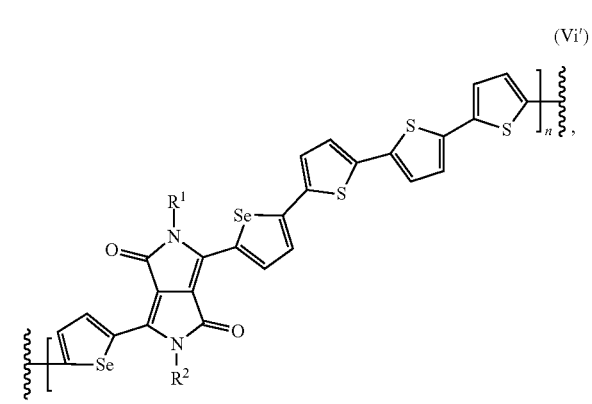
(Vi')
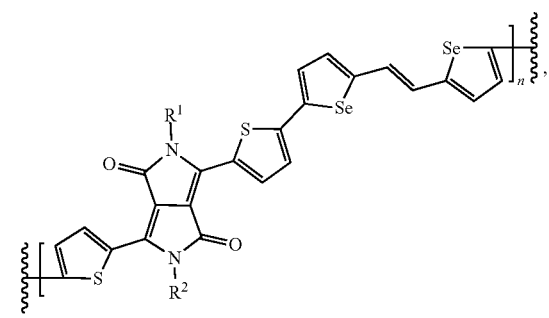
(Vf')
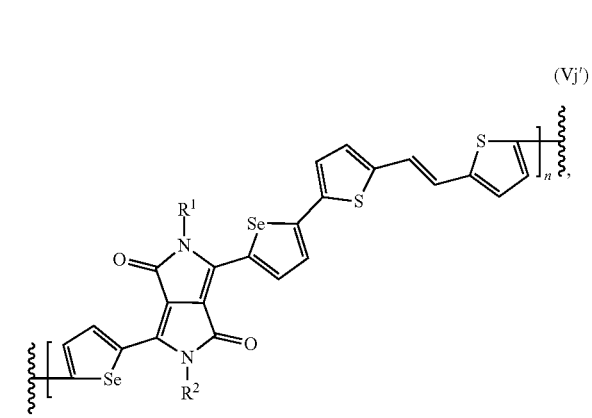
(Vj')
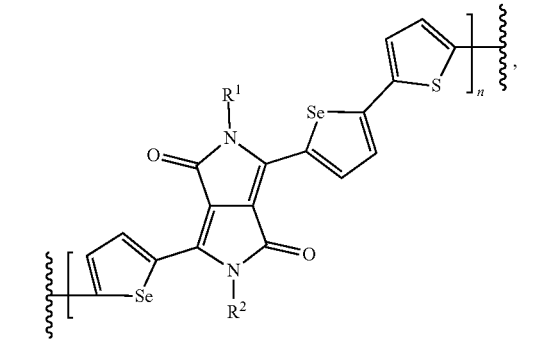
(Vg')
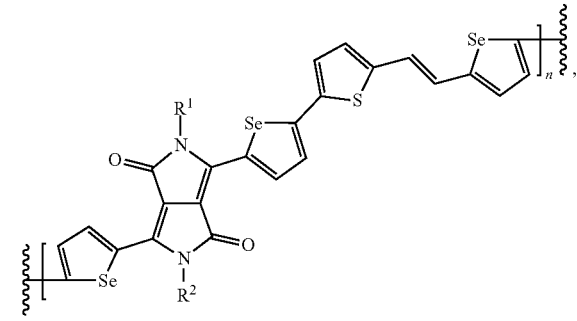
(Vk')

-continued

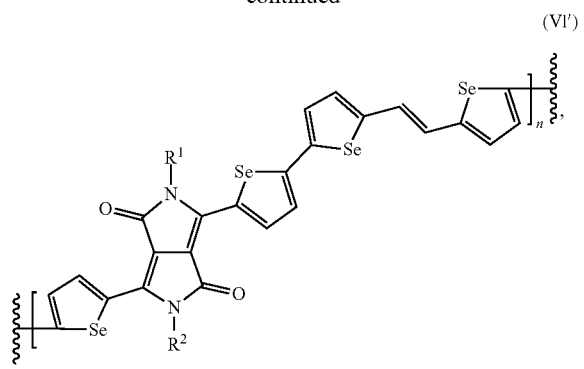 (Vl′)

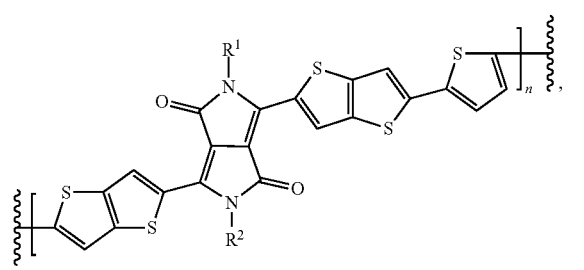 (Vm′)

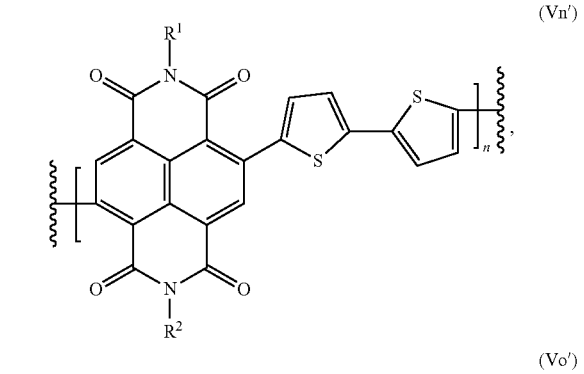 (Vn′)

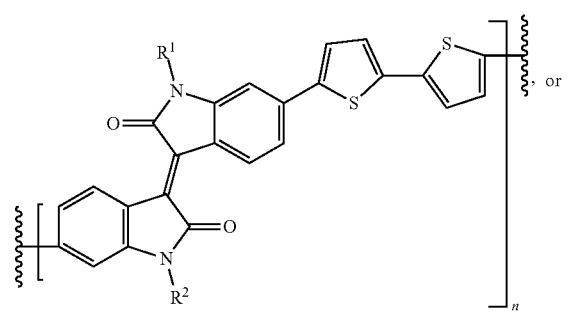 (Vo′)

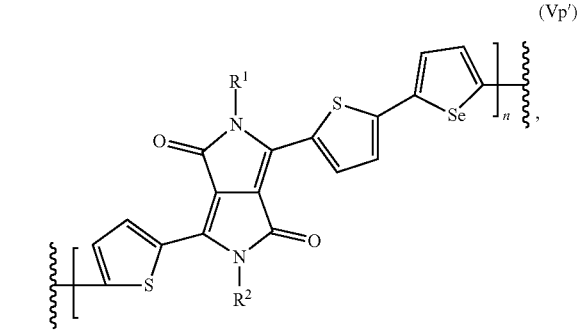 (Vp′)

wherein:
n is 4 to 1000, and
$R^1$ and $R^2$ are defined in claim 1.

10. The polymer according to claim 1, wherein:
$R^1$, $R^2$, $R^{1'}$ and $R^{2'}$ are a group of formula:

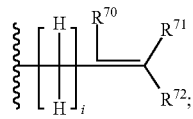 (II)

i is an integer from 1 to 10; and
$R^{70}$, $R^{71}$ and $R^{72}$ are independently of each other hydrogen or $C_1$-$C_{50}$alkyl,
with the proviso that at least one of the substituents $R^{70}$, $R^{71}$ and $R^{72}$ is different from hydrogen.

11. The polymer according to claim 10, wherein, in the group of formula at least two of the substituents $R^{70}$, $R^{71}$ and $R^{72}$ are different from hydrogen.

12. The polymer according to claim 10, wherein:
$R^1$, $R^2$, $R^{1'}$ and $R^{2'}$ are a group of formula (II):

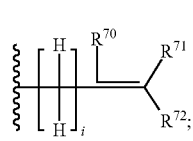 (II)

i is an integer from 1 to 5; and
$R^{70}$, $R^{71}$ and $R^{72}$ are independently of each other hydrogen or $C_1$-$C_{36}$alkyl,
with the proviso that two of the substituents $R^{70}$, $R^{71}$ and $R^{72}$ are different from hydrogen.

13. An organic semiconductor material, layer, or component, comprising a polymer according to claim 1.

14. A semiconductor device, comprising a polymer according to claim 1.

15. A process for preparing an organic semiconductor device, the process comprising applying a solution and/or dispersion of a polymer according to claim 1 in at least one organic solvent to a substrate and removing the at least one solvent.

16. A device, comprising the polymer of claim 1, wherein the device is selected from the group consisting of a photovoltaic device, a photodiode and an organic field effect transistor.

17. A compound of formula (X):

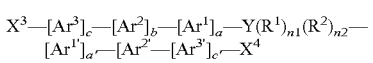

$$X^3-[Ar^3]_c-[Ar^2]_b-[Ar^1]_a-Y(R^1)_{n1}(R^2)_{n2}-[Ar^{1'}]_{a'}-[Ar^{2'}]_{b'}-[Ar^{3'}]_{c'}-X^4 \quad (X),$$

wherein:
a is 0, 1, 2, or 3;
a′ is 0, 1, 2, or 3;
b is 0, 1, 2, or 3;
b′ is 0, 1, 2, or 3;
c is 0, 1, 2, or 3;
c′ is 0, 1, 2, or 3;
n1 is 1, or 2;
n2 is 1, or 2;
Y is a bivalent heterocyclic group, or ring system, which may optionally be substituted;

$Ar^1$, $Ar^{1'}$, $Ar^2$, $Ar^{2'}$, $Ar^3$ and $Ar^{3'}$ are independently of each other a $C_6$-$C_{24}$arylen group, which can optionally be substituted, or a $C_2$-$C_{20}$heteroarylen group, which can optionally be substituted;

$R^1$ and $R^2$ in each occurrence are independently of each other hydrogen, $C_5$-$C_{12}$cycloalkyl, $COR^{38}$, $C_1$-$C_{50}$alkyl, $C_3$-$C_{50}$alkenyl, or $C_3$-$C_{50}$alkynyl, which can optionally be substituted one or more times with $C_1$-$C_{12}$alkoxy, halogen, $C_5$-$C_8$cycloalkyl, cyano, $C_6$-$C_{24}$aryl, $C_2$-$C_{20}$heteroaryl, or a silyl group; and/or can optionally be further interrupted by one or more —O—, —S—, —$NR^{39}$—, —$CONR^{39}$—, —$NR^{39}CO$—, —COO—, —CO—, or —OCO—, or a group of formula:

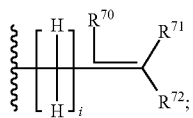

(II)

i is an integer from 1 to 18;

$R^{70}$, $R^{71}$ and $R^{72}$ are independently of each other hydrogen, $C_1$-$C_{50}$alkyl, $C_5$-$C_{12}$cycloalkyl, $C_6$-$C_{24}$aryl, $C_2$-$C_{20}$heteroaryl, $C_2$-$C_{50}$alkenyl or $C_2$-$C_{50}$alkynyl which can optionally be substituted one or more times with $C_1$-$C_{12}$alkoxy, halogen (especially F), $C_5$-$C_8$cycloalkyl, cyano, $C_6$-$C_{24}$aryl, $C_2$-$C_{20}$heteroaryl, or a silyl group; and/or can optionally be further interrupted by one or more —O—, —S—, —$NR^{39}$—, —$CONR^{39}$—, —$NR^{39}CO$—, —COO—, —CO—, or —OCO—; with the proviso that at least one of the substituents $R^{70}$, $R^{71}$ and $R^{72}$ is different from hydrogen;

$R^{38}$ is $C_1$-$C_{50}$alkyl, $C_2$-$C_{50}$alkenyl, $C_2$-$C_{50}$alkynyl or $C_1$-$C_{50}$alkoxy, which can optionally be substituted one or more times with $C_1$-$C_{12}$alkoxy, halogen, $C_5$-$C_8$cycloalkyl, cyano, $C_6$-$C_{24}$aryl, $C_2$-$C_{20}$heteroaryl, or a silyl group; and/or can optionally be further interrupted by one or more —O—, —S—, —$NR^{39}$—, —$CONR^{39}$—, —$NR^{39}CO$—, —COO—, —CO—, or —OCO—; and $R^{39}$ is hydrogen, $C_1$-$C_{25}$alkyl, $C_1$-$C_{18}$haloalkyl, $C_7$-$C_{25}$arylalkyl, or $C_1$-$C_{18}$alkanoyl;

$X^3$ and $X^4$ are independently of each other hydrogen, halogen, $ZnX^{12}$, —$SnR^{207}R^{208}R^{209}$;

$R^{207}$, $R^{208}$ and $R^{209}$ are identical or different and are H or $C_1$-$C_6$alkyl, wherein two radicals optionally form a common ring and these radicals are optionally branched or unbranched and $X^{12}$ is a halogen atom; or —$OS(O)_2CF_3$, —$OS(O)_2$-aryl, —$OS(O)_2CH_3$, —$B(OH)_2$, —$B(OY^1)_2$,

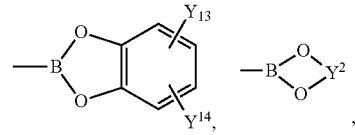

—$BF_4Na$, or —$BF_4K$;

$Y^1$ is independently in each occurrence a $C_1$-$C_{10}$alkyl group;

$Y^2$ is independently in each occurrence an optionally substituted $C_2$-$C_{10}$alkylene group; and $Y^{13}$ and $Y^{14}$ are independently of each other hydrogen, or a $C_1$-$C_{10}$alkyl group.

* * * * *